US012282359B2

(12) United States Patent
Barnett et al.

(10) Patent No.: US 12,282,359 B2
(45) Date of Patent: Apr. 22, 2025

(54) DOCKING CONNECTOR PLATFORM FOR MOBILE ELECTRONIC DEVICES

(71) Applicant: PopSockets LLC, Boulder, CO (US)

(72) Inventors: David B. Barnett, Boulder, CO (US); Altan Nahum, Boulder, CO (US)

(73) Assignee: PopSockets LLC, Boulder, CO (US)

( * ) Notice: Subject to any disclaimer, the term of this patent is extended or adjusted under 35 U.S.C. 154(b) by 0 days.

(21) Appl. No.: 18/395,275

(22) Filed: Dec. 22, 2023

(65) Prior Publication Data

US 2024/0126331 A1    Apr. 18, 2024

Related U.S. Application Data

(63) Continuation of application No. 16/745,226, filed on Jan. 16, 2020, now Pat. No. 11,899,495, which is a
(Continued)

(51) Int. Cl.
*G06F 1/16*     (2006.01)
*A63F 13/23*    (2014.01)
(Continued)

(52) U.S. Cl.
CPC ............ *G06F 1/1632* (2013.01); *A63F 13/23* (2014.09); *A63F 13/92* (2014.09); *A63F 13/98* (2014.09);
(Continued)

(58) Field of Classification Search
CPC ............. H04M 1/0214; H04M 1/7251; H04M 1/72522; H04M 1/72527; G06F 1/1626;
(Continued)

(56) References Cited

U.S. PATENT DOCUMENTS 5,694,292 A    12/1997  Pausel et al.
5,739,665 A *   4/1998  Bares ............... H01M 10/46
                                                320/115
(Continued)

FOREIGN PATENT DOCUMENTS

CN       2398783 Y       9/2000
KR       101738073       5/2017
(Continued)

OTHER PUBLICATIONS

Transmittal of International Search Report and Written Opinion issued in PCT/US2018/066137 on Nov. 22, 2019.
(Continued)

*Primary Examiner* — Quochien B Vuong
(74) *Attorney, Agent, or Firm* — Farjami & Farjami LLP

(57) ABSTRACT

Docking platforms formed in one of the largest-surface-area surfaces of mobile electronic devices. Such a docking platform may comprise a docking accessory cavity having a docking connection system comprising one or more docking connectors formed within the cavity, and optionally two or more electrical contacts within the cavity, the contacts electrically connected to electronics within the electronic device and constructed and arranged to allow electrical connection to detachable docking accessories. The docking connection system is operable to form detachable attachments to multiple independent docking accessories simultaneously. The cavities of the docking platforms are shaped to accommodate a broad range of docking accessories that are specially adapted to sit in a generally flush manner with the back surface of the mobile electronic device while attached to the docking connectors. One type of accessory forms an assembly with an expandable accordion attached to the docking platform.

14 Claims, 45 Drawing Sheets

Related U.S. Application Data continuation of application No. 15/723,506, filed on Oct. 3, 2017, now Pat. No. 10,571,964, which is a continuation of application No. 14/302,203, filed on Jun. 11, 2014, now Pat. No. 9,804,636, which is a continuation-in-part of application No. PCT/US2013/030991, filed on Mar. 13, 2013.

(60) Provisional application No. 61/833,634, filed on Jun. 11, 2013, provisional application No. 61/610,575, filed on Mar. 14, 2012.

(51) Int. Cl.
| | | |
|---|---|---|
| *A63F 13/92* | (2014.01) | |
| *A63F 13/98* | (2014.01) | |
| *H04M 1/02* | (2006.01) | |
| *H10F 19/00* | (2025.01) | |

(52) U.S. Cl.
CPC .......... *G06F 1/1626* (2013.01); *G06F 1/1635* (2013.01); *G06F 1/1656* (2013.01); *H10F 19/00* (2025.01); *Y02E 10/50* (2013.01)

(58) Field of Classification Search
CPC .... G06F 1/1632; G06F 1/1635; G06F 1/1656; H04B 1/3888; A63F 13/23; A63F 13/92; A63F 13/98
See application file for complete search history.

(56) References Cited

U.S. PATENT DOCUMENTS

| | | | |
|---|---|---|---|
| 8,090,130 B2 * | 1/2012 | Zorkendorfer | G06F 1/1632 |
| | | | 381/334 |
| 8,137,192 B2 | 3/2012 | Thomas | |
| 8,183,825 B2 | 5/2012 | Sa | |
| 8,483,755 B2 * | 7/2013 | Kumar | H04M 1/0258 |
| | | | 455/566 |
| 8,560,031 B2 | 10/2013 | Barnett et al. | |
| 8,986,033 B2 | 3/2015 | Berger et al. | |
| 9,136,259 B2 | 9/2015 | Pratt | |
| 9,160,189 B2 | 10/2015 | Glanzer et al. | |
| 9,367,090 B2 | 6/2016 | Barnett et al. | |
| D777,022 S | 1/2017 | Barnett | |
| 9,804,636 B2 | 10/2017 | Barnett et al. | |
| D818,808 S | 5/2018 | Barnett | |
| 9,970,589 B2 | 5/2018 | Hobbs et al. | |
| 10,571,964 B2 | 2/2020 | Barnett | |
| 11,899,496 B2 | 2/2024 | Barnett | |
| 2006/0214757 A1 | 9/2006 | Schloss et al. | |
| 2010/0195279 A1 * | 8/2010 | Michael | H04B 1/3877 |
| | | | 361/679.41 |
| 2011/0216495 A1 * | 9/2011 | Marx | G06F 1/1632 |
| | | | 361/679.22 |
| 2012/0262109 A1 | 10/2012 | Toya et al. | |
| 2012/0274282 A1 | 11/2012 | Yoneyarna et al. | |
| 2014/0317329 A1 | 10/2014 | Barnett et al. | |
| 2015/0077927 A1 | 3/2015 | Barnett et al. | |
| 2015/0137732 A1 | 5/2015 | Lai et al. | |
| 2016/0282192 A1 | 9/2016 | Wikstrand | |
| 2016/0282907 A1 | 9/2016 | Barnett et al. | |
| 2017/0025886 A1 | 1/2017 | Rohrner et al. | |
| 2017/0104359 A1 | 4/2017 | Song et al. | |
| 2017/0167669 A1 | 6/2017 | Purkiss | |
| 2017/0288445 A1 | 10/2017 | Lee et al. | |
| 2017/0331318 A1 | 11/2017 | Jankins et al. | |
| 2018/0248415 A1 | 8/2018 | Yoshizawa et al. | |
| 2019/0074731 A1 | 3/2019 | Lee et al. | |
| 2019/0081515 A1 | 3/2019 | Gajiwala et al. | |
| 2019/0081517 A1 | 3/2019 | Graham et al. | |
| 2020/0150721 A1 | 5/2020 | Barnett et al. | |
| 2020/0203975 A1 | 6/2020 | Sobh | |
| 2022/0206532 A1 | 6/2022 | Barnett et al. | |

FOREIGN PATENT DOCUMENTS

| | | |
|---|---|---|
| WO | 2014190574 | 12/2014 |
| WO | 2020113045 | 6/2020 |

OTHER PUBLICATIONS

Transmittal of International Search Report and Written Opinion issued in PCT/US2021/012813 on Mar. 26, 2021.
File History of U.S. Appl. No. 18/202,847, filed May 26, 2023.
File History of U.S. Appl. No. 18/405,877, filed Jan. 5, 2024.

* cited by examiner

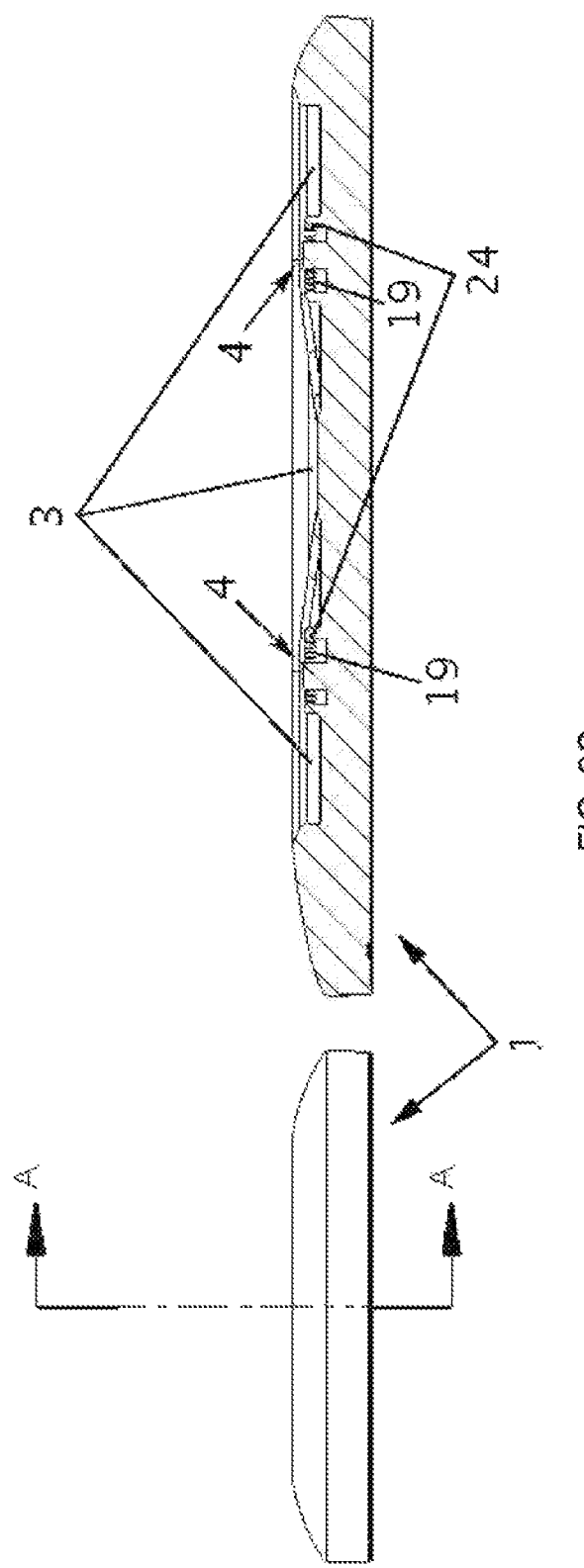

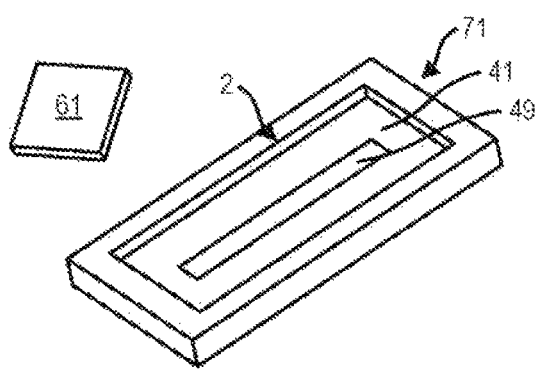
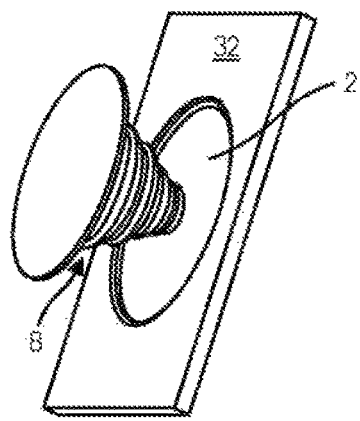
FIG. 15A       FIG. 16
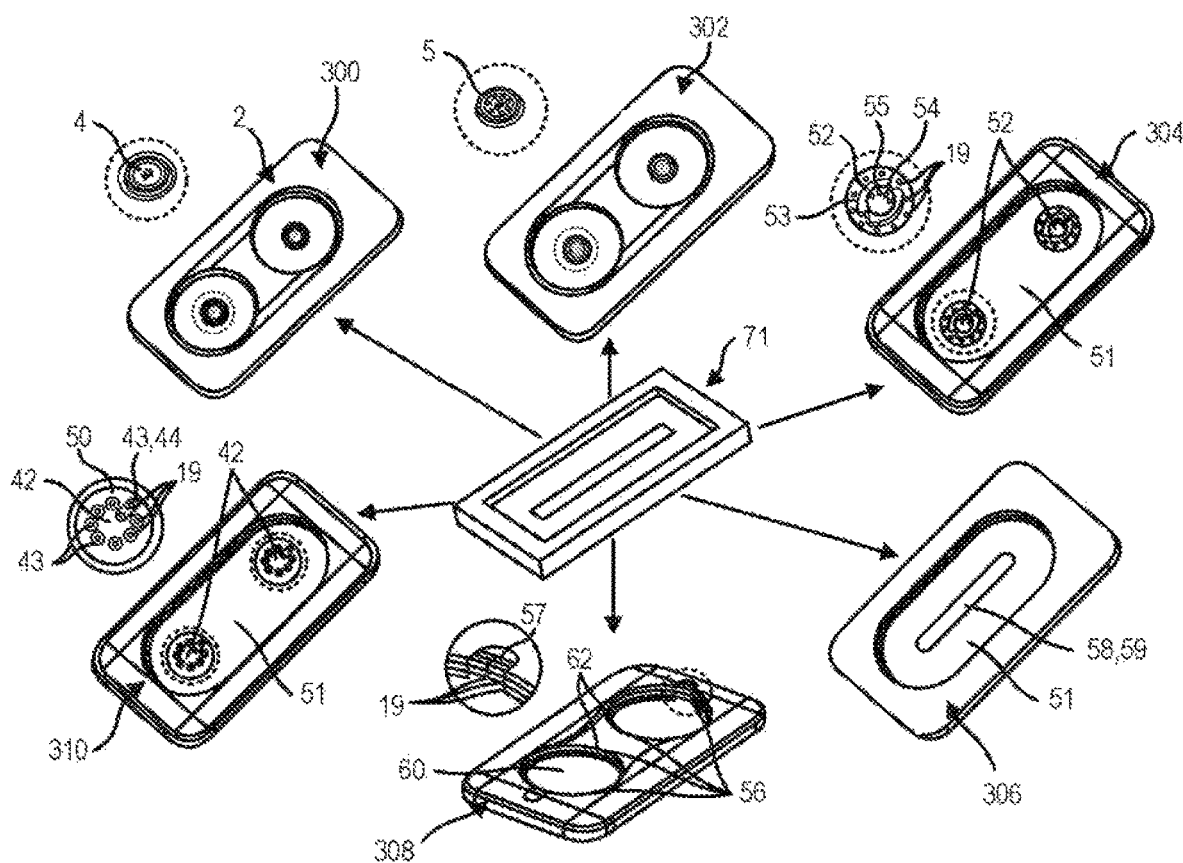
FIG. 15B

DOCKING CONNECTOR PLATFORM FOR MOBILE ELECTRONIC DEVICES

This application is a continuation of U.S. patent application Ser. No. 16/745,226, filed Jan. 16, 2020, which is a continuation of U.S. patent application Ser. No. 15/723,506, filed Oct. 3, 2017, now U.S. Pat. No. 10,571,964, which is a continuation of U.S. patent application Ser. No. 14/302,203, filed on Jun. 11, 2014, now U.S. Pat. No. 9,804,636, which claims the priority benefit of U.S. Provisional Patent Application No. 61/833,634, filed Jun. 11, 2013, and is a continuation-in-part of International Patent Application No. PCT/US13/30991, filed Mar. 13, 2013, which claims the priority benefit of U.S. Provisional Patent Application No. 61/610,575, filed Mar. 14, 2012. The entire contents of each of the foregoing applications are incorporated herein by reference.

BACKGROUND OF THE INVENTION

Field of the Invention

The present invention relates to docking connectors for mobile electronic devices. In particular, embodiments of the present invention relate to docking connectors disposed on a largest-surface-area surface of the electronic devices.

Discussion of Related Art

Mobile electronic devices often comprise docking connectors, which enable the mobile electronic devices to temporarily attach to multiple external docking accessories, such as speakers and batteries, generally further enabling power and data transmission between the mobile electronic device and the docking accessories. Docking connectors are generally housed on one of the edges of the mobile electronic device, as opposed to one of the two major faces of a typical mobile electronic device, wherein the front face is generally designated by the location of a screen, should the device house a screen, and the back face is designated as the face opposite the front face. For example, the smartphone shown in FIG. 1A (Prior Art) has two major faces and four relatively narrow edges, with a docking connector housed on the bottom edge. A shortfall of housing a docking connector on the edge of a mobile electronic device is that when the device is attached to docking accessories, the resultant system is generally inconvenient for transport. If the docking accessories attach by a flexible cable to the docking connector as shown in FIG. 1A, the resultant system comprises two or more independently moving bodies, connected by the flexible cable, and is thus inconvenient for transport. If the docking accessories attach in a rigid fashion to the docking connector, the resultant system generally increases the effective magnitude of at least one of the dimensions of the mobile electronic device to a degree that renders the resultant system inconvenient for transport. This is due to the fact that the edges of mobile electronic devices generally have a relatively small surface area compared to the front and back faces of the devices; thus, to accommodate the volume of a docking accessory that is rigidly attached to such an edge, the resultant system generally extends significantly in directions away from the docking connector edge. See for example FIG. 1B (Prior Art).

To address the preceding docking-system transport problem, some docking accessories, such as certain supplemental batteries, are manufactured as parts of mobile electronic device cases. The resultant "docking cases" attach to mobile electronic devices, both at their docking connectors (as standard docking accessories attach) and around their various edges (as standard mobile electronic device cases attach), to enable the docking accessories to be transported securely against the back faces of the mobile electronic devices. See for example FIG. 1C (Prior Art). In a similar vein, some docking accessories are manufactured as parts of docking "sleeves" (or "jackets"), which attach to compatible mobile electronic devices at their side edges and at their docking connectors (some docking sleeves are themselves operable to form detachable attachments to independent docking accessories). See for example FIG. 1D (Prior Art). Docking cases and sleeves enable the majority of the volume of docking accessories to be distributed in a generally even manner across the relatively large back faces of mobile electronic devices, with the aim of minimizing effective increases in magnitude to any single dimension of the mobile electronic device and thus enabling the resultant systems to be transported in a convenient fashion. While going some way to mitigate the increase in effective size of mobile electronic devices to which docking cases and sleeves are attached, the main shortfall with this method for addressing the docking-system transport problem is that docking cases and sleeves nevertheless can increase the effective size of the corresponding mobile electronic device, both in the dimension perpendicular to the back face of the mobile electronic device and in the dimension perpendicular to the face of the edge that houses the docking connector.

A second method for addressing the docking-system transport problem is to (i) recess a portion of a selected edge of a mobile electronic device to form a rectangular cavity that is open both at the selected edge and at the backside of the mobile electronic device; (ii) form a docking connector on the recessed edge; and (iii) form rails (or tracks) on the two cavity edges perpendicular to the recessed edge. See for example FIG. 1E (Prior Art). The rails serve to guide docking accessories as they are inserted into the rectangular cavity through the opening on the selected edge and to help fix the positions of the docking accessories when they are in their docked states. The rectangular cavity enables docking accessories to attach to the mobile electronic device without increasing its effective carrying size. For certain designs, the initial formation of the cavity may lead to an increase in the initial carrying size of the mobile device by taking up space that could otherwise be used for internal components of the device; still, the cavity enables docking accessories to attach to the device without further increasing its effective carrying size and without altering its overall contour. This method thus avoids the main shortfall with the preceding method. Nevertheless, it has several shortfalls of its own. One shortfall with this method is that its rail system requires the corresponding accessory cavity to be open at one edge of the mobile device. This is disadvantageous, as edge openings reduce available space for mobile-device features that are ideally located on an edge of the device (for instance, volume buttons, power buttons, built-in speakers, and built-in sensors) and, if the selected edge is tapered, as is common to create the perception that the device is only as thick as its outermost edges, the tapered boundary of the corresponding accessory cavity places adverse constraints on the design of compatible docking accessories. Another shortfall with this method is that, by fixing the positions of the outer edges of attached accessories through its rail system, it presents design obstacles for a broad range of accessories whose functionality improves with the ability to expand away from, and rotate at various angles to, the backsides of the mobile electronic devices to which they are attached (for instance, speakers, electrophysiology sensors, massage paddles, hand-pump chargers, and ultrasound transducers). Another shortfall with this method is that accessories whose attachment does not increase the effective carrying size of the mobile device must have a certain rectangular shape and size to mate with the rail system (and those accessories that protrude beyond the boundaries of the rectangular cavity must have a base of a certain rectangular shape and size to mate with the rail system). Different docking accessories have different ideal shapes and sizes, however. For instance, whereas certain camera lenses, speakers, and electro physiology sensors might ideally be circular and relatively small, certain game controllers, external keyboards, and solar panels might ideally be elongated and relatively large.

What is needed is a docking platform that is housed on the back face of a mobile electronic device to enable multiple docking accessories of various shapes and sizes to simultaneously and independently attach to the mobile electronic device with the optional freedom to expand away from, and rotate at various angles to, the back face of the mobile device, and with at most a nominal increase to the effective magnitude of any one dimension of the mobile device. Furthermore, the docking platform should not require openings on the edges of the mobile device.

SUMMARY OF THE INVENTION

Cavity-Recessed Accessory Embodiments

Some embodiments of the present invention, as shown herein, are directed to mobile electronic devices having docking connectors. One of these embodiments of the device includes a docking platform formed at one of the largest-surface-area surfaces, i.e., a selected surface, of the mobile electronic device. In the present embodiment, the selected surface is the back surface of the device. In a separate embodiment, the selected surface may be the front, screen supporting surface. The docking platform is formed with a docking connection system which includes one or more docking connectors generally disposed in a recessed docking accessory cavity. The docking connection system is configured to enable the recessed docking accessory cavity to be open only at the selected surface.

In some embodiments, the recessed docking accessory cavity enables one or more docking accessories to be attached to the docking connectors without significantly increasing the effective carrying size of the mobile electronic device. Docking accessories are manufactured to couple with the recessed docking accessory cavity such that, when the docking accessory is in at least one mode of operation, the outer surface of the docking accessory is generally co-planar with the selected surface of the mobile device.

In one embodiment, the docking connection system is formed to accommodate a broad range of docking accessories. In the same or separate embodiment, the docking connection system is operable to form a detachable attachment to multiple independent docking accessories simultaneously. In the same or separate embodiment, the docking connection system is operable to form a detachable attachment to one docking accessory via two or more recessed docking accessory cavities. In the same or separate embodiment, the docking connection system may be operable to form a detachable attachment radially inward from the outer edges of a circular accessory, to allow the body of the accessory to temporarily expand away from the docking platform by way of an expandable conical accordion mechanism, whereby the foot, or narrowest part of the accordion, which is located radially inward from the edges of the accordion, forms the attachment point to the docking connection system, and the mouth, or widest part of the accordion, forms an attachment to the body of the accessory. The range of docking accessories that may cooperate with the docking platform includes, by way of example, batteries, solar panels, game controls, LED lights, hand-crank chargers, weather sensors, camera flashes, camera lenses, electrophysiology sensors, memory cards, keyboards, massage paddles, glucose monitors, body fat monitors, breathalyzers, ultrasound transducers, and pulse oximeters. This list of possible docking accessories in not meant to be limiting in any way, but is merely meant to demonstrate the wide range of possible devices and technologies that may functionally cooperate with the present docking platform.

In one or more embodiments, the docking platform is integrally formed with the body of the mobile electronic device. In a related embodiment, the docking platform is integrally formed with one aspect of the mobile electronic device, e.g., the back cover. The docking platform may be formed with an accessory cavity that has a generally oval shape. In one embodiment, the generally oval or capsule shaped accessory cavity (herein after, "oval shaped accessory cavity") supports two circular cavities formed at opposing ends of the oval shaped accessory cavity. Optionally, a depressed region constituting the middle portion of the oval cavity may be formed between the two circular cavities. Each of the two circular cavities may include a docking connector, for example, an annular docking connector disposed at its center. A docking connector may be formed with a connection mechanism, electrical contacts for communication one or both of data and power, and an optional alignment mechanism. For example, in the annular docking connector embodiment, each docking connector may be formed with (i) an annular female snap-fit feature, for attaching docking accessories securely to the docking platform; (ii) 30 electrical contacts disposed evenly around the inner edge of the female snap-fit feature, for transmission of power and data to and from docking accessories; and (iii) a male index key, to ensure that the electrical contacts on a docked accessory mate with the appropriate contacts on the docking connectors. The electrical contacts are formed of gold-plated nickel-plated copper, with copper pads, and the remainder of the platform is formed of the same hard material as the rest of the body of the mobile electronic device. Other connection mechanisms, electrical contacts for communication one or both of data and power, and alignment mechanism may be used without departing from the scope herein.

One skilled in the art will appreciate other possible embodiments, which vary in (i) shape of platform; (ii) size of platform; (iii) number of docking accessory cavities; (iv) shape of docking accessory cavities; (v) size of docking accessory cavities; (vi) number of docking connectors; (vii) shape of docking connectors; (viii) size of docking connectors; (ix) mode of attachment of docking connectors to docking accessories; (x) configuration of electrical contacts; (xi) number of electrical contacts (including zero); (xii) mode of attachment of platform to the body of the mobile electronic device; and (xiii) materials of the platform and its components. These variations are merely that, possible variations of the present invention, which exemplify only some of the possible alternative forms the present invention may take. In addition, these variations are not meant to be limiting in any way.

An embodiment of the docking platform is formed in a selected one of two largest-surface-area surfaces of a mobile electronic device and comprises a primary recess formed within the selected surface. The primary recess forms a docking accessory cavity and may further support one or more further recesses. The docking accessory cavity supports a docking connection system, which houses one or more docking connectors. One or both of the docking accessory cavity and the docking connectors releasably connect to at least two independent docking accessories simultaneously, the docking connection system constructed to enable the docking accessory cavity to be open only at the selected surface.

In one or more embodiments, the docking connection system is operable to form a detachable attachment to a docking accessory without fixing the outer edges of the accessory.

In one or more embodiments, the docking platform may be formed with two or more electrical contacts within the docking accessory cavity. One or more of the electrical contacts electrically connected to electronics within the mobile electronic device and constructed and arranged to allow electrical communication to the docking accessory when the docking accessory is attached to the docking connector.

In one or more embodiments, the docking platform may be configured to enable power and data transmission between the mobile electronic device and the docking accessories by electrical connection to the docking accessories. Alternatively, the mobile electronic device may enable at least one of power or data to be transmitted between the mobile device and the accessories through wireless technology.

In one or more embodiments, the docking connection system may be configured to form a detachable mechanical bond with docking accessories. Alternative, the docking connection system may be configured to form a detachable magnetic bond with docking accessories.

In one or more embodiments, the docking connection system may be configured to support a single docking connector operable to form a detachable attachment to two or more independent docking accessories simultaneously. In one example, the docking connection system might comprise a single magnetic element operable to form a detachable magnetic attachment to two or more independent docking accessories simultaneously. Alternatively, the docking connection system may be configured to support more than one docking connector jointly operable to form a detachable attachment to two or more independent docking accessories simultaneously.

In one or more embodiments, the docking connector may be generally circular.

In one or more embodiments, the docking accessory cavity might be elongated.

In one or more embodiments, docking accessories may operate in a first mode of operation when connected to the docking platform and in a second mode of operation when remote from the mobile electronic device. The modes of operation depend on the type and functionality of the docking accessory.

In one or more embodiments, the selected surface in which the docking platform and an outwardly facing surface of the docking accessory are substantially flush when the docking accessory is attached to the docking connection system.

In one or more embodiments, the selected surface in which the docking platform and an outwardly facing surface of the docking accessory are substantially flush when the docking accessory is attached to the docking connection system and in one or a plurality of physical or operational modes.

In one or more embodiments, a docking system according to the present invention includes a docking platform formed in a selected one of two largest-surface-area surfaces of a mobile electronic device. The docking system is formed with a recessed docking accessory cavity that supports a docking connection system. The docking connection system is configured to form a detachable attachment to at least two independent docking accessories simultaneously. The docking connection system manufactured such that the docking accessory cavity only opens at the selected surface. Optionally, two or more electrical contacts are formed within the docking accessory cavity and the electrical contacts are in electronic communication with electronics within the mobile electronic device. A docking accessory, constructed and arranged to form a detachable attachment to the docking connection system, is formed to facilitate the transmission of one or both of data and power between the mobile electronic device and the docking accessory.

In one or more embodiments, the docking connection system may be operable to form an attachment with a docking accessory without fixing the positions of the outer edges of the attached accessory.

In one or more embodiments, the docking accessory may be constructed and arranged to support an electrical connection with electrical contacts within the docking connection system when the docking accessory is attached to the docking connection system.

In one or more embodiments, the docking system is configured with an accordion structure extendable outwardly from the selected surface and retractable inwardly toward the selected surface. In some embodiments, the accordion's distal end is supports a docking accessory body. The accordion structure may be manufactured with a flexible circuit, for example, a flat flex circuit or a flexible cable, disposed within the accordion structure to enable electrical connection between the docking accessory body and the mobile electronic device.

In one or more embodiments, the docking accessory body is domed-shaped and/or formed with outer edges that are eased edges or tapered edges. These shape characteristics may reduce the likelihood of catching the docking accessory on an objects or clothing.

In one or more embodiments, the docking accessory may be formed as a battery, a solar panel, a game control, an LED light, a hand-crank charger, a weather sensor, a camera flash, a camera lens, an electrophysiology sensor, a memory card, a keyboard, a massage paddle, a glucose monitor, a body fat monitor, a breathalyzer, an ultrasound transducer, or a pulse oximeter, among other docking accessories.

In one or more embodiments, a docking accessory system for a mobile electronic device according to the present invention is formed with a docking accessory body, an accordion structure constructed to attach to a selected one of two largest-surface-area surfaces of the mobile electronic device. The accordion structure is capable of extending outward from the selected surface and retracting back toward the selected surface. The accordion's distal end may be attached to the docking accessory body, and the docking accessory includes electronics for transmitting at least one of data or power between the accessory and the mobile electronic device. In certain embodiments, the docking accessory system may additionally include a flexible circuit located within the accordion structure and configured to electrically connecting docking accessory body and the mobile electronic device.

In one or more embodiments, a method of providing attachment of a docking accessory to a mobile electronic device according to the present invention may be accomplished by the following. A recessed docking accessory cavity is formed within a selected one of two largest-surface-area surfaces of the mobile electronic device. A docking connection system is formed within the docking accessory cavity. The connection system is constructed and arranged to form a detachable attachment to a docking accessory. The docking accessory cavity is formed to open only at the selected surface, and enables the attached docking accessory to temporarily extend away from, and articulate at various angles to, the selected surface of the mobile electronic device.

Those skilled in the art will appreciate that configurations similar to embodiments shown and described herein may be used without departing form the scope herein.

One or more embodiments of the present invention are directed to mobile electronic devices having docking connectors. A device according to the present invention includes a docking platform formed at one of the largest-surface-area surfaces of the device, generally the back face of the device. The docking platform is formed with a docking connection system, which includes one or more docking connectors. In one example, each docking connector supports at least one element for releasably attaching to compatible docking accessories. The docking connection system may be formed to enable multiple docking accessories to attach simultaneously and independently to the mobile electronic device without fixing the outer edges of the accessories. The docking platform may also enable docking accessories to attach to the mobile device without significantly increasing the effective carrying size of the mobile device by enabling the volumes of the attached docking accessories to be distributed, for example, across a portion of or the entirety of the selected surface, and not by the formation of an accessory cavity in the mobile device. The docking platform is configured to accommodate a broad range of shapes and sizes of docking accessories. The range of docking accessories that might be accommodated by the docking platform includes, for example, batteries, solar panels, game controls, LED lights, hand-crank chargers, weather sensors, camera flashes, camera lenses, electrophysiology sensors, memory cards, keyboards, massage paddles, glucose monitors, infrared fat monitors, breathalyzers, ultrasound paddles, and pulse oximeters. This list is merely meant to show some of the many possible docking accessories, and is not meant to be limiting in any way.

In one embodiment, the docking platform is integrally formed with the body of a mobile electronic device. The docking platform includes a docking connection system, formed with a docking connector. The docking connector supports an elongated magnetic connection element formed, for example, beneath the outermost surface of a back face of the mobile electronic device, for temporarily attaching docking accessories securely to the docking platform. In one embodiment, the docking connector supports two sets of nine electrical contacts, which facilitate the transmission of power and data to and from docking accessories. The electrical contacts may be formed of gold-plated nickel-plated copper, with copper pads. Each set of nine contacts may be arranged in a generally circular fashion, with each contact disposed within a contact cavity for protecting the contact and for providing lateral stability to an attached docking accessory. In one or more present embodiments, the contact cavity is generally circular in shape. Optionally, one cavity may be oval in shape and serves as a female index key, to ensure that the electrical contacts on a docked accessory mate with the appropriate contacts on the docking connectors. The docking platform may be substantially formed of a hard material. In an embodiment, the docking platform is formed of the same material as the body of the mobile electronic device.

Other embodiments may include variations in (i) number of docking connectors; (ii) shape of docking connectors; (lii) size of docking connectors; (iv) number of electrical contacts (including zero); (v) configuration of electrical contacts; (vi) number and configuration of electrical contact cavities; (vii) mode of attachment of platform to the body of the mobile electronic device; (viii) materials of the platform and its components.

In one or more embodiments, the docking platform may be formed in a selected one of two largest-surface-area surfaces of a mobile electronic device and includes a docking area, a docking connection system formed therein. The docking connection system may be configured with either one or more docking connectors having a magnetic element for removably attaching docking accessories. The docking connection system may be configured to form a detachable attachment with at least two docking accessories independently and simultaneously. Optionally, the docking connection system utilizes two or more electrical contacts within the docking area to connect docking accessories to electronics within the mobile electronic device. The electrical contacts may be constructed and arranged to facilitate an electrical connection between the docking accessory and the docking connector.

In one or more embodiments, the docking connector system may include an electrical contact cavity formed to protect electrical contacts therein and for providing lateral stability to docked accessories. The electrical contact cavity may be formed and configured to house one electrical contact, or alternatively, may be formed and configured to house more than one electrical contact.

In one or more embodiments, the docking connector system may include a single docking connector configured to form a detachable attachment to two or more docking accessories simultaneously and independently. In a separate embodiment, the docking connector system may include more than one docking connector jointly operable to form a detachable attachment to two or more docking accessories simultaneously and independently. In a separate embodiment, the docking connector system may include more than one docking connector, for example, two docking connectors, formed to cooperatively form a detachable attachment to one docking accessories. In each case, the docking connector system may be support the transmission of one or both of power and data between the docking connector system and the one or more docking accessories.

In one or more embodiments, the docking connection system may include an aligning element for aligning the docking accessory.

In one or more embodiments, electrical contacts may be biased to form an electrical connection with the docking accessory when the docking accessory is attached to the docking connector.

In one or more embodiments, the docking system according to the present invention comprises a docking platform formed in a selected one of two largest-surface-area surfaces of a mobile electronic device (comprising a docking area, a docking connector formed within the docking area, the docking connector comprising a magnetic element for bonding with docking accessories, and optionally two (or more) electrical contacts within the docking area, the contacts electrically connected to electronics within the electronic device), and a docking accessory constructed and arranged to form a detachable attachment to the docking connector, the docking accessory further constructed to allow at least one of either data or power transmission between the mobile electronic device and the docking accessory, the docking accessory optionally further constructed and arranged to allow electrical connection to the electrical contacts of the docking connector when the docking accessory is attached to the docking connector.

In one or more embodiments, the docking system may further include an accordion formed to extend outwardly from the docking connector and retract back toward the docking connector. The accordion's distal end is attached to the docking accessory body. A flexible circuit, such as a flat flex circuit or a flexible cable), may be configured within the accordion and connected between the electrical contacts and the docking accessory body, to provide one or both of power transmission and data transmission between the docking system and the docking accessory.

Some possible docking accessories include, but are not limited to, a battery, a solar panel, a game control, an LED light, a hand-crank charger, a weather sensor, a camera flash, a camera lens, an electrophysiology sensor, a memory card, a keyboard, a massage paddle, a glucose monitor, an infrared fat monitor, a breathalyzer, an ultrasound paddle, and a pulse oximeter. This list is not meant to be exhaustive in anyway, but is only meant to demonstrate some of the many possible accessories that may be adapted to present docking system.

In one or more embodiments, the detachable docking accessory system for a mobile electronic device according to the present invention includes a docking accessory body, an accordion structure constructed to attach magnetically to a selected one of two largest-surface-area surfaces of the mobile electronic device configured to extend outwardly from the selected surface and retract back toward the selected surface. The accordion's distal end is attached to the docking accessory body. Optionally, a flexible circuit is configured within the accordion and provides electrical connection between the mobile electronic device and the docking accessory body.

In one or more embodiments, the detachable docking accessory system for the mobile electronic device according to the present invention includes a docking accessory constructed, without an accordion, to attach magnetically to a selected one of two largest-surface-area surfaces of the mobile electronic device and optionally configured to electrically connect to the mobile electronic device.

One possible method of providing a docking accessory attachment for a mobile electronic device according to the present invention may be accomplished by forming a docking connector with a magnetic element for detachably mating with a compatible docking accessory. The docking accessory is attached at a selected one of two largest-surface-area surfaces, for example the back surface, of the mobile electronic device.

The method of providing a docking accessory attachment for a mobile electronic device may further include forming two or more electrical contacts within the selected surface, and electrically connecting the contacts to electronics within the mobile electronic device. Additional step may include, forming an electrical contact cavity, forming a magnetic attachment for a docking accessory within the docking connector, and electrically connecting the docking accessory to the electrical contacts. Optionally, two or more docking connectors may be formed within the docking area.

Those skilled in the art will appreciate that configurations similar to embodiments shown and described herein may be used.

Flush Mounted-Accessory Embodiments

One or more embodiments of the present invention are directed to mobile electronic devices having docking connectors. A device according to the present invention includes a docking platform formed at one of the largest-surface-area surfaces of the device, generally, but not necessarily, the back face of the device. The docking platform includes a docking connection system, the connection system having one or more docking connectors, each docking connector formed with at least one magnetic element for attaching temporarily with compatible docking accessories. The docking connection system enables multiple docking accessories to attach simultaneously and independently to the mobile electronic device without fixing the outer edges of the accessories. The docking platform enables docking accessories to attach to the mobile device without significantly increasing the effective carrying size of the mobile device by enabling the volumes of attached docking accessories to be distributed across a large portion of the selected surface. The docking platform is configured to accommodate a broad range of shapes and sizes of docking accessories. The range of docking accessories that might be accommodated by the docking platform includes, for example, batteries, solar panels, game controls, LED lights, hand-crank chargers, weather sensors, camera flashes, camera lenses, electrophysiology sensors, memory cards, keyboards, massage paddles, glucose monitors, infrared fat monitors, breathalyzers, ultrasound paddles, and pulse oximeters.

In one embodiment, the docking platform is integrally formed with the body of the mobile electronic device. The platform includes a docking connection system, the connection system having a docking connector formed with an elongated magnetic element formed beneath the outermost surface of the back face of the mobile electronic device, for temporarily attaching docking accessories securely to the docking platform, and two sets of nine electrical contacts, for transmission of power and data to and from docking accessories. The electrical contacts are formed of gold-plated nickel-plated copper, with copper pads. Each set of nine contacts is arranged in a generally circular fashion, with each contact disposed within a contact cavity for protecting the contact and for providing lateral stability to attached docking accessories. The contact cavities are generally circular in shape, except for one that is oval and serves also as a female index key, to ensure that the electrical contacts on a docked accessory mate with the appropriate contacts on the docking connectors. The remainder of the platform is formed of the same hard material as the rest of the body of the mobile electronic device.

Other embodiments include variations in (i) number of docking connectors; (ii) shape of docking connectors; (iii) size of docking connectors; (iv) number of electrical contacts (including zero); (v) configuration of electrical contacts; (vi) number and configuration of electrical contact cavities; (vii) mode of attachment of platform to the body of the mobile electronic device; (viii) materials of the platform and its components.

One or more embodiments of the docking platform may be formed in a selected one of two largest-surface-area surfaces of a mobile electronic device and include a docking area, a docking connection system formed within the docking area, the docking connection system having either one connector or more than one connector. Each docking connector may be formed with a magnetic element for temporarily bonding/securing one or more docking accessories. The docking connection system may be operable to form a detachable attachment to at least two docking accessories independently and simultaneously. Optionally, two or more electrical contacts are formed within the docking area, the contacts electrically connect to electronics within the electronic device and constructed and arranged to allow electrical connection to the docking accessory when the docking accessory is attached to the docking connector.

One or more embodiments of the docking connection system may include an electrical contact cavity for protecting an electrical contact and for providing lateral stability to docked accessories. The electrical contact cavity may be formed and configured to house one electrical contact, or it may be formed and configured to house more than one electrical contact.

One or more embodiments of the docking connection system may include a single docking connector operable to form a detachable attachment to two or more docking accessories simultaneously and independently. Optionally, the docking connection system may include more than one docking connector jointly operable to form a detachable attachment to two or more docking accessories simultaneously and independently.

One or more embodiments of the docking connection system may include an aligning element for aligning the docking accessory.

Electrical contacts may be biased to form an electrical connection with the docking accessory when the docking accessory is attached to the docking connector.

One or more embodiments of the docking system according to the present invention include a docking platform formed in a selected one of two largest-surface-area surfaces of a mobile electronic device having a docking area and a docking connector formed within the docking area. The docking connector may include a magnetic element for securing docking accessories. Optionally two or more electrical contacts are provided within the docking area. The contacts electrically connect to electronics within the electronic device. A docking accessory may be constructed and arranged to form a detachable attachment to the docking connector and further constructed to allow at least one or both of data and power transmission between the mobile electronic device and the docking accessory. The docking accessory may be optionally configured to provide electrical connection to the electrical contacts of the docking connector when the docking accessory is attached to the docking connector.

The docking system may further include an accordion capable of extending outwardly from the docking connector and retracting back toward the docking connector. The accordion's distal end attached to the docking accessory body. A flexible circuit, such as a flat flex circuit or a flexible cable, may be disposed within the accordion and connected between the electrical contacts and the docking accessory body.

The docking accessory may include a battery, solar panel, game control, LED light, hand-crank charger, weather sensor, camera flash, camera lens, electro physiology sensor, memory card, keyboard, massage paddle, glucose monitor, infrared fat monitor, breathalyzer, ultrasound paddle, or pulse oximeter, among other electronic accessories.

One or more embodiments of a detachable docking accessory system for a mobile electronic device according to the present invention includes a docking accessory body, an accordion constructed to attach magnetically to a selected one of two largest-surface-area surfaces of the mobile electronic device and capable of extending outwardly from the selected surface and retracting back toward the selected surface. The accordion's distal end attached to the docking accessory body, and optionally a flexible circuit disposed within the accordion and configured to electrically connect to the mobile electronic device and the docking accessory body. A second detachable docking accessory system for the mobile electronic device according to the present invention includes a docking accessory constructed, without an accordion, to attach magnetically to a selected one of two largest-surface-area surfaces of the mobile electronic device and optionally configured to electrically connect to the mobile electronic device.

A process of providing attachment of a docking accessory to a mobile electronic device according to the present invention includes the steps forming a docking connector comprising a magnetic element, operable to form a detachable bond with a compatible docking accessory, within a selected one of two largest-surface-area surfaces of the mobile electronic device. The process may further include forming two or more electrical contacts within the selected surface, and electrically connecting the contacts to electronics within the electronic device, forming an electrical contact cavity, magnetically attaching a docking accessory to the docking connector, electrically connecting the docking accessory to the electrical contacts. It will be understood that the process may form two or more docking connectors within the docking area.

Those skilled in the art will appreciate that configurations similar to embodiments shown and described herein may be used.

BRIEF DESCRIPTION OF TIE DRAWINGS

FIG. 2C shows a side cutaway view of the mobile electronic device with the docking platform of FIG. 2A, in an embodiment.

FIG. 11C shows an isometric bottom view of the solar charging accessory of FIG. 11A, in an embodiment.

FIG. 15A shows an isometric back view of a docking system comprising a generic docking accessory and a mobile electronic device with a generic docking platform formed on its back face, in an embodiment.

FIG. 15B shows an isometric back view of the mobile electronic device of FIG. 15A with isometric back views of six possible docking platform, in embodiments.

FIG. 16 shows an isometric drawing showing an embodiment of the present invention implemented with a tablet device, in an embodiment.

DETAILED DESCRIPTION OF THE INVENTION

One advantage of the present invention is that it allows multiple docking accessories to attach simultaneously and independently to the mobile electronic device. Some docking accessories, such as supplemental camera lenses and flashes, stereo speakers, and electrophysiology sensors, naturally work together in pairs. As such the present invention fulfills the need for a method that enables multiple docking accessories to attach simultaneously to the mobile electronic device. Furthermore, different circumstances might call for one and the same accessory to be paired with different partner accessories. For instance, a daytime circumstance might call for a supplemental camera lens accessory to be combined with a supplemental battery accessory, whereas a nighttime circumstance might call for the same camera lens to be combined instead with a supplemental flash accessory. The present invention fulfills the need for a method that enables multiple docking accessories to attach both simultaneously and independently to the mobile electronic device.

Figure 1A:
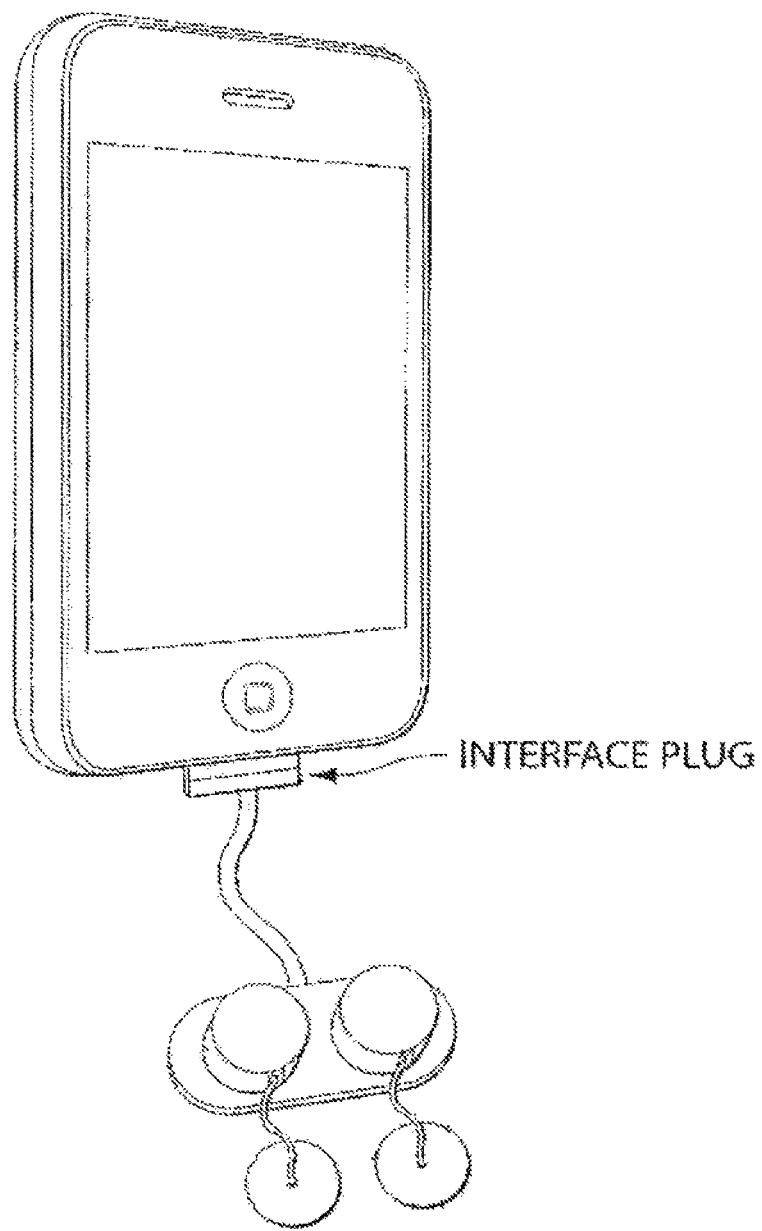
FIG. 1A (Prior Art) shows a prior art cell phone device with a typical end connector and a cable-connected accessory.
Figure 1B:
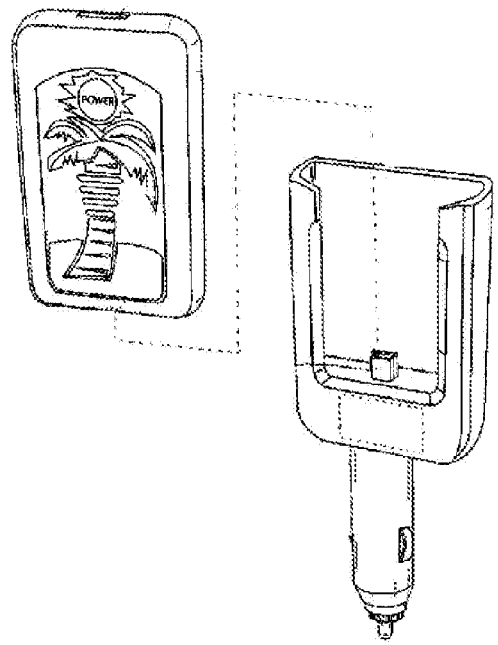
FIG. 1B (Prior Art) shows a prior art device with an end connector and a rigid partial-case accessory.
Figure 1C:
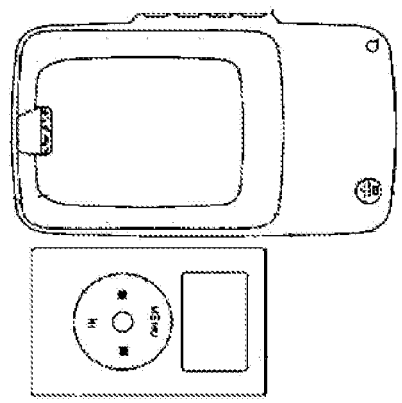
FIG. 1C (Prior Art) shows a prior art device with an end connector and a rigid full-case accessory.
Figure 1C:
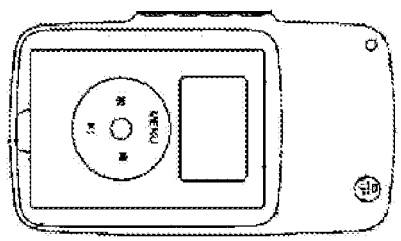
Figure 1D:
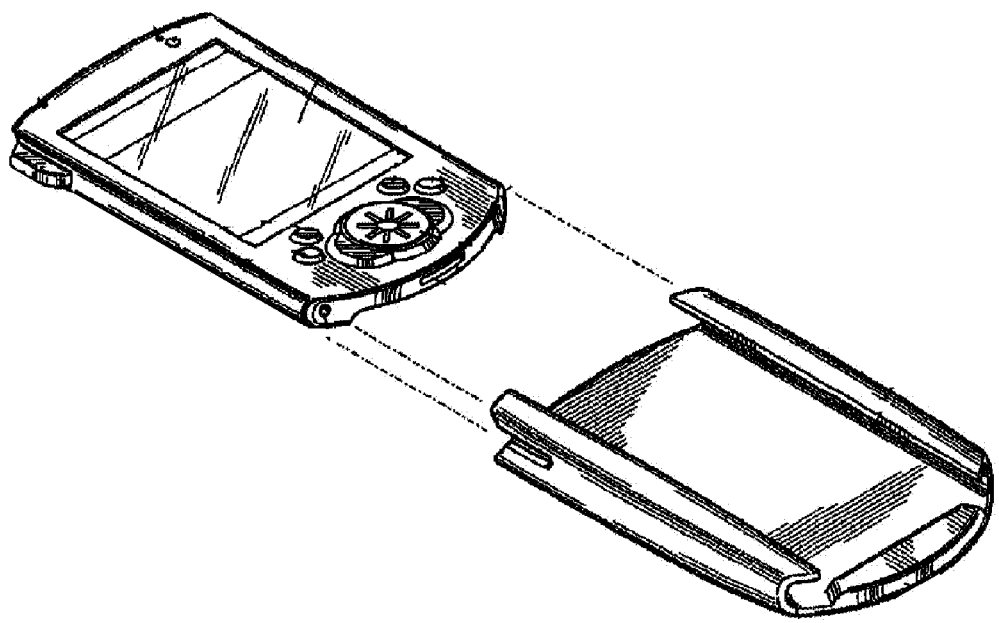
FIG. 1D (Prior Art) shows a prior art device and associated docking sleeve, which are specially adapted to mate with each other.
Figure 1E:
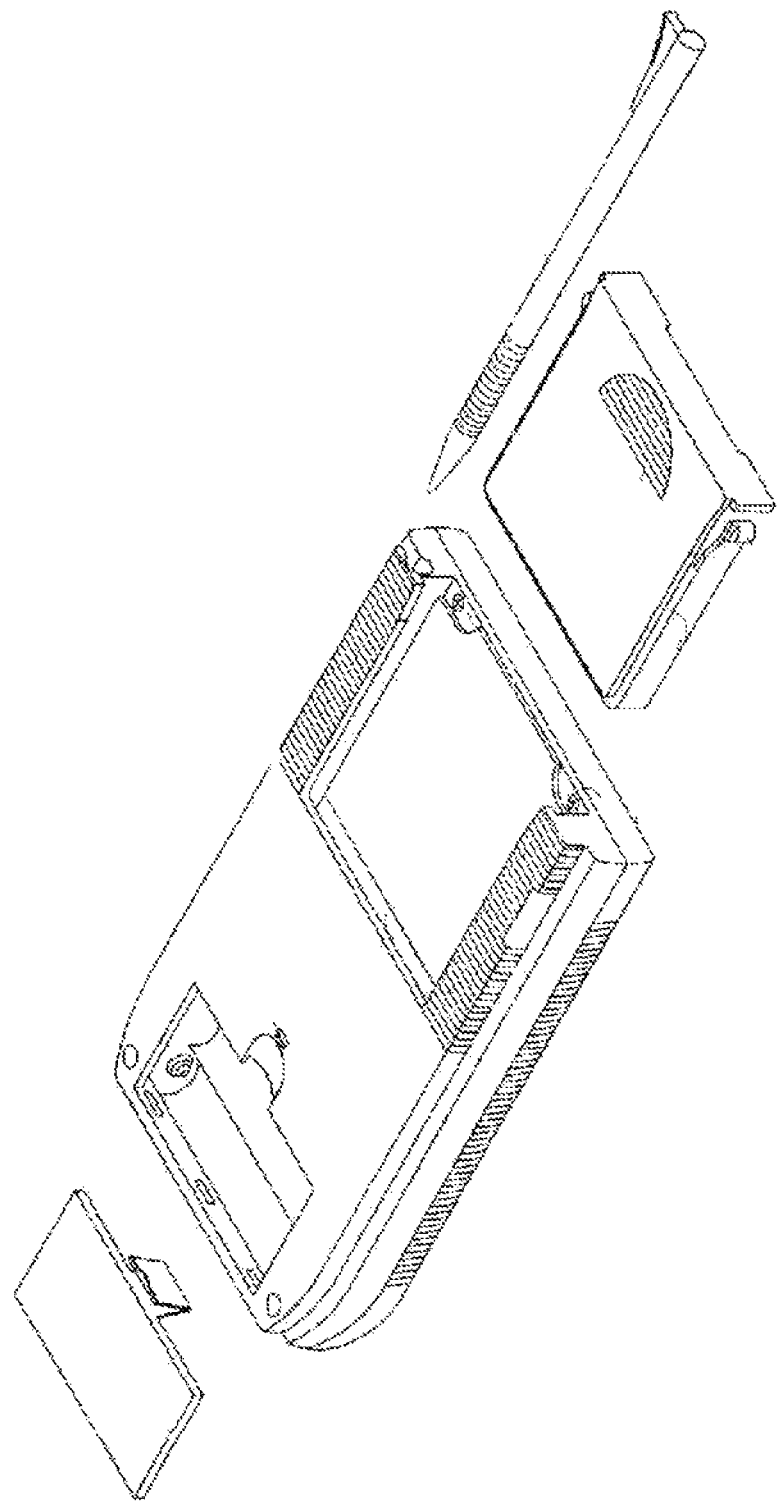
FIG. 1E (Prior Art) shows a prior art device and a rectangular dummy accessory
Figure 2A:
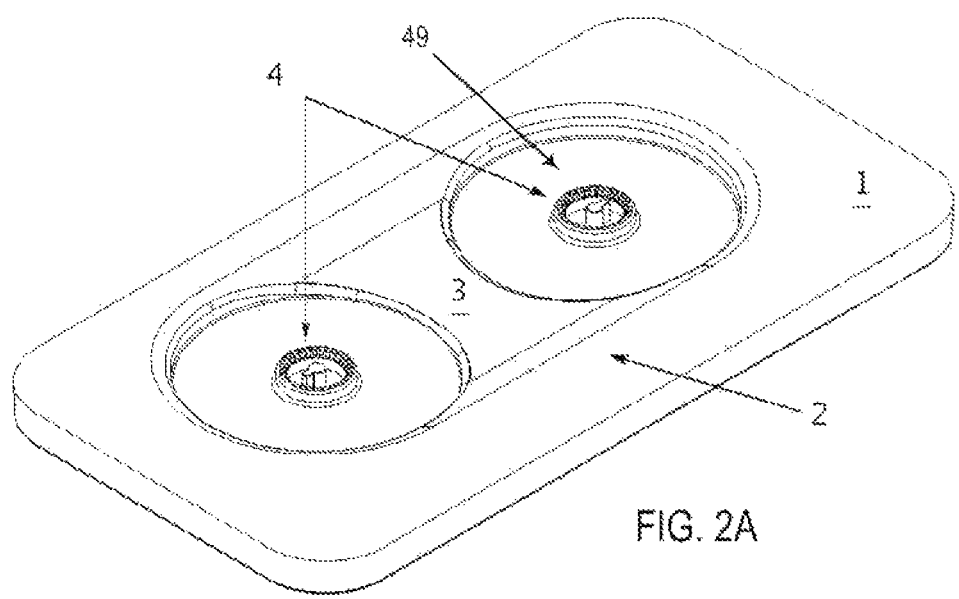
FIG. 2A shows an isometric back view of a mobile electronic device with a docking platform with electrical contacts of the docking connectors disposed evenly around the inner edge of the female snap-lit feature of the docking connectors, according to an embodiment.
Figure 2B:
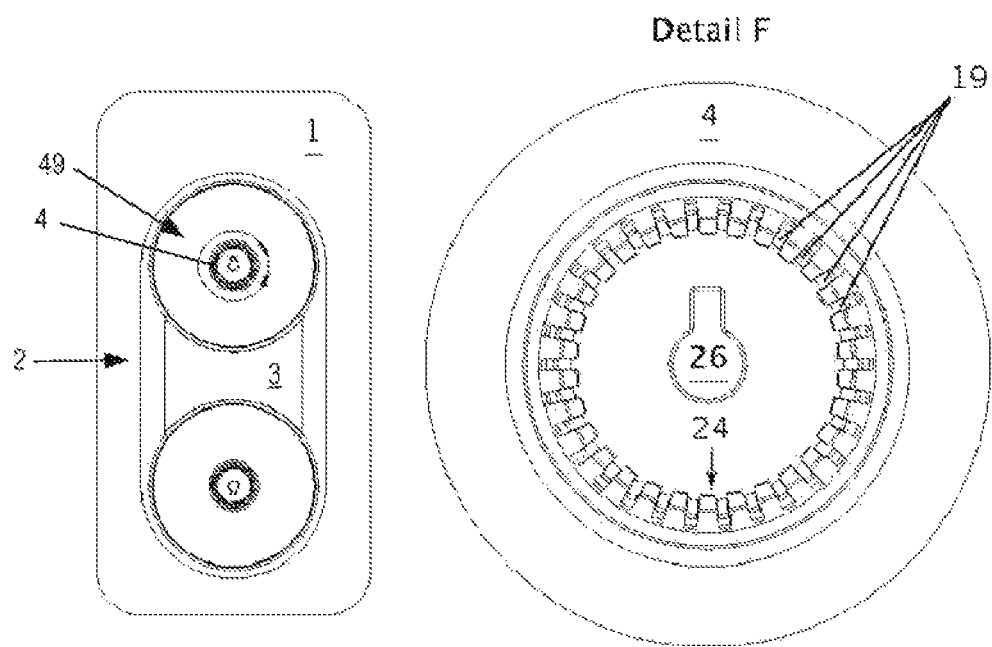
FIG. 2B shows a back view of the mobile electronic device with the docking platform of FIG. 2A, with a detailed view of one of the docking connectors, in an embodiment.
Figure 3A:
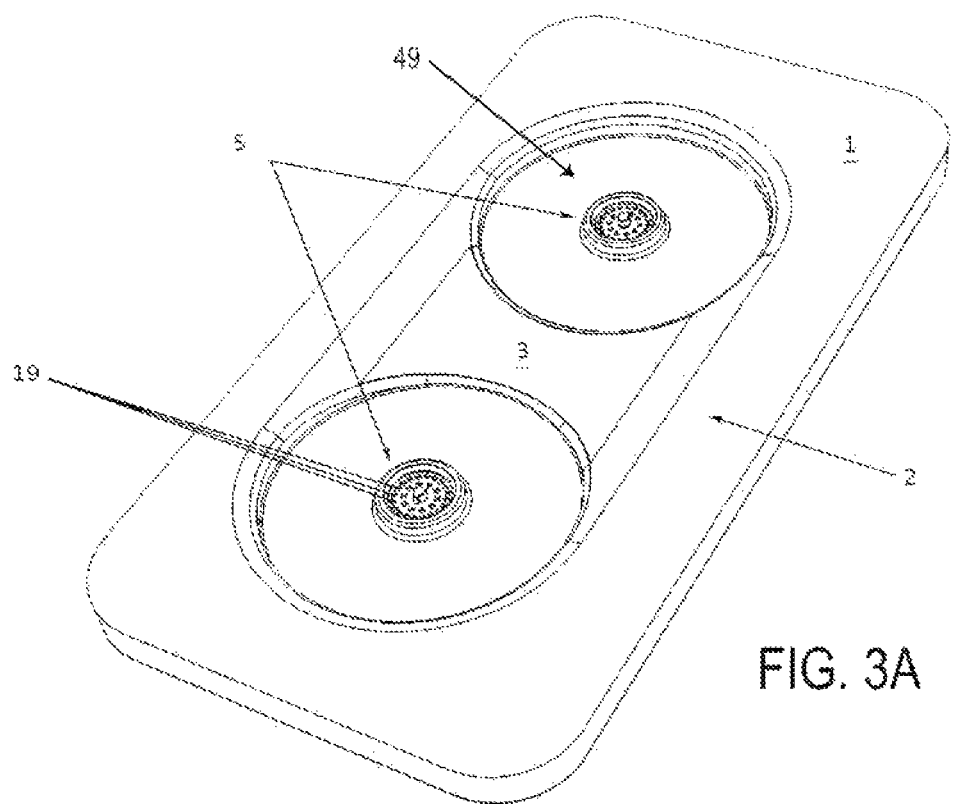
FIG. 3A shows an isometric view of a mobile electronic device with a docking platform with electrical contacts disposed in sockets at the base of the docking connectors, according to an embodiment.
Figure 3B:
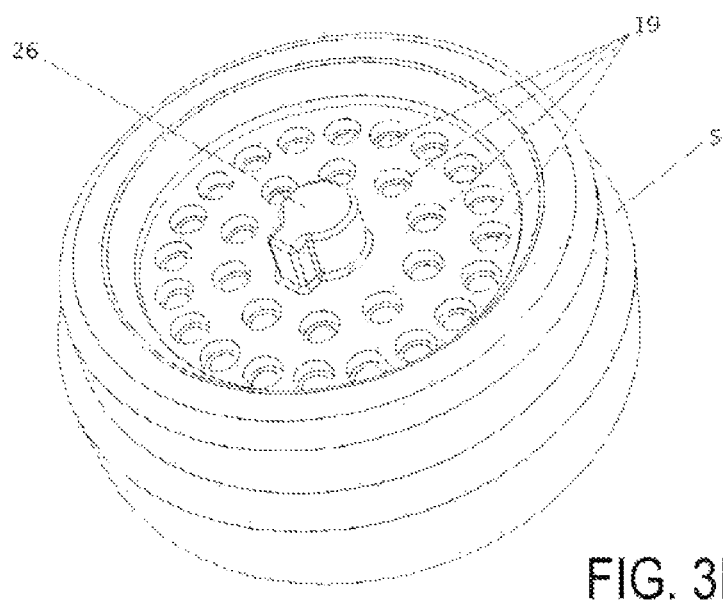
FIG. 3B shows a detailed view of the docking connector of FIG. 3A.

FIGS. 2A-C illustrate one embodiment of docking connectors 4. FIGS. 3A and 3B illustrate one possible alternative embodiment of docking connectors 5. In both embodiments a plurality of electrical contacts 19 are arranged in a circular pattern about the docking connectors. It will be appreciated that other patterns, shapes, and numbers of connectors may be used without departing from the scope herein. By way of example, pins of a docking connector are arranged as shown in Table 1. The same contacts could be arranged in various circular patterns to form, for example, the connector patterns as shown in FIGS. 2A-C and FIG. 3A-B. Depending on the specific docking connector configuration of the mobile electronic device and what accessory is to be used, various pins are connected and active.

TABLE 1

| Pin | Name | Description |
| --- | --- | --- |
| 1 | GND | Ground |
| 2 | V + Out | Power Out (to docking accessory) |
| 3 | V + In | Power In (from docking accessory) |
| 4 | D+ | Data Positive |
| 5 | D− | Data Negative |
| 6 | Detection/Identification/Configuration | (optional) |
| 7 | Clock | (optional) |
| 8 and greater | Expansion | (optional) |

FIG. 2A shows an isometric back view of a mobile electronic device 1 with a docking platform 2, in an embodiment. Docking platform 2 is formed with a docking connection system 49 having two docking connectors 4 situated in an accessory cavity 3. FIG. 2B shows a back view of mobile electronic device 1 with docking platform 2 and a detailed view of one of docking connectors 4. The embodiment of docking connector 4 is shown with a female snap-fit 24, male index key 26, and docking connector electrical contacts 19. FIG. 2C shows a side cutaway view of device 1 with docking platform 2. In this embodiment, circular arrays of docking connector electrical contacts 19 are disposed evenly around the inner edge of female snap-fits 24 of docking connectors 4.

FIG. 3A shows an isometric view of a mobile electronic device 1 with a docking platform 2 according to a second embodiment. Mobile electronic device 1 is similar to mobile electronic device 1 of FIG. 2A, with the exception that docking connectors 5 replace docking connectors 4. In FIG. 3A, electrical contacts 19 are configured with docking connectors 5 are disposed in concentric circles to form sockets at the base of the docking connectors. FIG. 3B shows a detailed view of one of docking connectors 5 of FIG. 3A. This is an alternative to the embodiment of FIG. 2A, wherein the electrical contacts 19 of docking connectors 4 of FIG. 2A are disposed evenly around the inner edge of female snap-fit feature 24 of the docking connectors. In the present embodiment, connectors 5 are shown to include optional male index keys 26.

Figure 4A:
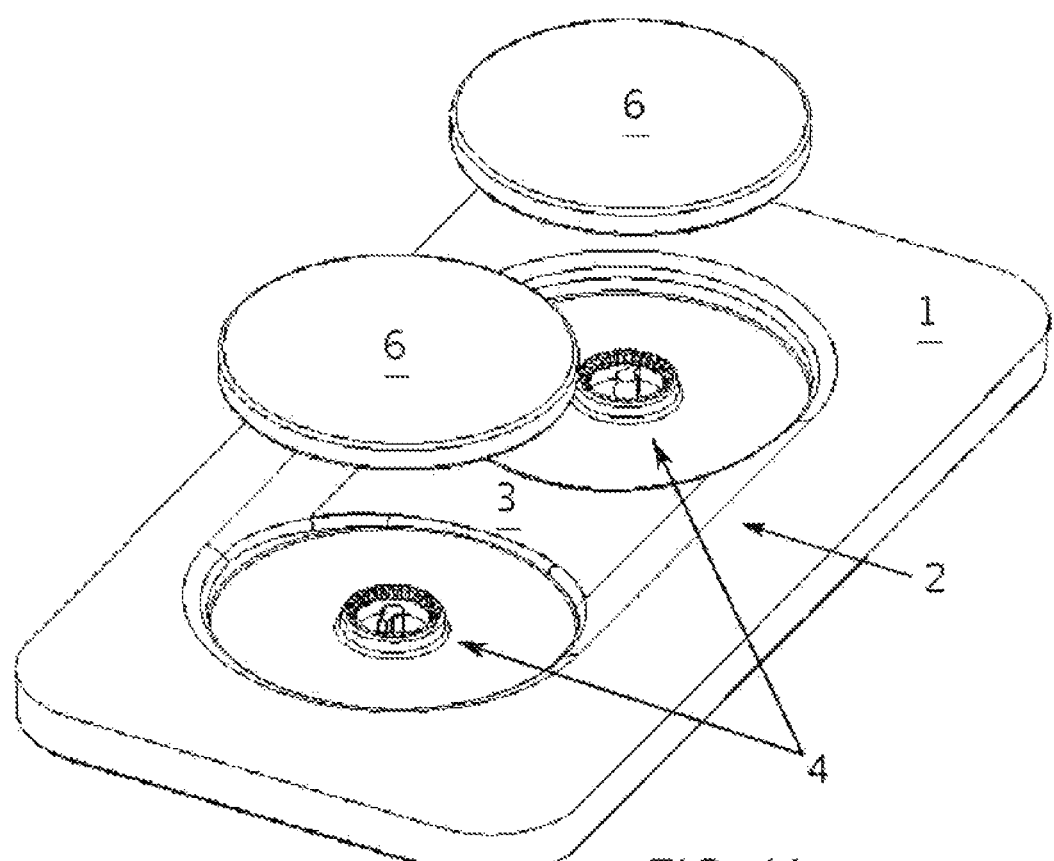
FIG. 4A shows an isometric view of the mobile electronic device with the docking platform of FIG. 2A with the addition of two unattached basic generic docking accessories, in an embodiment.
Figure 4B:
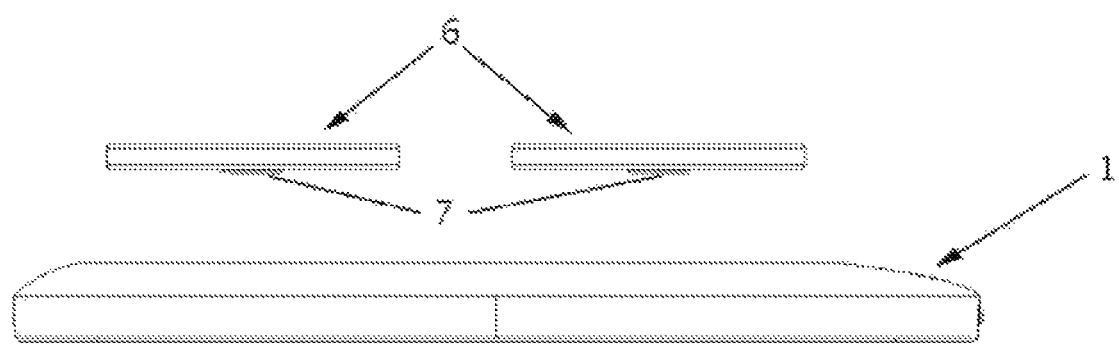
FIG. 4B is a side view of the mobile electronic device with docking platform of FIG. 4A with the two unattached basic generic docking accessories.
Figure 4C:
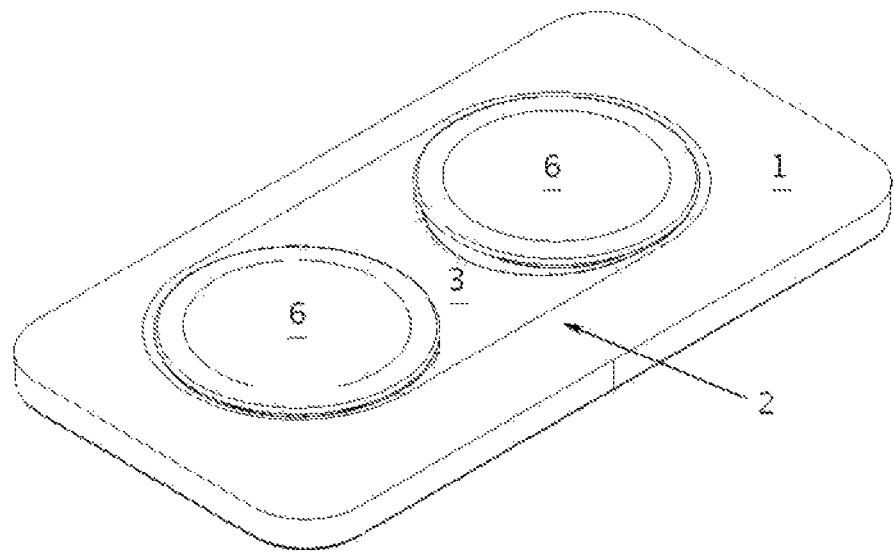
FIG. 4C shows an isometric view of the mobile electronic device with docking platform of FIG. 4A with the two basic generic docking accessories attached to the docking connectors of the docking platform.

FIG. 4A is an isometric view of mobile electronic device 1 of FIG. 2A with two unattached basic generic docking accessories 6. FIG. 4B illustratively represents a side view of the arrangement of FIG. 4A, showing basic generic docking accessories 6, each with a docking accessory male snap-fit 7. FIG. 4C is an isometric view of mobile electronic device 1 of FIG. 4A, with docking accessories 6 attached to docking connectors 4 of docking platform 2. It should be understood that in this embodiment docking accessory cavity 3 provides for the back surface of accessories 6 to be substantially flat and even (I.e., substantially co-planar) with the back surface of device 1 when accessories 6 are secured as shown in FIG. 4C. This beneficial arrangement of accessories 6 often does not increase the thickness of device 1 when accessories are attached thereto and reduces the chance of catching an exposed accessory on clothing or the like, in an embodiment where an accessory, similar to accessory 6, is too thick to sit flush with the back surface of device 1, cavity 3 minimizes the combined thickness of mobile electronic device 1 and the accessory, and also reduces interference caused by the thicker accessories' exposed portions catching on the other objects, surfaces, edges, etc.

Figure 5:
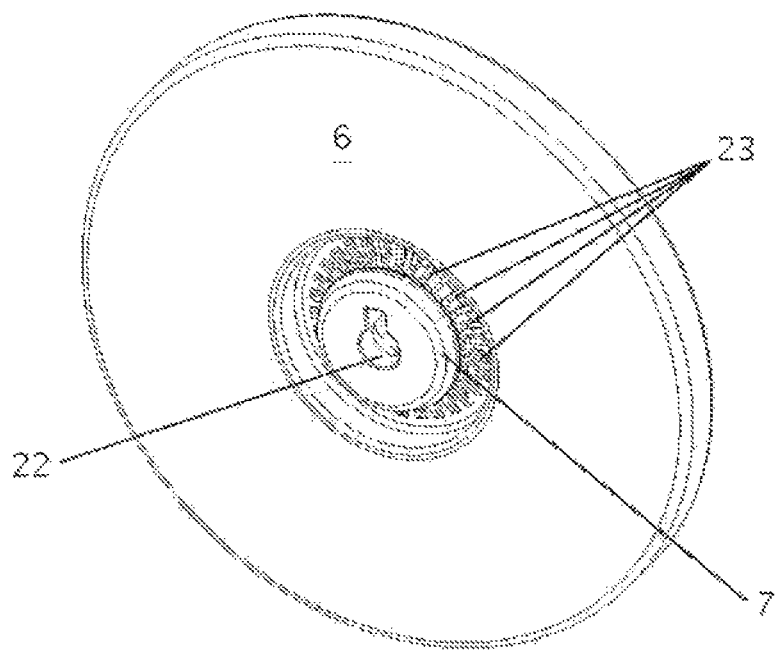
FIG. 5 shows a detailed isometric bottom view of a basic generic docking accessory, in an embodiment.

FIG. 5 shows a detailed isometric bottom view of basic generic docking accessory 6. Docking accessory 6 of FIG. 5 is configured for removably attaching to docking connector 4, FIG. 2A. A female index key 22 cooperates with male snap-fit connector 7 to align and mate accessory 6 with connector 4. When mated, accessory connector electrical contacts 23 make contact with docking connector electrical contacts 19 to provide one or both of the transmission or power and data.

FIGS. 6A-F illustrate an extendable docking accessory assembly 8 formed of docking accessory body 9 attached to a docking accessory accordion 10. Expandable docking accessory assembly 8 may extend outwardly from the back of device 1 by expanding accessory accordion 10. Accessory assembly 8 is very similar to the sockets (comprising in general an accordion and an end cap) as taught in U.S. Pat. No. 8,560,031 (incorporated herein by reference).

Figure 6A:
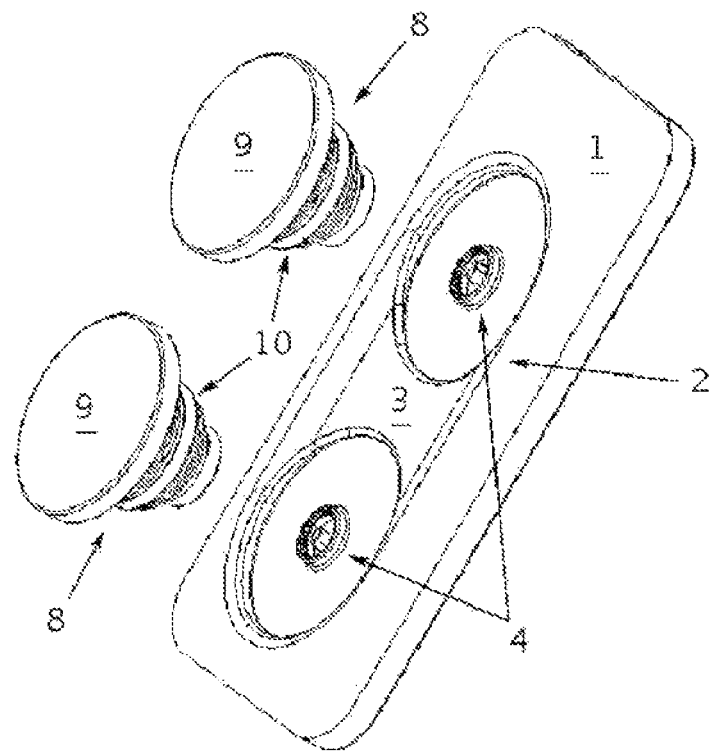
FIG. 6A shows an isometric view of the mobile electronic device with docking platform of FIG. 2A and two unattached expandable generic docking accessories in their expanded states, in an embodiment.
Figure 6B:
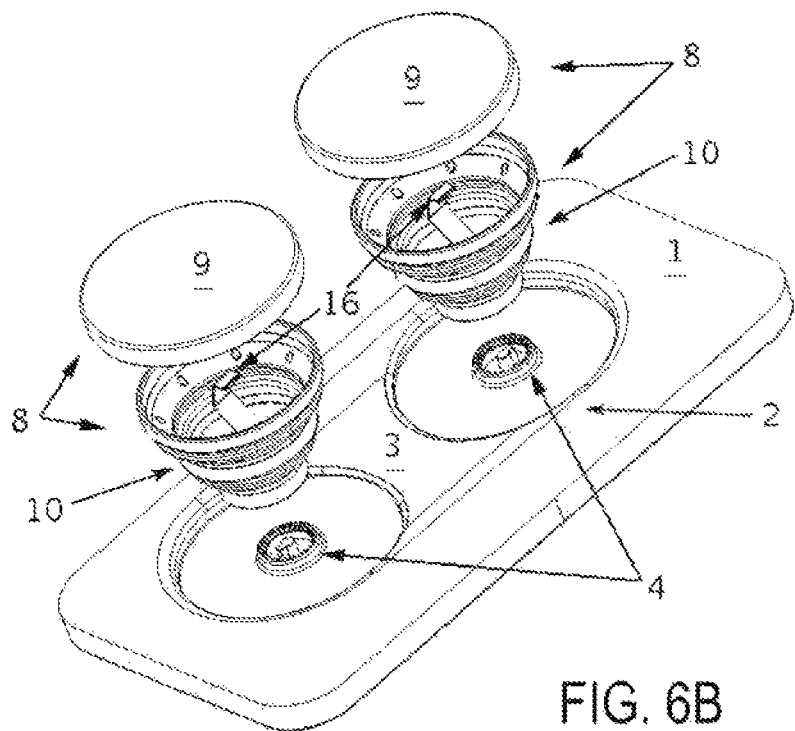
FIG. 6B shows an exploded isometric view of the mobile electronic device with docking platform of FIG. 6A and two unattached expandable generic docking accessories in their expanded states, in an embodiment.

FIG. 6A shows an isometric view of mobile electronic device 1 of FIG. 2A with two unattached docking accessory assemblies 8 in their expanded states. FIG. 6B shows an exploded isometric view of the arrangement of FIG. 6A, showing docking accessory bodies 9 separated from accordions 10. Flex circuits 16 are disposed within accordions 10.

Figure 6C:
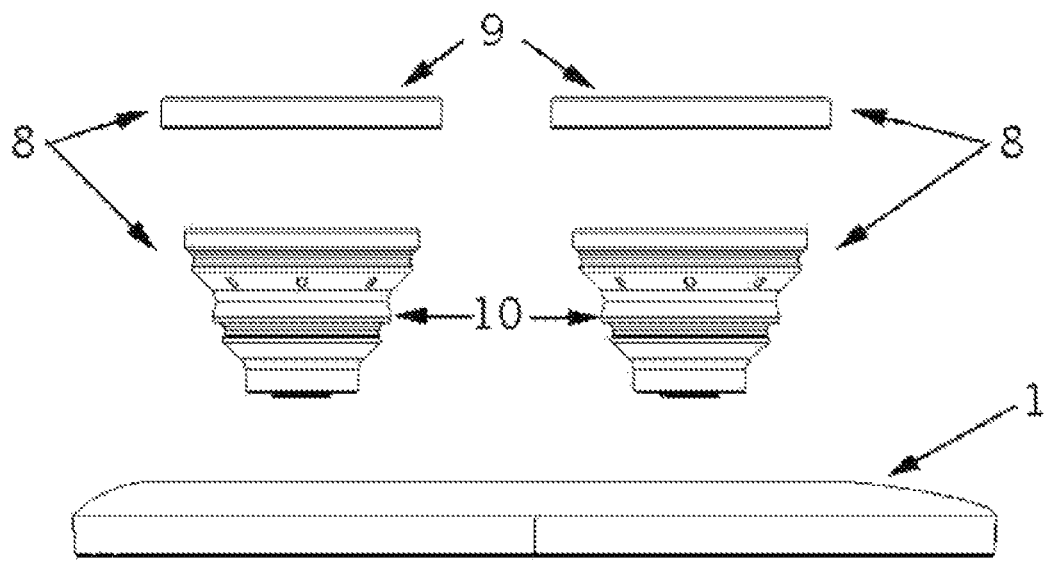
FIG. 6C shows an exploded side view of the mobile electronic device with docking platform of FIG. 6A and two unattached expandable generic docking accessories in their expanded states, in an embodiment.
Figure 6D:
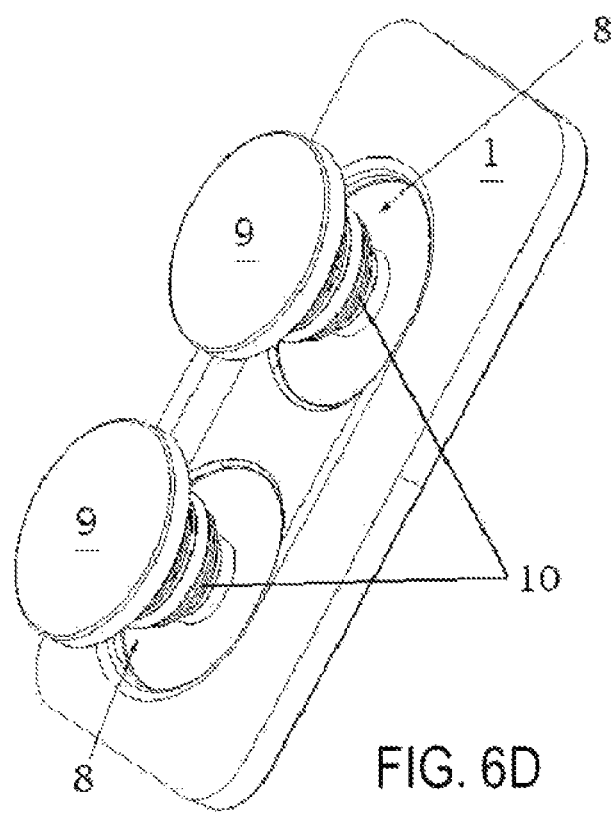
FIG. 6D shows an isometric view of the mobile electronic device with docking platform of FIG. 6A and two attached expandable generic docking accessories in their expanded states, in an embodiment.

FIG. 6C shows an exploded side view the arrangement of FIG. 6B. FIG. 6D shows an isometric view of the arrangement of FIG. 6A, where accessory assemblies 8 are attached to docking connectors 4.

Figure 6E:
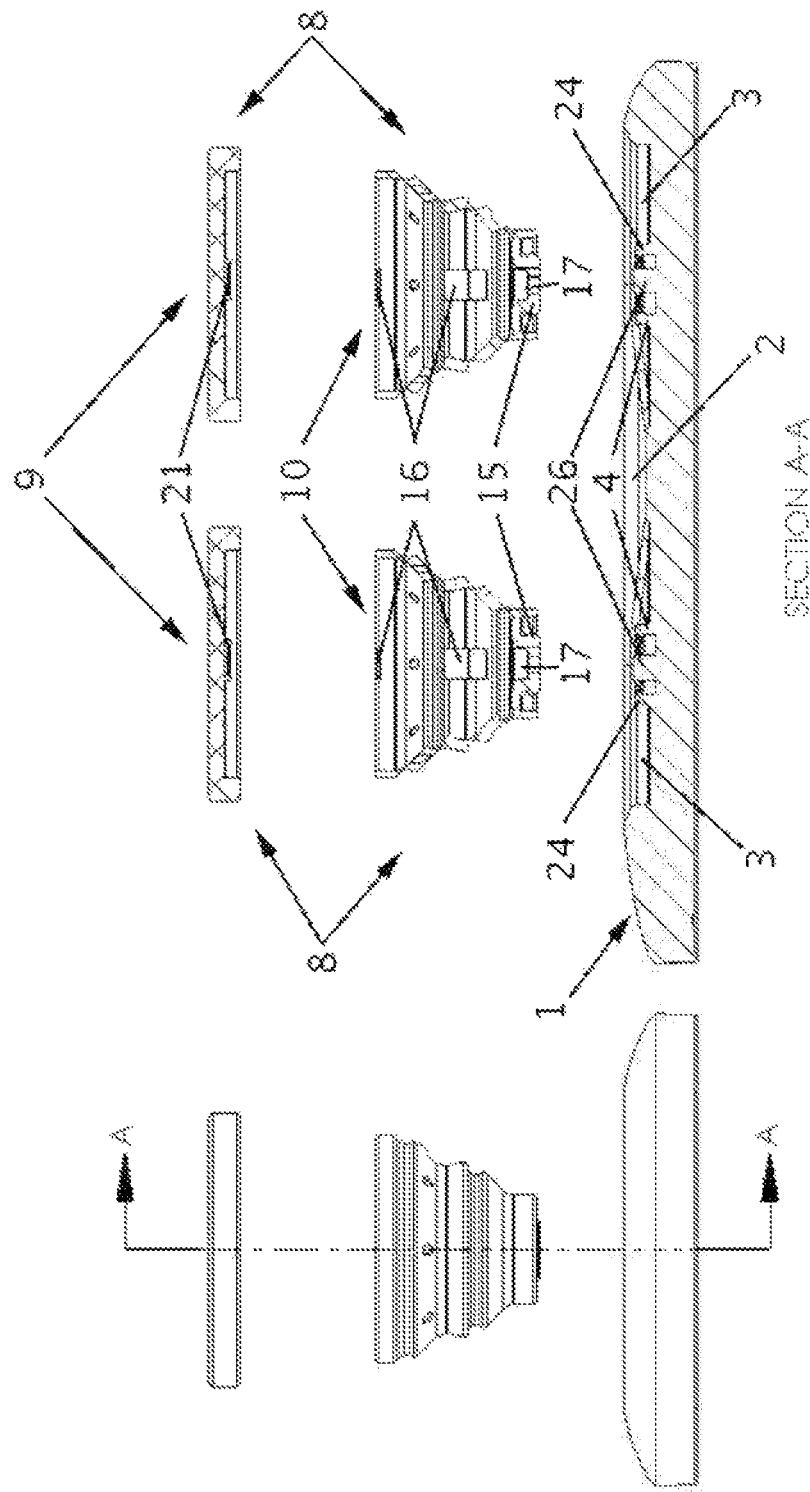
FIG. 6E is an exploded side cutaway view of the mobile electronic device with a docking platform of FIG. 6A with unattached expandable generic docking accessories in their expanded states, in an embodiment.
Figure 6F:
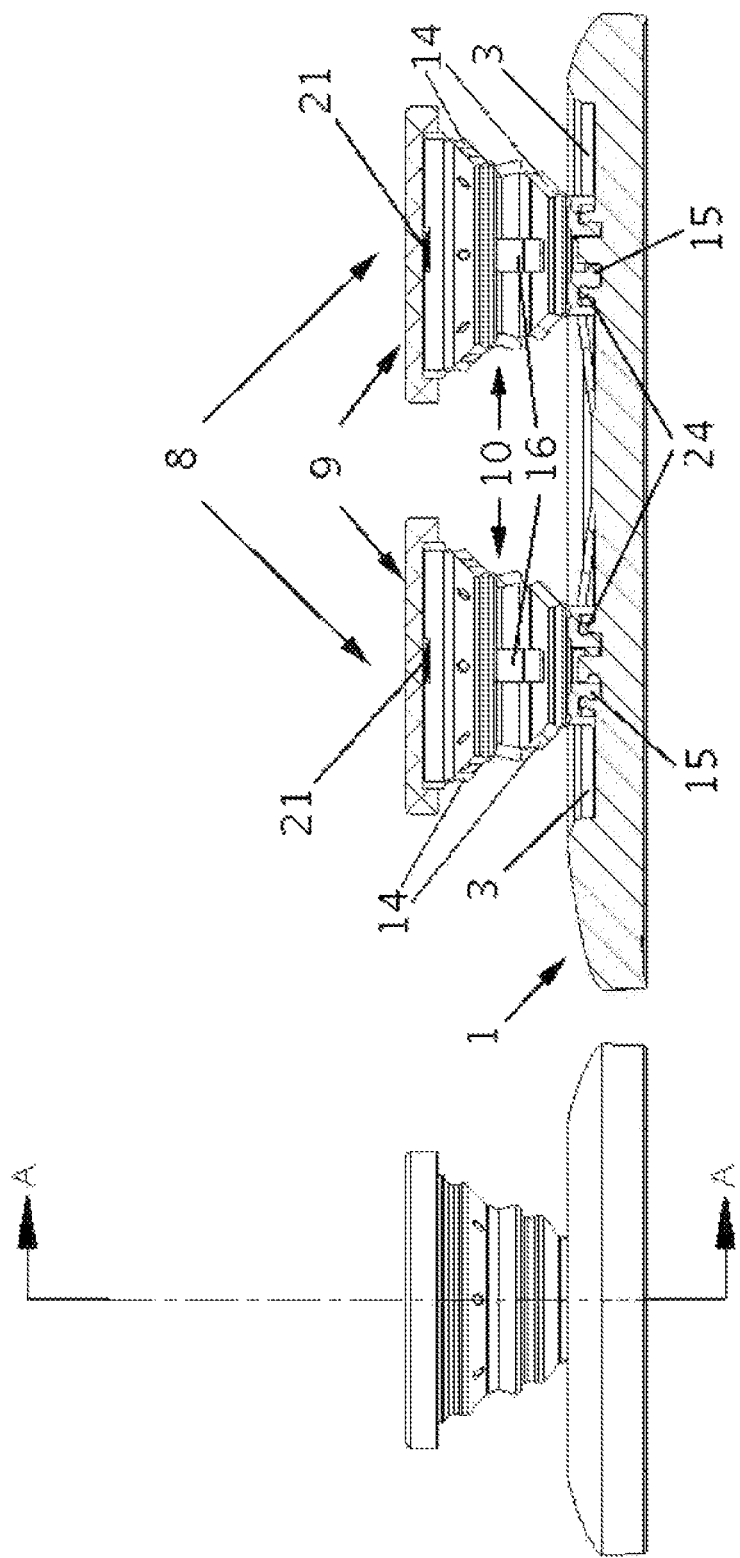
FIG. 6F shows a side cutaway view of the mobile electronic device with a docking platform of FIG. 6A with attached expandable generic docking accessories in their expanded states, in an embodiment.

FIG. 6E shows an exploded side cutaway view of the arrangement of 6C. A female connector 21 can be seen configured with accessory 9. Accordions 10 are formed with flex circuits 16, which do not inhibit accordions 10 when accordions 10 are collapsed flat against the back surface of device 1, within cavity 3. Female index key 17 aligns with male index key 26 to ensure proper connection. FIG. 6F is a side cutaway view of the arrangement of FIG. 6E with docking accessory assemblies 8 attached to mobile electronic device 1. Male snap-fit connector 15 attaches to docking connector 4 female snap-fit 24. Bi-stable accordion flipper walls 14 are in their upward states.

Figure 7:
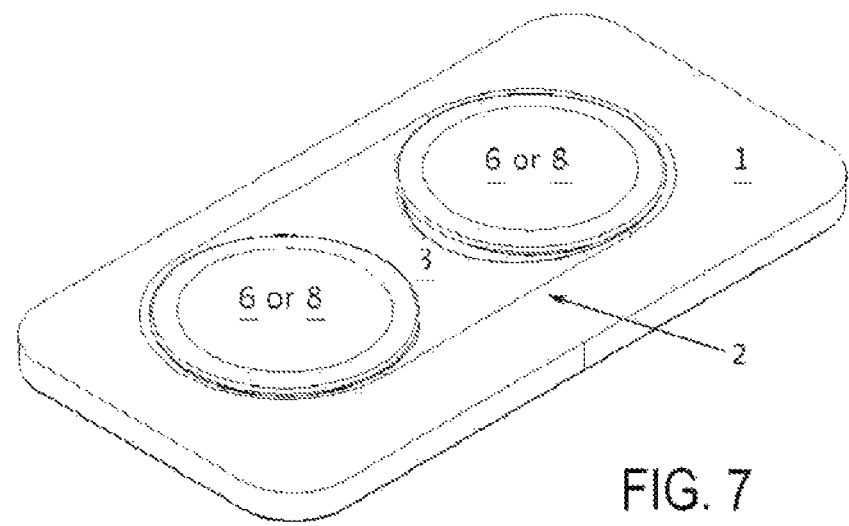
FIG. 7 shows an isometric view of the mobile electronic device with a docking platform of FIG. 6A with attached generic docking accessories that are either basic accessories or expandable accessories in their collapsed states, in an embodiment.

FIG. 7 shows an isometric view of mobile electronic device 1 with a docking platform of FIG. 2 or FIG. 3, with attached generic docking accessories that are either basic accessories 6, expandable docking accessory assemblies 8 in their collapsed states, or some other accessory.

Figure 8:
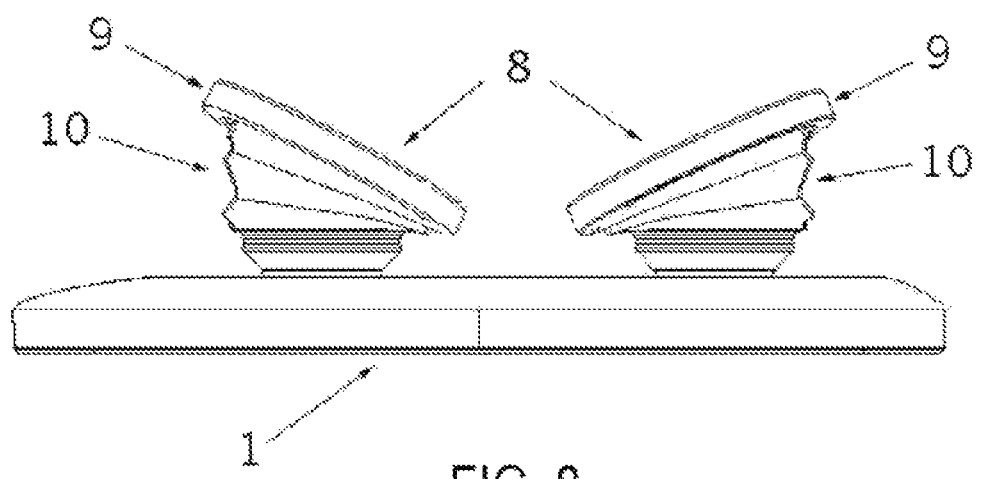
FIG. 8 shows a side view of the mobile electronic device with a docking platform of FIG. 6A with attached expandable generic docking accessories in one of their partially collapsed states, wherein the bodies of the docking accessories are rotated at oblique angles to the back surface of the mobile device, in an embodiment.

FIG. 8 shows a side view of mobile electronic device 1 with expandable docking accessory assemblies 8 in one of its many partially collapsed states. This configuration is useful for orienting the faces of certain docking accessories, for example electrophysiology devices such as ECG accessories, for optimal functioning.

Figure 9A:
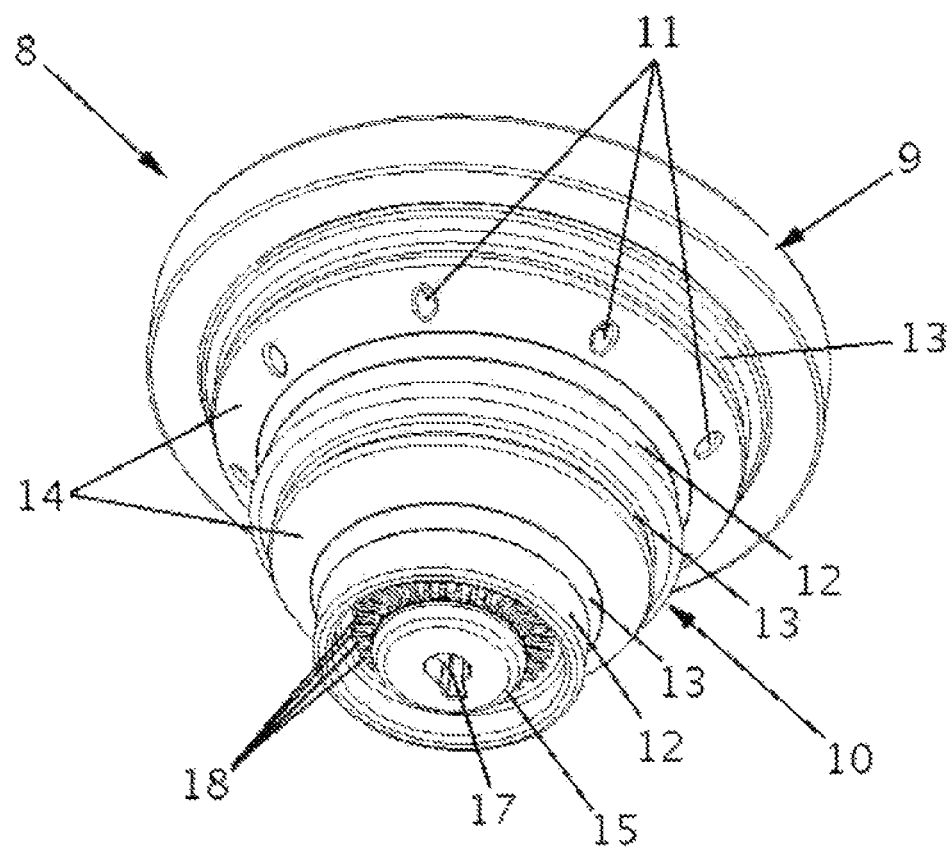
FIG. 9A shows an isometric bottom view of an expandable generic docking accessory in its fully expanded state, in an embodiment.

FIG. 9A shows one embodiment of an isometric bottom view of an extendable docking accessory assembly 8 in its fully expanded state. Male electrical contacts 18 are configured to engage with female electrical contacts 19 of docking connector 4 as shown in FIG. 2A. Female index key 17 aligns with male index key 26 to facilitate proper orientation when attaching extendable docking accessory assembly 8 to docking platform 2. When accessory assembly 8 moves from an expanded state to a collapsed state, flexural hinges 13 flex to facilitate vertical walls 12 of accessory 8 to move into a stable concentric configuration as accordion 10's flipper walls 14 move from a stable upward state, with the outer edges above their inner edges, to a stable downward state, whereby the outer edges are below the inner edges.

Figure 9B:
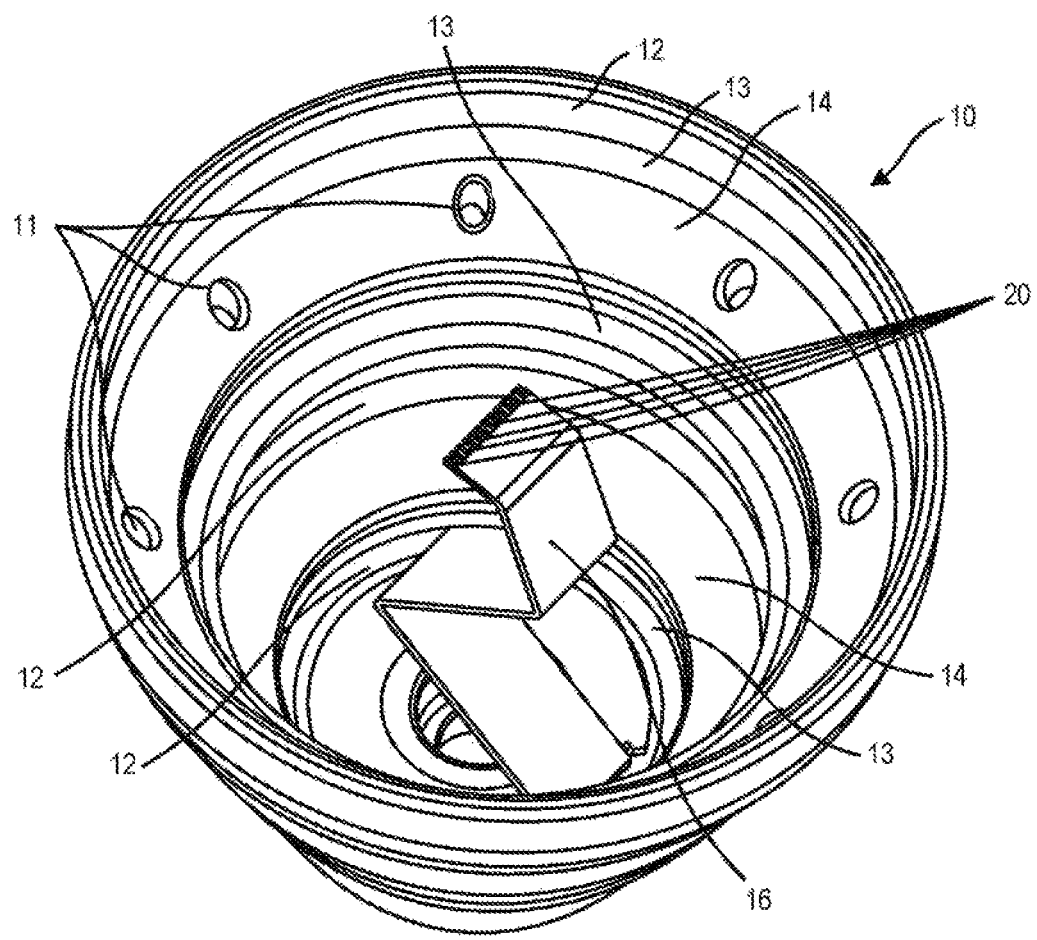
FIG. 9B shows an isometric top view of an expandable generic docking accessory accordion of FIG. 9A in its fully expanded state, in an embodiment.
Figure 9C:
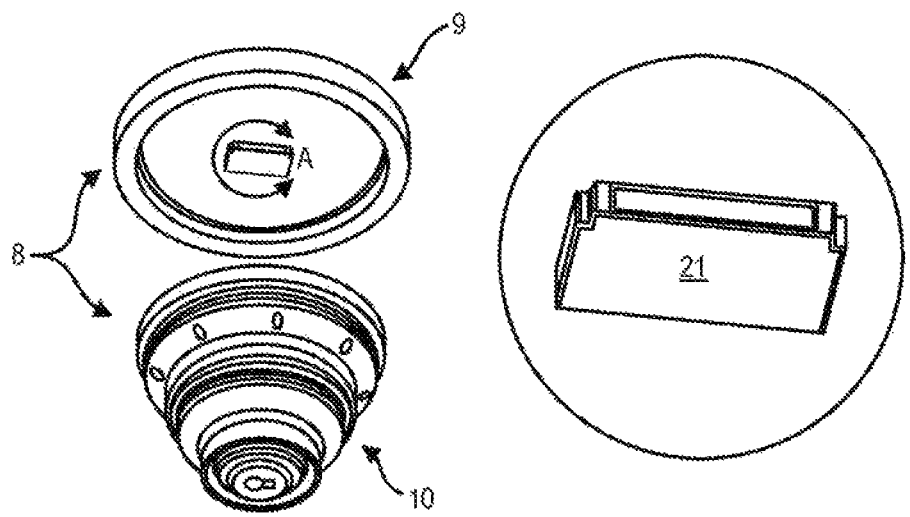
FIG. 9C shows an exploded, isometric, bottom view of the expandable generic docking accessory of FIG. 9A in its fully expanded state, with a detailed view of the expandable generic docking accessory body female flex-circuit connector, in an embodiment.
Figure 9D:
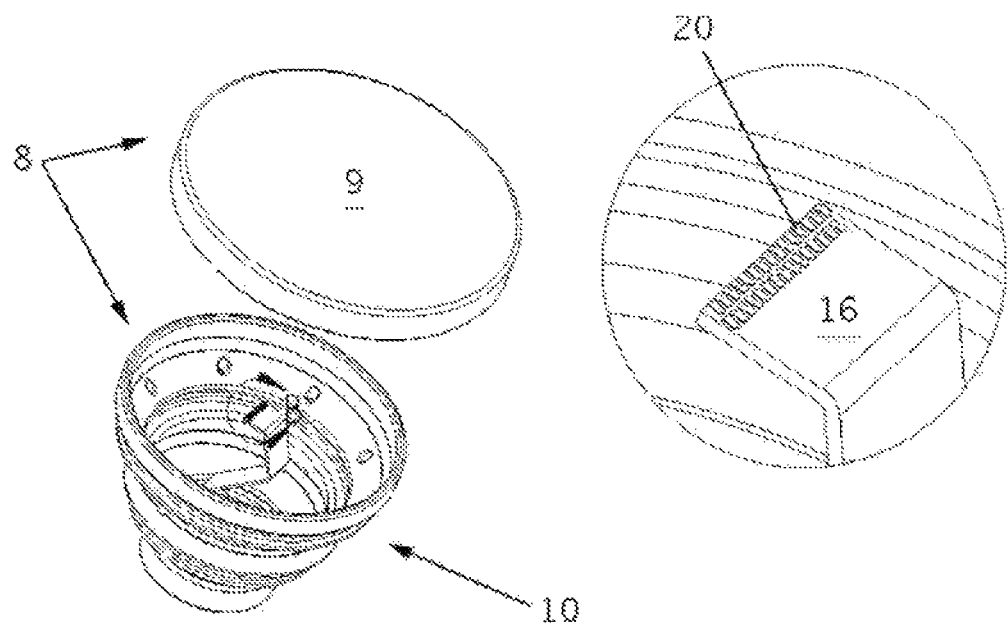
FIG. 9D shows an exploded, isometric, top view of the expandable generic docking accessory of FIG. 9A in its fully expanded state, with a detailed view of the expandable generic docking accessory accordion flex circuit, in an embodiment.
Figure 9E:
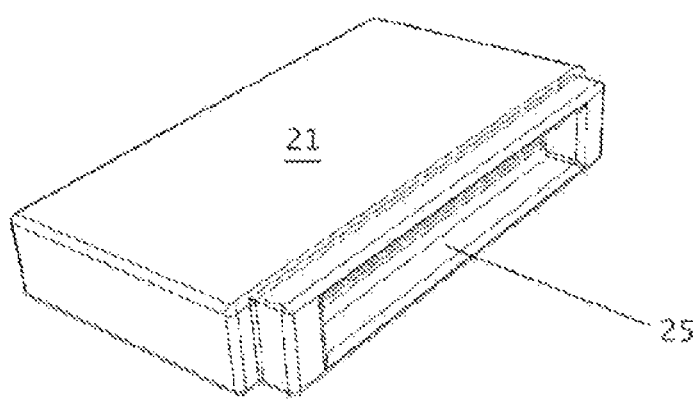
FIG. 9E shows an isometric view of the expandable generic docking accessory body female connector of FIG. 9C, in an embodiment.

FIG. 9B shows an isometric top view of accordion 10 of FIG. 9A. FIG. 9C shows an exploded, isometric, bottom view of accessory 8 and accordion 10 with an expanded view of accessory connector 21. FIG. 9D shows a top view of the same arrangement with an expanded view of flex circuit 16. Accordion flex circuit 16 is disposed within accordion 10, and provides electrical connection between device 1, via contacts 19 shown in FIG. 2B, and male electrical contact 18 shown in FIG. 9A, and accessory body 9, via connector 21. FIG. 9E shows an isometric view of accessory connector 21. Contacts 20 are inserted into port 25 to connect accessory body 9. As an option, accessory body 9 might be detachable from accordion 10.

Figure 10A:
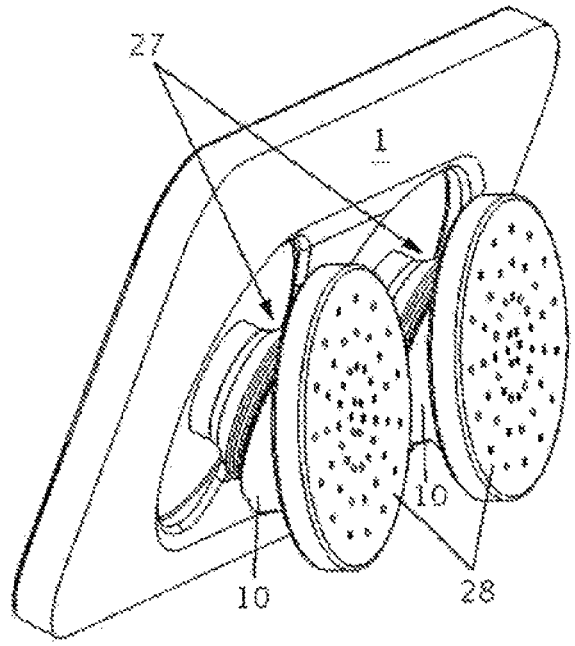
FIG. 10A shows an isometric view of the mobile electronic device with two docked speaker accessories, according to one embodiment of the invention, in an embodiment.

FIGS. 10A-D show one example of a set of speaker accessories 27 used in conjunction with accordions 10. FIG. 10A is an isometric view of mobile electronic device 1 with two docked speaker accessories 27, in one expanded mode for resting one edge of device 1 and one edge each of speaker accessory bodies 28 on a surface, such as a table top. This extension configuration is useful for holding the device in a near-vertical position without blocking speaker accessories 27.

Figure 10B:
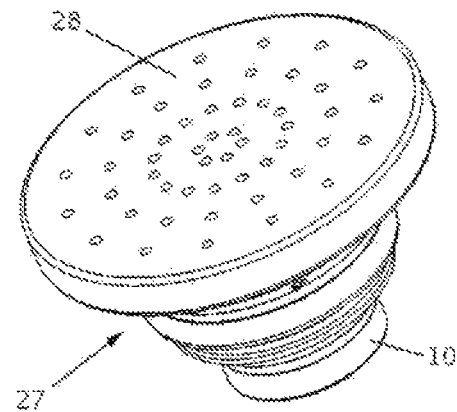
FIG. 10B is an isometric top view of one of the speaker accessories of FIG. 10A, in an embodiment.
Figure 10C:
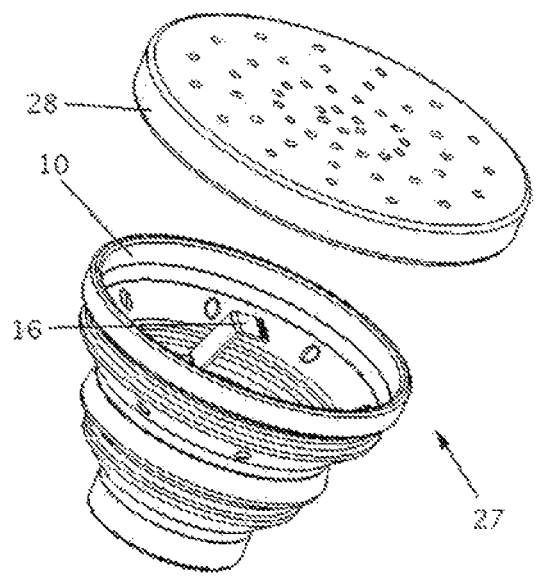
FIG. 10D shows an exploded, isometric, bottom view of the speaker accessory of FIG. 10A, in an embodiment.
Figure 10D:
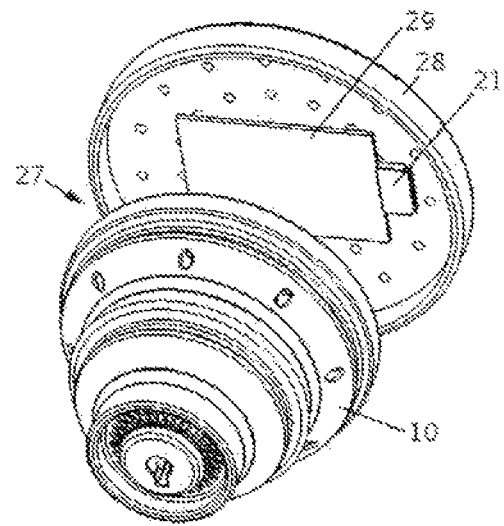

FIG. 10B shows an isometric top view of speaker accessory 27, comprising speaker accessory body 28 and accordion 10. FIG. 10C shows an isometric side exploded view of the speaker accessory 27 of FIG. 10B. Accordion flex circuit 16 can be seen within accordion 10, detached from speaker accessory body 28. FIG. 10D is an exploded, isometric, bottom view of speaker accessory 27. Speaker 29, which may be for example a piezoelectric speaker, connects to accessory connector 21. Accessory connector 21 connects to flex circuit 16 via port 25 as shown in FIG. 9. By way of example, given the device pin-out shown in Table 1, speaker 29 may use pins 1, 2, 4, and 5, which are Ground, Power Out, Data Positive, and Data Negative, respectively. With this pin-out arrangement, encoded data may be used for accessory detection. In another example, speaker 29 may use pins 1, 2, 6, 8, and 9, which are Ground, Power Out, Detection, left channel analog audio, and right channel analog audio, respectively. Those skilled in the art will appreciate that many other pin-out arrangements are possible, including arrangements for a self-powered speaker accessory, without departing from the scope herein.

In one embodiment, speaker accessory speaker 29 is a Murata VSLBF series speaker; size 0.5 mm thick, 13 mm wide, 19 mm long; frequency range 200 Hz to 20 kHz; sound pressure level 93.5 dB+/−3.0 dB; resonant frequency 1150 Hz+/−20%; capacitance 1.5 μF+/−30%; maximal sinusoidal voltage 5.0 Vrms; operating temperature range −20 to 70° C.

Figure 11A:
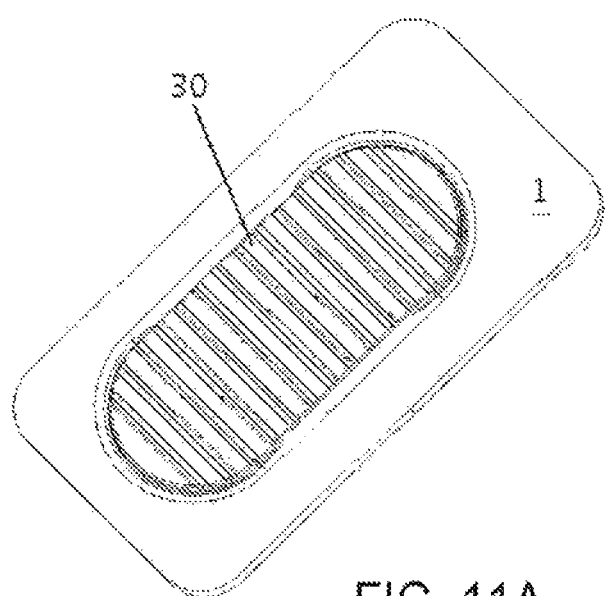
FIG. 11A shows an isometric view of the mobile electronic device with a docked solar charging accessory, according to one embodiment of the invention.
Figure 11B:
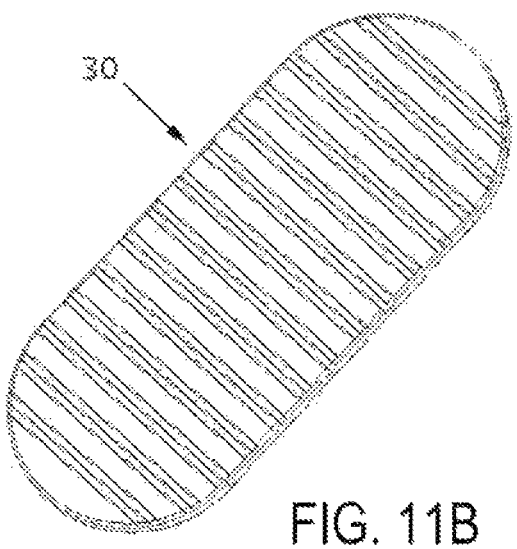
FIG. 11B shows an isometric top view of the solar charging accessory of FIG. 11A, in an embodiment.
Figure 11C:
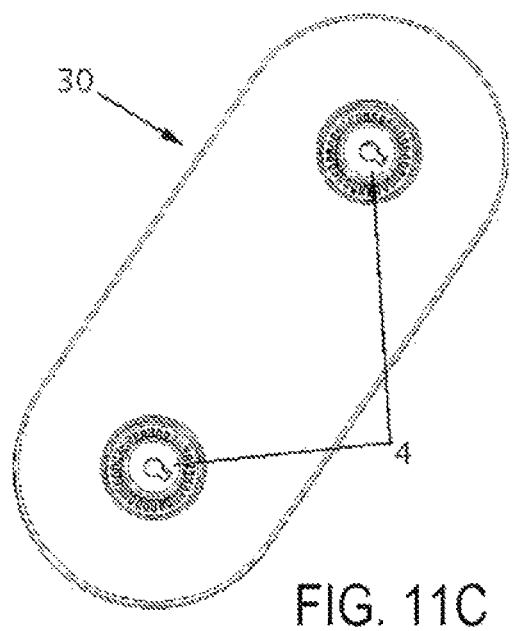
FIG. 11C shows an exploded, isometric, top view of the speaker accessory of FIG. 10A, in an embodiment.

FIGS. 11A-C show one embodiment of a solar charging accessory 30. FIG. 11A shows an isometric view of mobile electronic device 1 with docked solar charging accessory 30. FIG. 11B shows an isometric top view of solar charging accessory 30. FIG. 11C shows a bottom view of solar charging accessory 30. In this embodiment, docking connects are docking connectors 4 as shown in FIG. 2. As an alternative, docking connectors may be docking connectors 5 as shown in FIG. 3 or other arrangements described or not described herein. Taking the pin-out arrangement of Table 1 as an example, charging accessory 30 might connect to pins 1, 3, and 6, comprising Ground, Power in, and Detection/Configuration, respectively.

In one embodiment, solar charger accessory 30 is a custom monocrystalline silicon solar cell encapsulated in epoxy resin; 5.5V; 60 mA; maximum power (Pm) 0.33 W.

Figure 12A:
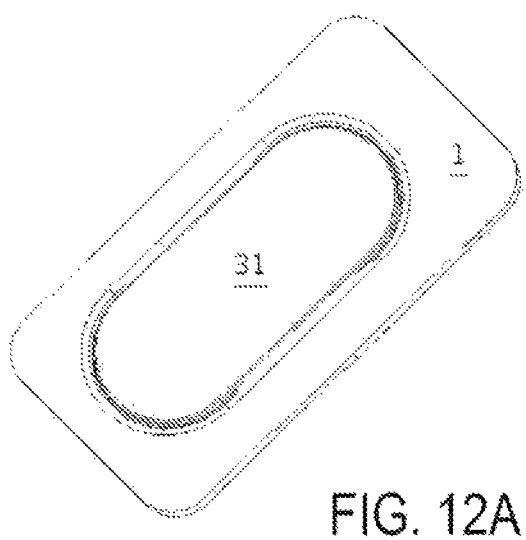
FIG. 12A shows an isometric back view of the mobile electronic device with a docked supplemental battery accessory, according to one embodiment of the invention, in an embodiment.
Figure 12B:
FIG. 12B shows a top view of the supplemental battery accessory of FIG. 12A, in an embodiment.
Figure 12C:
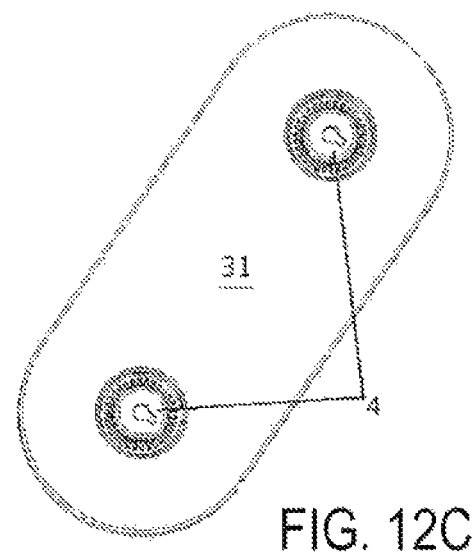
FIG. 12C shows a bottom view of the supplemental battery accessory of FIG. 12A, in an embodiment.

FIGS. 12A-C show one embodiment of a supplemental battery accessory 31. FIG. 12A shows an isometric view of mobile electronic device 1 with docked supplemental battery accessory 31. FIG. 12B shows a top view of supplemental battery accessory 31. FIG. 12C shows a bottom view of supplemental battery accessory 31. Similar to the solar charging accessory 30 of FIG. 11A-C, battery accessory 31 may use docking connectors 4, docking connectors 5 or some other docking connector described or not described herein. Again taking the pin-out arrangement of Table 1 as an example, supplemental battery accessory 31 might connect to pins 1, 3, and 6, comprising Ground, Power in, and Detection/Configuration, respectively.

As one embodiment, supplemental battery accessory 31 is a custom polymer Li-Ion, 3.7V, 800 mAh, 2.96 wh, UN approved.

Figure 13A:
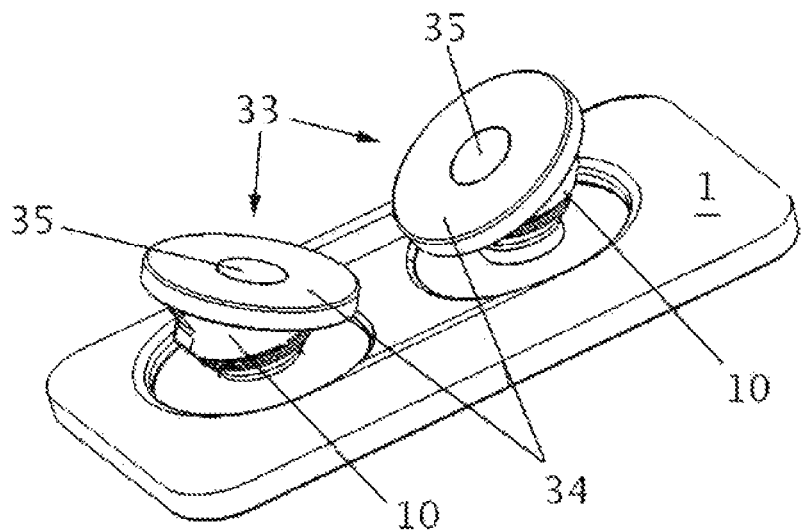
FIG. 13A shows an isometric back view of the mobile electronic device with two docked electrophysiology accessories in one of their partially collapsed states, according to one embodiment of the invention, in an embodiment.
Figure 13B:
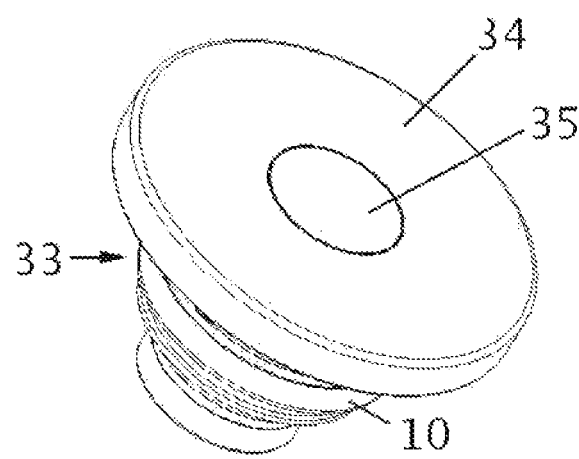
FIG. 13B shows an isometric top view of the electrophysiology sensor accessory of FIG. 13A, in an embodiment.
Figure 13C:
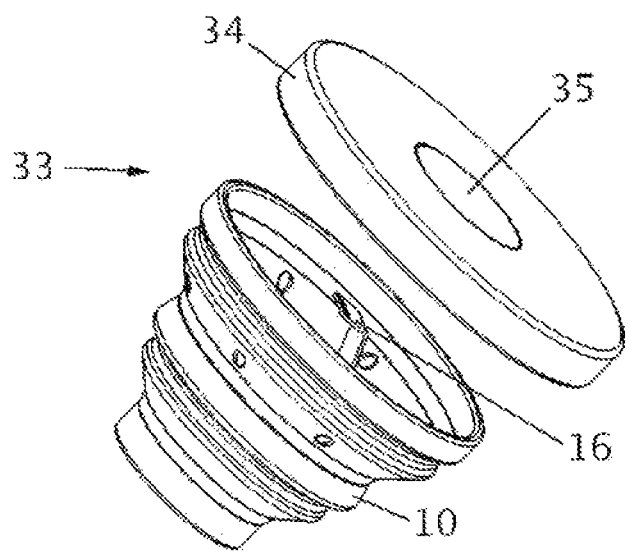
FIG. 13C shows an isometric exploded side view of the electrophysiology sensor accessory of FIG. 13A, in an embodiment.

FIGS. 13A-C shows one embodiment of a set of electrophysiology sensor accessories used in conjunction with accordions 10. In a separate embodiment, electrophysiology sensor accessories may be used with a docking accessory similar to docking accessory 6 of FIGS. 4-5. FIG. 13A is an isometric view of mobile electronic device 1 with two docked electrophysiology sensor accessories 33, in one expanded mode. This extension configuration is useful, for example, for maintaining good sensor contact when the sensors are held against a person's skin, such as the varying curvatures of the chest, for gathering electrophysiological data.

FIG. 13B shows an isometric top view of electrophysiology sensor accessory 33 with fully expanded accordion 10.

FIG. 13C shows an exploded, isometric, side view of electrophysiology sensor accessory 33 with fully expanded accordion 10. Accordion flex circuit 16 can be seen within accordion 10, detached from electrophysiology sensor accessory body 34. Electrophysiology sensor electrode 35 connects to accessory connector 21 (shown in FIG. 9C), which will connect to flex circuit 16 via port 25 as shown in FIG. 9. In one embodiment which uses the device pin-out shown in Table 1, electrophysiology sensor 33 might use pins 1, 2, 4, and 5, comprising Ground, Power Out, Data Positive, and Data Negative, respectively, in conjunction with accessory-mounted isolation or other safety components. Under this pin-out arrangement, encoded data may be used for accessory identification. Those skilled in the art will appreciate that many other pin-out arrangements are possible, including arrangements for a self-powered electrophysiology sensor accessory.

In one embodiment, electrophysiology sensor accessory 33 is an electrocardiograph (ECG) sensor consisting of a silver chloride electrode, analog front end, digital-to-analog converter, microprocessor, and USB controller.

Figure 14A:
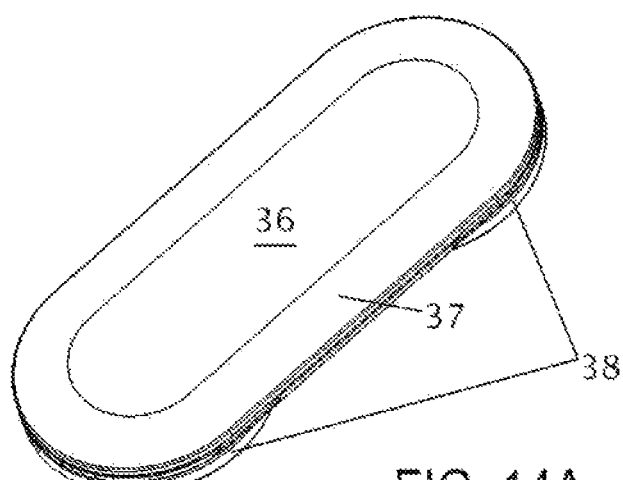
FIG. 14A shows an isometric top view of a game controller accessory in its closed state, according to one embodiment of the invention, in an embodiment.
Figure 14B:
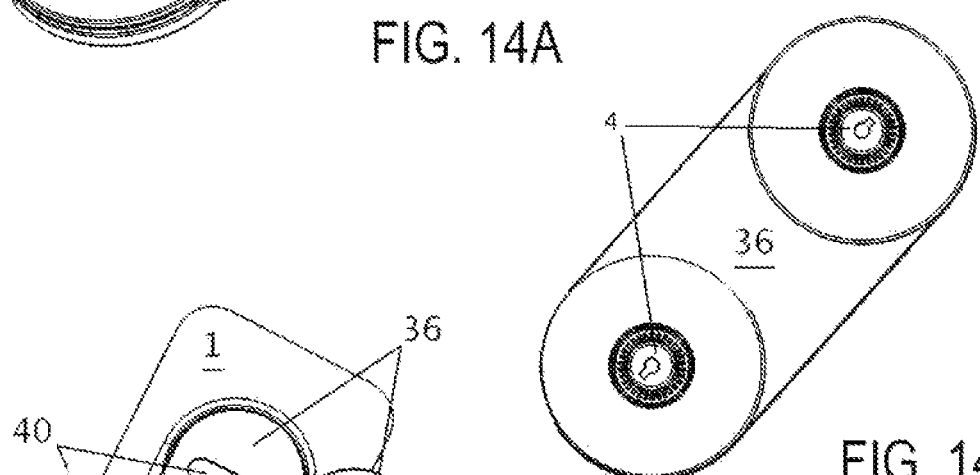
FIG. 14B shows a bottom view of the game controller accessory of FIG. 14A.

FIGS. 14A-D show one embodiment of a game controller accessory 36. FIG. 14A shows an isometric top view of game controller accessory 36 in its closed state. FIG. 14B shows a bottom view of game controller accessory 36 of FIG. 14A. Similar to the solar charging accessory 30 of FIG. 11A-C, game controller accessory 36 may use docking connectors 4, docking connectors 5, or some other docking connector described or not described herein.

Figure 14C:
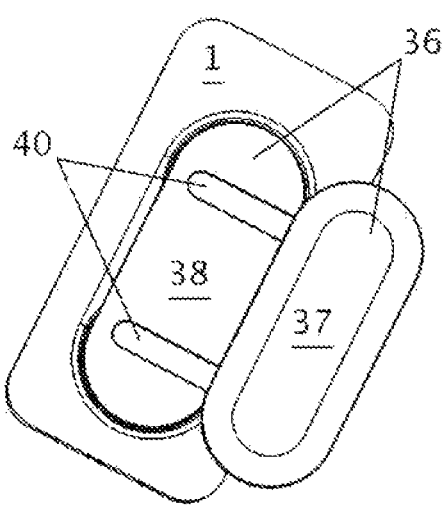
FIG. 14C shows a back view of the mobile electronic device with the game controller accessory of FIG. 14A docked in a partially open state, in an embodiment.

FIG. 14C shows a back view of mobile electronic device 1 with docked game controller accessory 36 in one of its partially open states. Game controller base tracks 40 provide functionality for game controller accessory sliding control panel 37 to slide into open states, as shown in FIG. 14C-D.

Figure 14D:
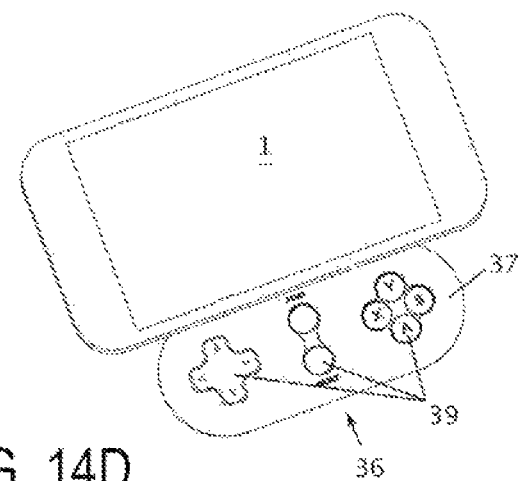
FIG. 14D shows a front view of the mobile electronic device with the game controller accessory of FIG. 14A docked in its open state, in an embodiment.

FIG. 14D shows a front view of mobile electronic device 1 with docked game controller accessory 36 in its fully open state. This state is convenient for holding the mobile electronic device 1 while operating the game controller accessory buttons 39. This also removes controls from the provided screen, such that full screen may be used for visual interaction with a game without losing valuable screen space to controls. In one embodiment, given the device pin-out shown in Table 1, game controller accessory 36 might use pins 1, 2, 4, and 5, comprising Ground, Power Out, Data Positive, and Data Negative, respectively. Under this pin-out arrangement, encoded data may be used for accessory identification. Those skilled in the art will appreciate that many other pin-out arrangements are possible.

As an example, game controller accessory 36 is a thumb-operated keypad consisting of a mechanical-slide subassembly, user interface switches, a microcontroller, and a USB controller.

It will be appreciated that the embodiments disclosed above describe multiple levels of cooperation between docking connectors, for example docking connectors 4 and 5, and docking accessories. Some docking accessories are configured operate independently, whiles other accessories cooperate, for example a camera accessory and a camera flash accessory, left and right stereo speakers accessories 27, and electrophysiology sensor 33, while still others are formed as a single accessory that utilizes two or more docking connectors, for example solar charging accessory 30, battery accessory 31, and game controller 36. Functionality for recognizing, facilitating, and otherwise providing these multiple levels of cooperation between docking accessories and docking connectors is also provided herein.

FIG. 15A shows an isometric view of a generic docking system, which includes a generic docking accessory 61 and mobile electronic device 71, similar to mobile electronic device 1. Device 71 is formed with docking platform having a generic docking accessory cavity 41 and docking connection system 49. Docking accessory 61 may be, for example, a battery, breathalyzer, massage paddle, LED light, camera flash, radio-frequency identification (RFID) tag, RFID reader, hand crank charger, hand pump charger, game controller, laser level, laser water purifier, scent generator, self-defense taser, lie detector device, credit card reader, robotic foot, a display such as a low-energy display, thermometer, power adaptor, halitosis detector, hygrometer, digital scale, anemometer, water analysis tool, altimeter, barometer, wireless headset, mechanical keyboard, optical projection keyboard, proximity sensor, projector, remote control, memory card, headphones connector, accelerometer, pedometer, 3D motion tracking device, security perimeter, electrophysiology sensor, biofeedback device, diagnostic ultrasound device, therapeutic ultrasound, defibrillator, blood glucose monitor, pulse oximeter, finger print ID, laptop data lock, speaker, solar panel, walkie talkie, laser hair removal device, laser hair stimulator, or UV disinfector. The docking platform of device 71 is formed such that it may accept more than one docking accessory with the generic docking accessory cavity 41, as can be seen by viewing both FIGS. 15A and 15B.

FIG. 15B shows an isometric view of the mobile electronic device 71 of FIG. 15A with isometric views of at least six embodiments of docking platform 2 radiating outward from device 71, it will be appreciated that views shown in FIGS. 15A-B may be isometric front view or isometric back views. Clockwise from the upper left corner of FIG. 15B, an embodiment 300 of docking platform 2 is the platform of FIG. 2, with Detail A view of docking connector 4.

An embodiment 302 of docking platform 2, center top of FIG. 15B, is the platform of FIG. 3, with Detail B view of docking connector 5.

An embodiment 304 of docking platform 2, top right of FIG. 15B, includes oval docking accessory cavity 51 and two docking connectors 52, each formed at one of the centers of the two circular ends of oval accessory cavity 51. Detail C is a detailed view of docking connector 52, connector 52 comprising annular connector cavity 53, cavity 53 further comprising a set of ten docking connector electrical contacts 19, this set of ten contacts comprising two duplicate sets of five electrical contacts 19, this pair of duplicate sets of contacts, together with two female aligning elements 54, enable attached docking accessories to be oriented in either of two positions separated by 180 degrees of rotation, connector 52 further comprising annular magnetic attachment system 55, attachment system 55 comprising a disc-shaped magnetic element formed beneath the surface of connector 52 to enable compatible docking accessories to form detachable magnetic attachments to connector 52.

An embodiment 306 of docking platform 2, bottom right of FIG. 15B, includes oval docking accessory cavity 51 and docking connector 58, connector 58 comprising magnetic attachment system 59, magnetic system 59 comprising a single elongated magnetic element formed beneath the bottom face of accessory cavity 51 to enable docking connector 58 to form a detachable attachment to multiple independent docking accessories, the docking accessories operable to wirelessly transmit and/or receive at least one of data or power with mobile device 1. Note that docking connector 50 includes no electrical contacts. Also, it will be understood that although magnetic attachment system 59 is shown as a single elongated attached system, more than one magnetic attachment system may be used and different shaped attachment systems may be used without departing from the scope herein.

An embodiment 308 of docking platform 2, bottom center of FIG. 15B, includes hourglass docking accessory cavity 60 and two docking connectors 56, connectors 56 each comprising fixed tab 62, spring tab 57, and docking connector electrical contacts 19. Detail D is a detailed view of spring tab 57 and five electrical contacts 19. Docking connector 56 is operable to form a detachable attachment to compatible docking accessories that are wedged between fixed tab 62 and spring tab 57. To release the docking accessories, spring tab 57 slides in the direction opposite the docking accessory.

An embodiment 310 of docking platform 2, bottom left of FIG. 15B, includes oval docking accessory cavity 51 and docking connector 42. Detail E is a detailed view of docking connector 42, connector 42 comprising eight docking connector cavities 43, nine electrical contacts 19, one female aligning element 44, docking connector magnetic attachment system 50, attachment system 50 comprising a single annular magnetic element formed beneath the surface of accessory cavity 51, for forming detachable attachments with compatible docking accessories.

FIG. 16 shows an isometric view of one embodiment of the present invention implemented with a tablet device 32. In this embodiment, tablet device 32 is shown with one attached generic expanding docking accessory, similar to attached generic expanding docking accessory 8. In one embodiment, the expanding docking accessory body measures roughly five inches in diameter, with an expanding docking accessory accordion that expands roughly three inches away from the backside of tablet device 32. Tablet device 32 may be configured with any and all above described docking platforms, docking connectors, docking accessories, etc. without departing from the scope herein. The size, shape, and number of docking connectors, docking platforms, docking cavities, docking accessories, etc. may vary without departing form the scope herein.

Flush Mounted-Accessory Embodiments

Figure 17:
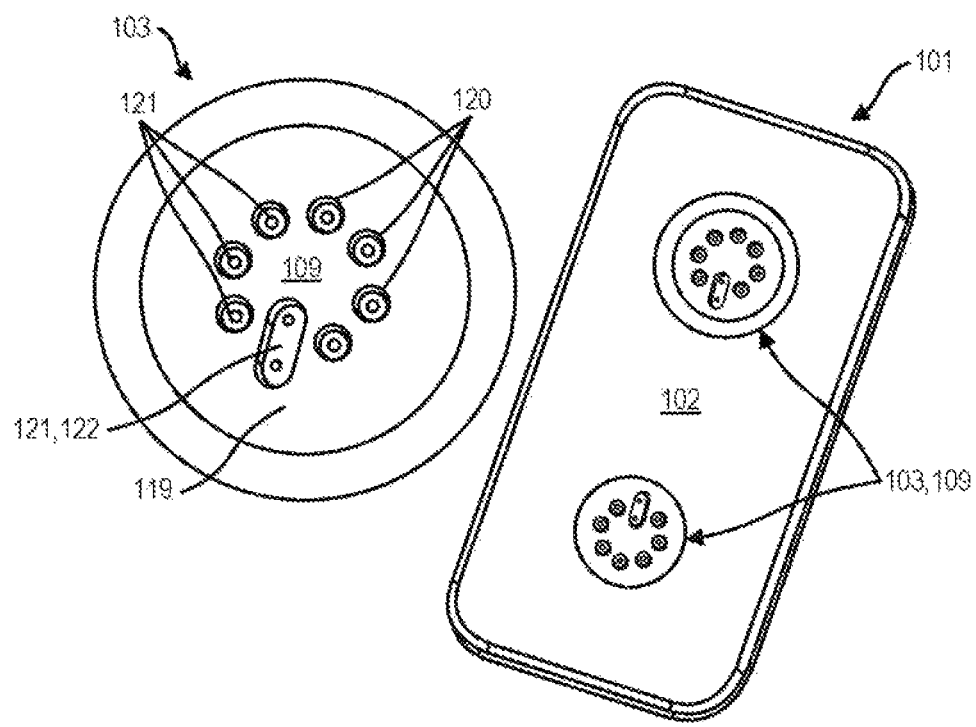
FIG. 17 shows a back view of a mobile electronic device with a flush docking platform, according to at least one embodiment.

FIG. 17 shows a back view of a mobile electronic device 101 with a docking platform 102 according to an embodiment. Illustratively represented in a detailed view is a docking connection system 103 formed of docking connector 109, docking connector contact cavity 120, docking connector electrical contacts 121, female alignment key 12, and docking connector disc-shaped magnetic elements 119. Docking platform 102 is similar to docking platform 2, with the exception that docking platform 102 is configured for flush mounting an accessory to the back surface of the docking platform 102 rather than docking an accessory within a recessed cavity, like recessed accessory cavity 3 of docking platform 2.

Figure 18A:
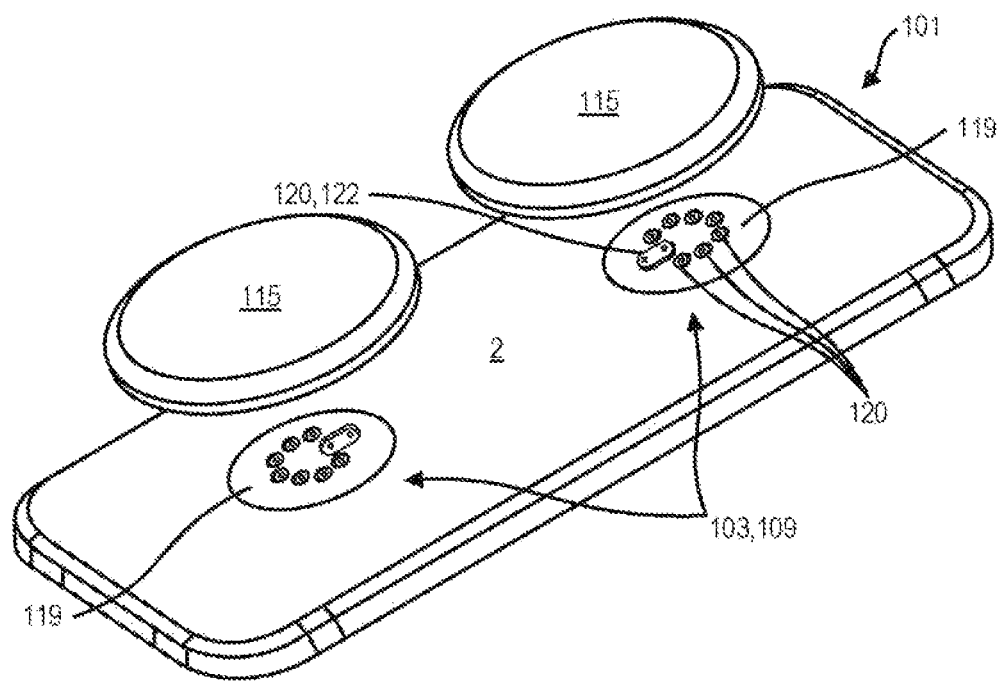
FIG. 18A shows an isometric view of the mobile electronic device with docking platform of FIG. 17, in an embodiment.

FIG. 18A shows an isometric view of the mobile electronic device 101 with the flush mounting accessory docking platform 102 of FIG. 17. FIG. 18A shows two unattached, round, generic docking accessories 115.

Figure 18B:
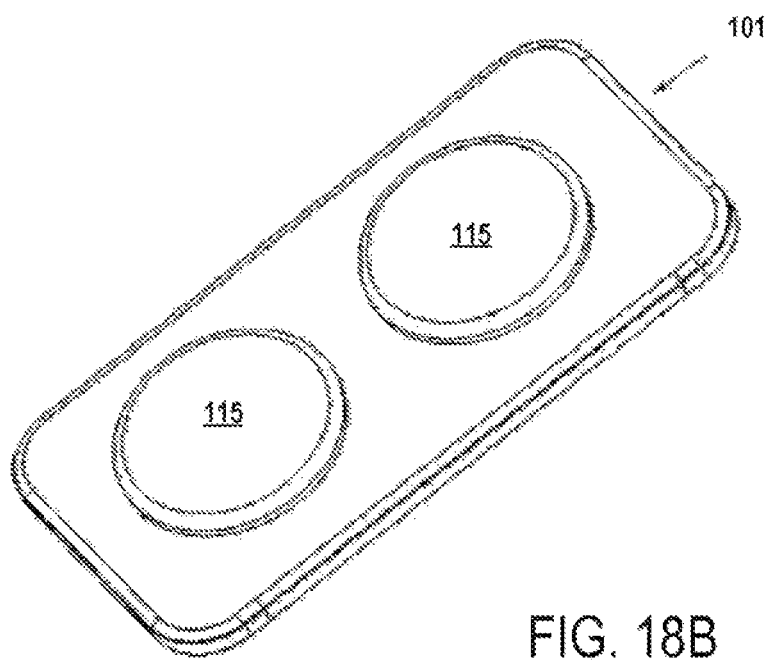
FIG. 18B shows an isometric view of the mobile electronic device with docking platform of FIG. 17 with two basic generic docking accessories of FIG. 18A attached to the docking connectors of the docking platform.

FIG. 18B shows an isometric view of the mobile electronic device 101 with docking platform 102 of FIG. 17 with two basic generic docking accessories 115 attached to the docking connectors of the docking platform 102.

Figure 18C:
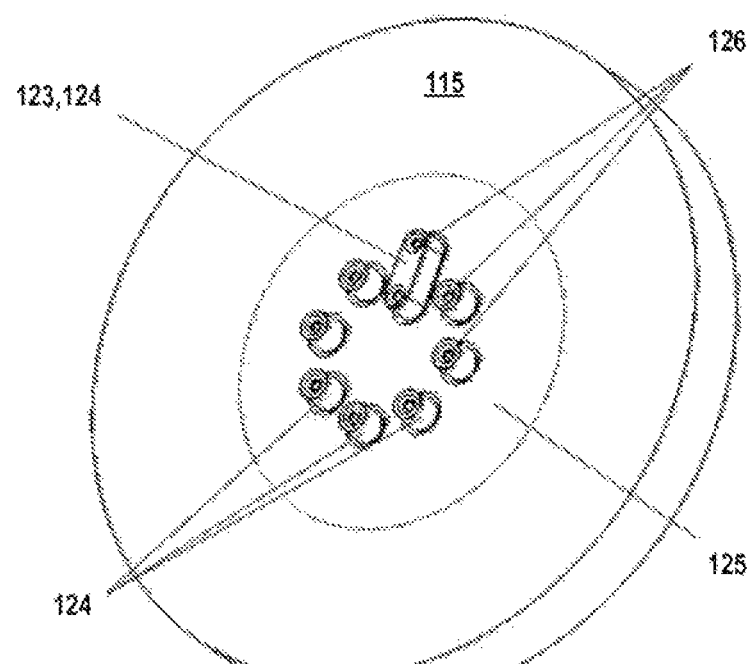
FIG. 18C shows an isometric bottom view of one of the basic generic docking accessories of FIG. 18A.

FIG. 18C shows an isometric bottom view of one of generic docking accessories 115 of FIG. 18A, 18B. Generic docking accessory 115 is configured with a male alignment element 123, contact insulators 124, a disc-shaped magnetic element 125, and a plurality of electrical contacts 126. Docking accessory 115 is similar to docking accessory 6, with the exception that docking accessory 6 is configured for flush mounting to the back surface of the docking platform 102 rather than docking within a recessed cavity, like recessed accessory cavity 3 of docking platform 2.

Figure 19A:
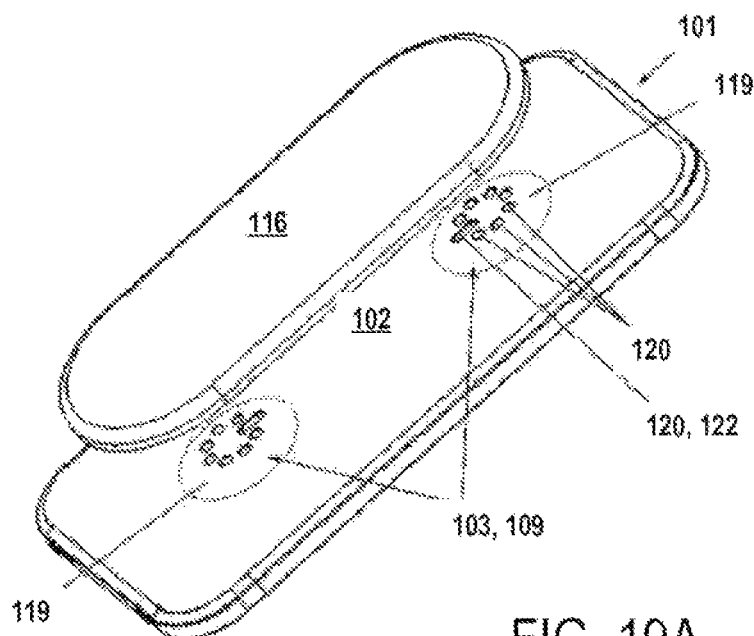
FIG. 19A shows an isometric view of the mobile electronic device with docking platform of FIG. 17 with one, oval, basic generic docking accessory.

FIG. 19A shows an isometric view of the mobile electronic device 101 configured with docking platform 102 of FIG. 17. FIG. 19A also shows one, oval, generic docking accessory 116 aligned with, but not connected to, docking platform 102. Accessory 116 is one alternate embodiment of a docking accessory compared to the two round docking accessories of FIG. 18A. Docking accessory 116 may configured to physically, magnetically, electrically, and/or electronically couple with two docking connectors 109. It will be appreciated that other docking accessories may be formed to couple with more than two docking connectors.

Figure 19B:
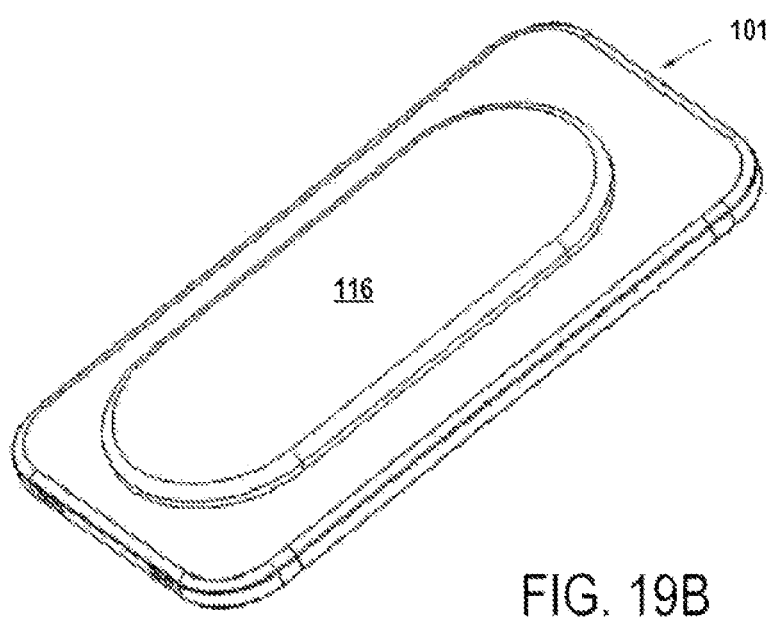
FIG. 19B is an isometric view of the mobile electronic device with docking platform of FIG. 17 with the oval generic docking accessory of FIG. 19A attached to the docking connectors of the docking platform.

FIG. 19B shows an isometric view of the mobile electronic device 101 with docking platform 102 of FIG. 17. FIG. 19B shows the oval generic docking accessory 116 coupled to the docking connectors 109 of the docking platform 102.

Figure 19C:
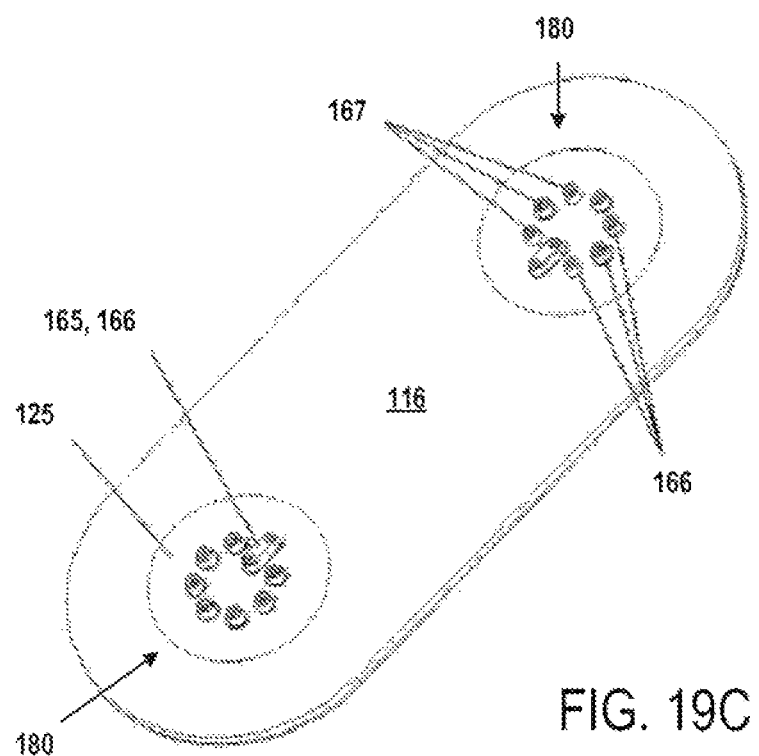
FIG. 19C shows an isometric bottom view of the oval generic docking accessory of FIG. 19A.

FIG. 19C shows an isometric bottom view of the oval generic docking accessory 116 of FIG. 19A. Docking accessory 116 is formed with two docking accessory connectors 180. Each connector supports a male aligning element 165, contact insulator 166, electrical contacts 167, and disc-shaped element 125.

Figure 20A:
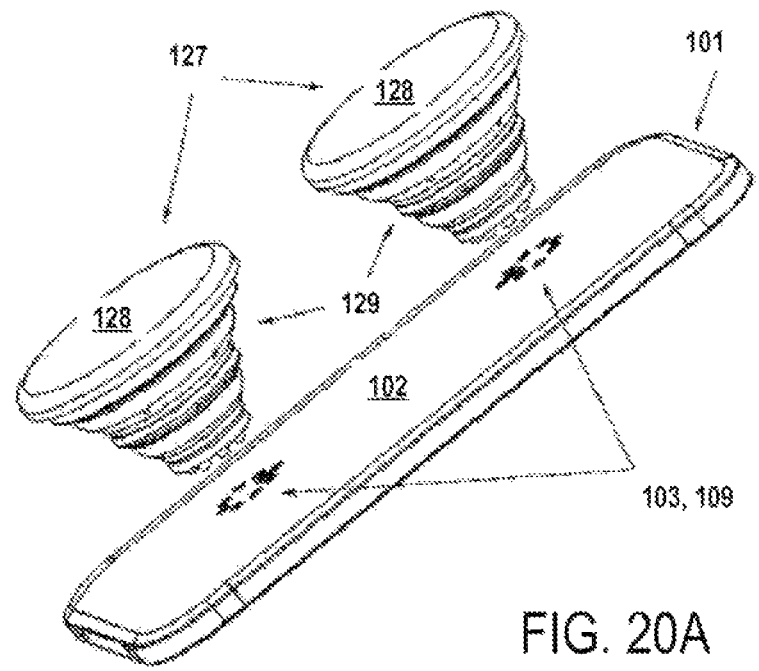
FIG. 20A shows an isometric view of the mobile electronic device with docking platform of FIG. 17 with two unattached expandable generic docking accessories in an expanded state.

FIG. 20A shows an isometric view of the mobile electronic device 101 with docking platform 102 of FIG. 17 with two unattached expandable generic docking accessories 127 in an expanded state.

Figure 20B:
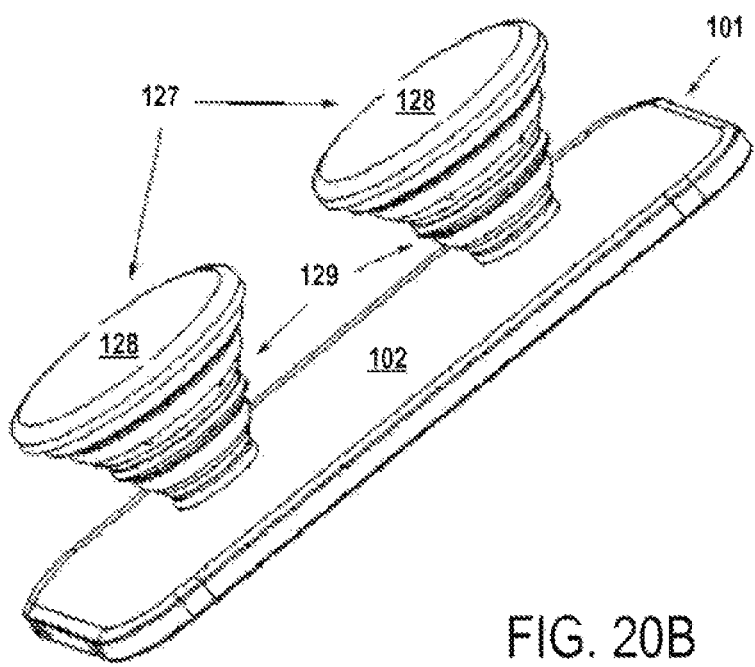
FIG. 20B shows an isometric view of the mobile electronic device with docking platform of FIG. 17 with the two expandable generic docking accessories from FIG. 20A attached to the docking connectors of the docking platform, in an expanded state.

FIG. 20B shows an isometric view of the mobile electronic device 101 with docking platform 102 of FIG. 17 with expandable generic docking accessories 127 from FIG. 20A attached to the docking connectors 109 of docking platform 102, in an expanded state.

Figure 20C:
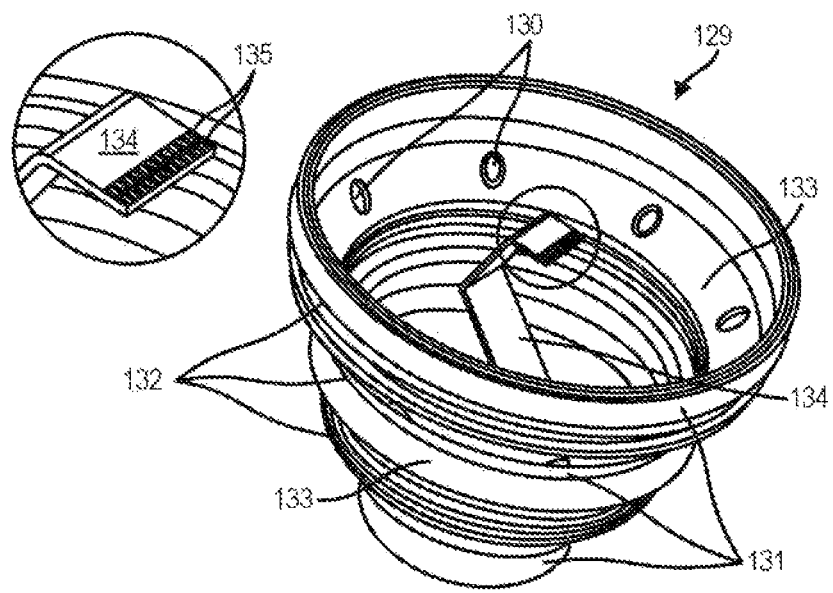
FIG. 20C shows an isometric top view of one of the expandable generic docking accessory accordions of FIG. 20A, with a detailed view of the accordion flex circuit male connector, in an embodiment.

FIG. 20C shows an isometric top view of one of the expandable generic docking accessory accordions 129 of FIG. 20A, with a detailed view of the accordion flex circuit 134's male connector 135.

Figure 20D:
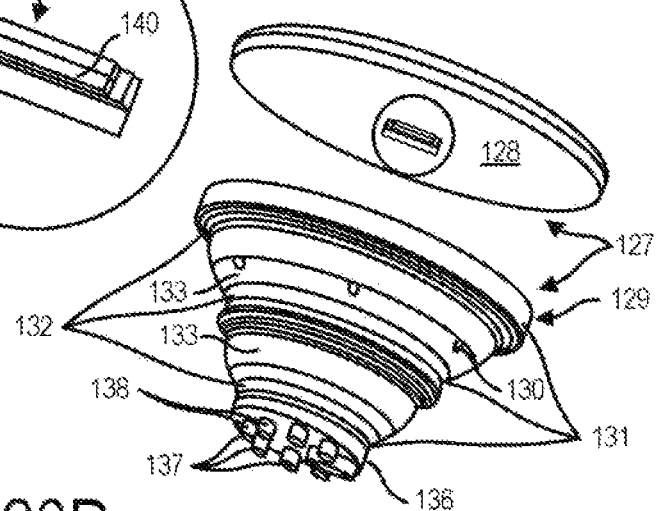
FIG. 20D shows an exploded, isometric, bottom view of one of the expandable generic docking accessories of 20A, in an embodiment.

FIG. 20D shows an exploded, isometric, bottom view of one of the expandable generic docking accessories 127 of FIG. 20A, with a detailed view of an expandable generic docking accessory body female connector 139. The expandable generic docking accessory body female connector 139, which is similar to the expandable generic docking accessory body female connector 21, supports a connector port 140, similar to connector port 25.

Figure 20E:
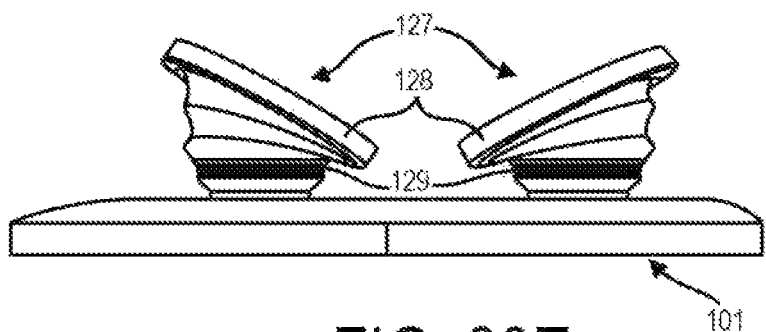
FIG. 20E shows a side view of the mobile electronic device with a docking platform of FIG. 2 with attached expandable docking accessories in one partially collapsed state, in an embodiment.

FIG. 20E shows a side view of the mobile electronic device 101 with a docking platform 102 of FIG. 2 with attached expandable docking accessories 127 in one partially collapsed state, wherein bodies 128 of the docking accessories 127 are rotated at oblique angles to the back surface of the mobile device 101 by differential extension/collapse of accessory accordions 129.

Figure 21:
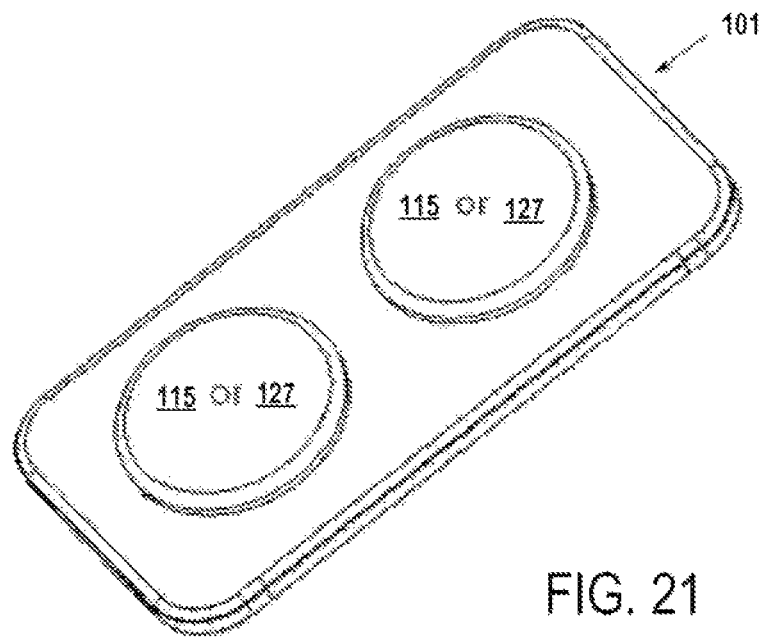
FIG. 21 shows an isometric view of the mobile electronic device with a docking platform of FIG. 17 with attached generic docking accessories that represent either basic accessories or expandable accessories in their collapsed states.

FIG. 21 shows an isometric view of the mobile electronic device 101 with a docking platform 102 of FIG. 2 with attached generic docking accessories that may be either basic accessories 115 or expandable accessories 127 in a collapsed state.

Figure 22:
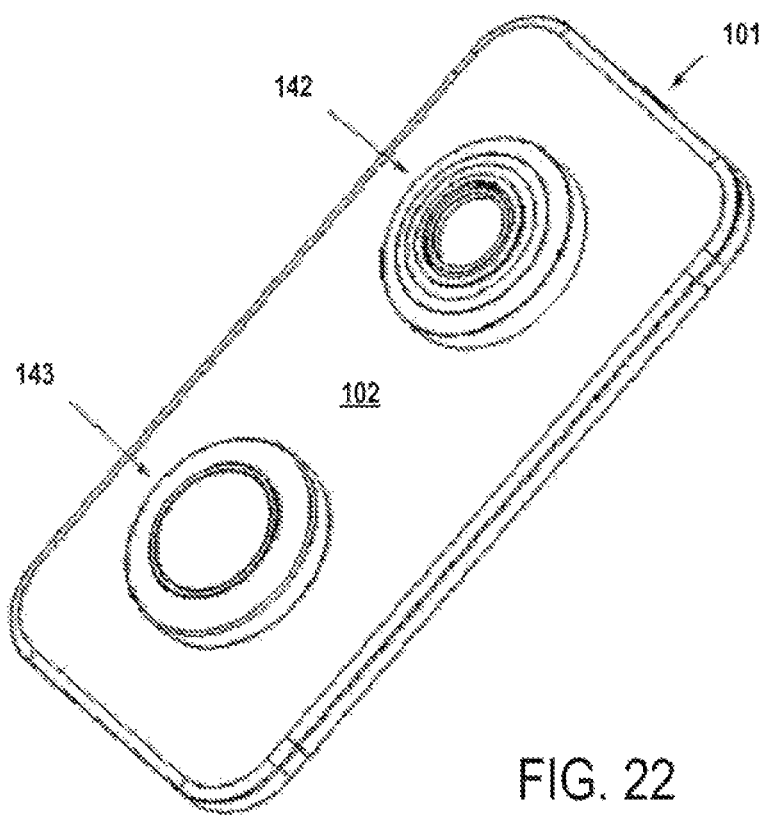
FIG. 22 shows an isometric view of the mobile electronic device with a docking platform of FIG. 17 with a supplemental lens accessory and a supplemental flash accessory, according to one embodiment of the invention.

FIG. 22 shows an isometric view of the mobile electronic device 101 with a docking platform 102 of FIG. 2 with a supplemental lens accessory 142 and a supplemental flash accessory 143, according to one embodiment of the invention, attached to the docking connectors 109 of the docking platform 102.

Figure 23:
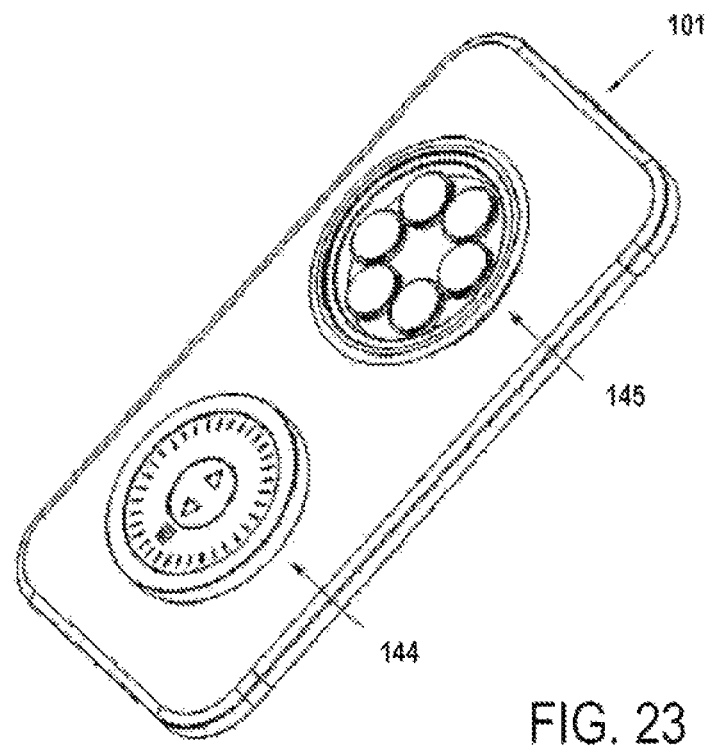
FIG. 23 shows an isometric view of the mobile electronic device with a docking platform of FIG. 17 with an LED light accessory and a thermometer-hygrometer-barometer accessory, according to one embodiment of the invention.

FIG. 23 shows an isometric view of the mobile electronic device 101 with a docking platform 102 of FIG. 2 with an LED light accessory 145 and a thermometer-hygrometer-barometer accessory 144, according to one embodiment of the invention, attached to the docking connectors 109 of the docking platform 102.

Figure 24:
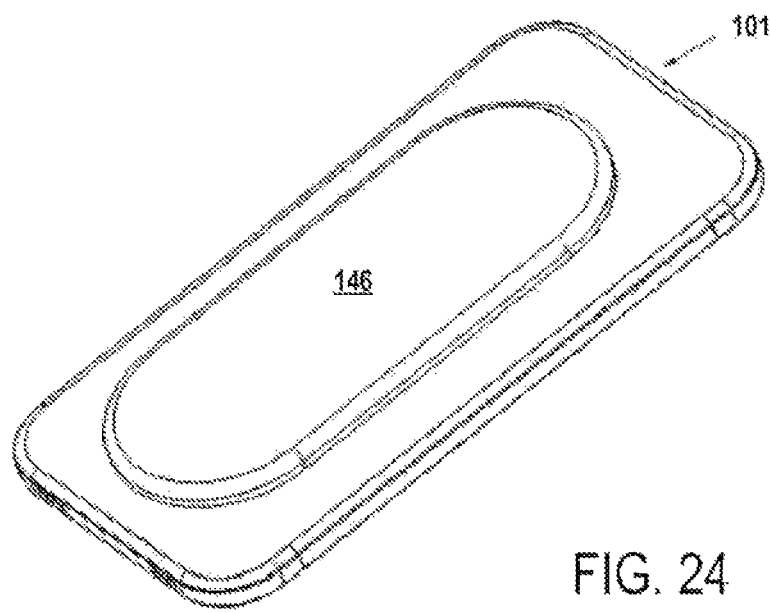
FIG. 24 shows an isometric view of the mobile electronic device with a docking platform of FIG. 17 with a supplemental battery accessory, according to one embodiment of the invention.

FIG. 24 shows an isometric view of the mobile electronic device 101 with a docking platform 102 of FIG. 2 with a supplemental battery accessory 146, according to one embodiment of the invention, attached to the docking connectors 10 of the docking platform 102.

Figure 25:
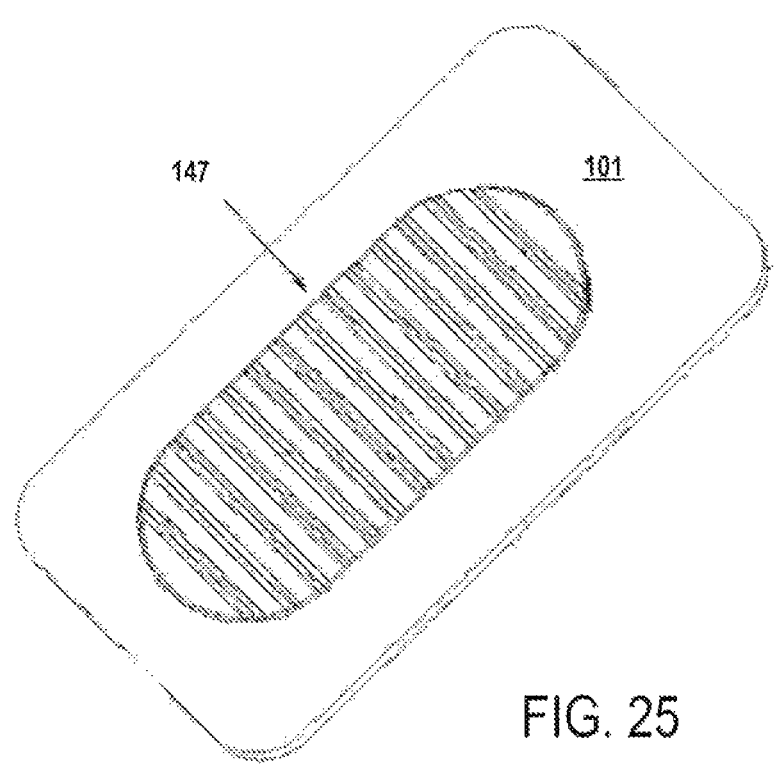
FIG. 25 shows an isometric view of the mobile electronic device with a solar charger accessory attached to the docking connectors of the docking platform, in an embodiment.

FIG. 25 shows an isometric view of the mobile electronic device 101 with a solar charger accessory 147 attached to the docking connectors 109 of the docking platform 102.

Figure 26A:
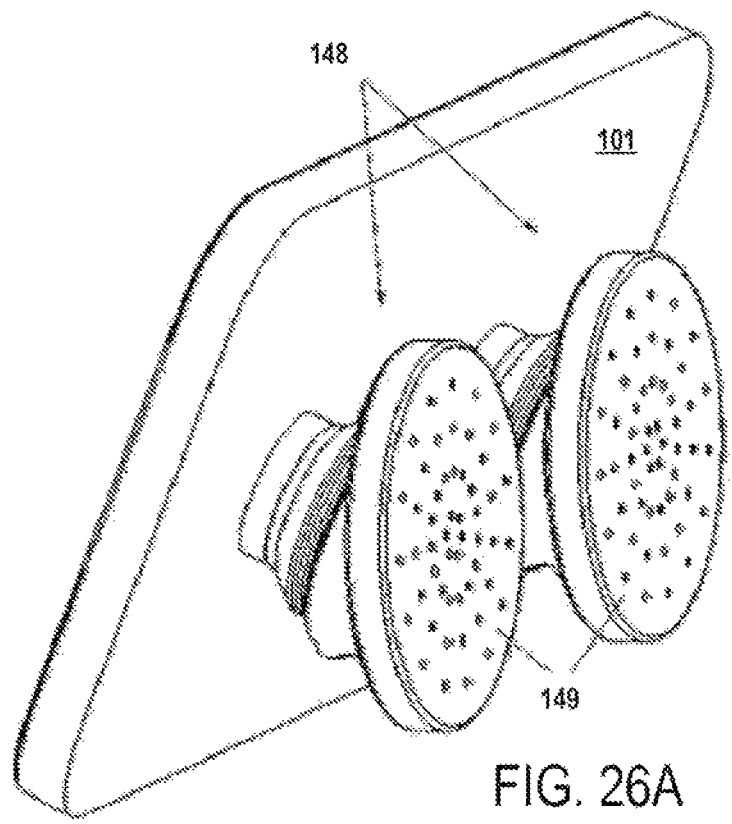
FIG. 26A shows an isometric view of the mobile electronic device with two docked speaker accessories, according to one embodiment of the invention.

FIG. 26A shows an isometric view of the mobile electronic device 101 with two docked speaker accessories 148, according to one embodiment of the invention, in partially expanded modes. Accessory speakers 148 are shown with speaker accessory bodies 149.

Figure 26B:
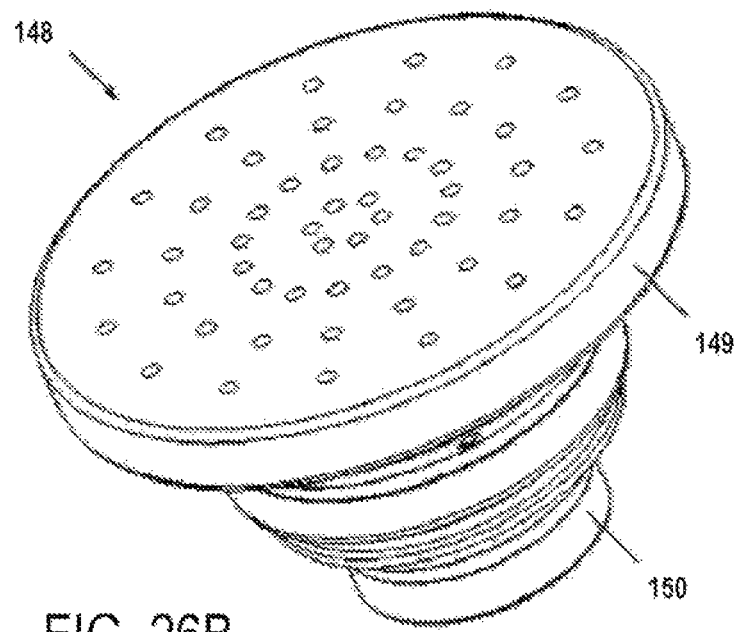
FIG. 26B shows an isometric top view of the speaker accessory of FIG. 26A.

FIG. 26B shows an isometric top view of speaker accessory 148 of FIG. 26A. Accessory speakers 148 are shown with speaker accessory bodies 149 and speaker accessory accordions 150.

Figure 26C:
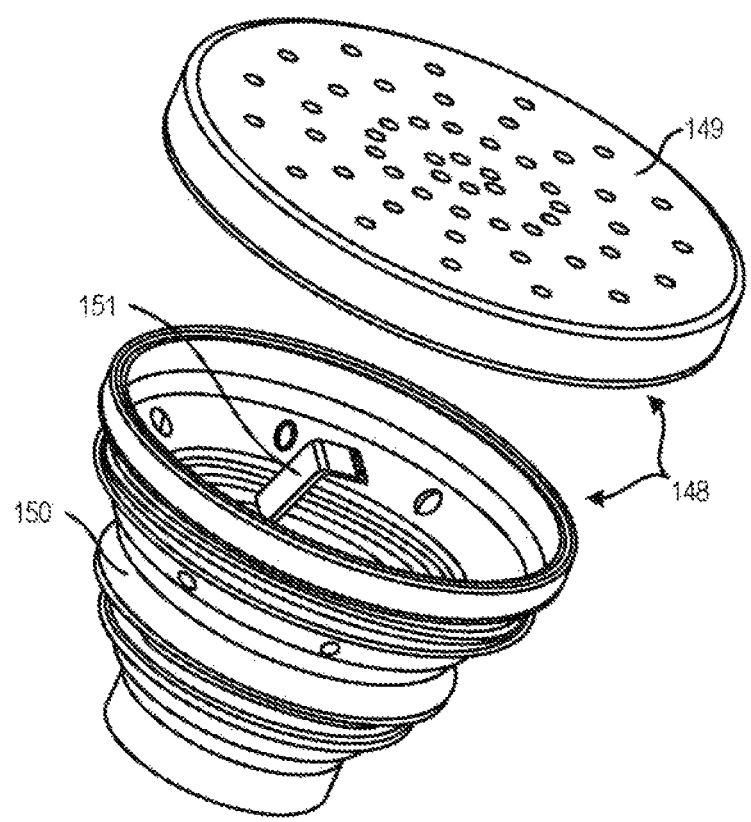
FIG. 26C shows an exploded, isometric, top view of the speaker accessory of FIG. 26A.

FIG. 26C shows an exploded, isometric, top view of speaker accessory 148 of FIG. 26A. Speaker flex circuit 151 is disposed within accordion 150 and, when assembled, is connected to a speaker accessory piezoelectric speaker 152 via connector port 169 of female connector 168, FIG. 26D. Other speakers may be used without departing from the scope herein.

Figure 26D:
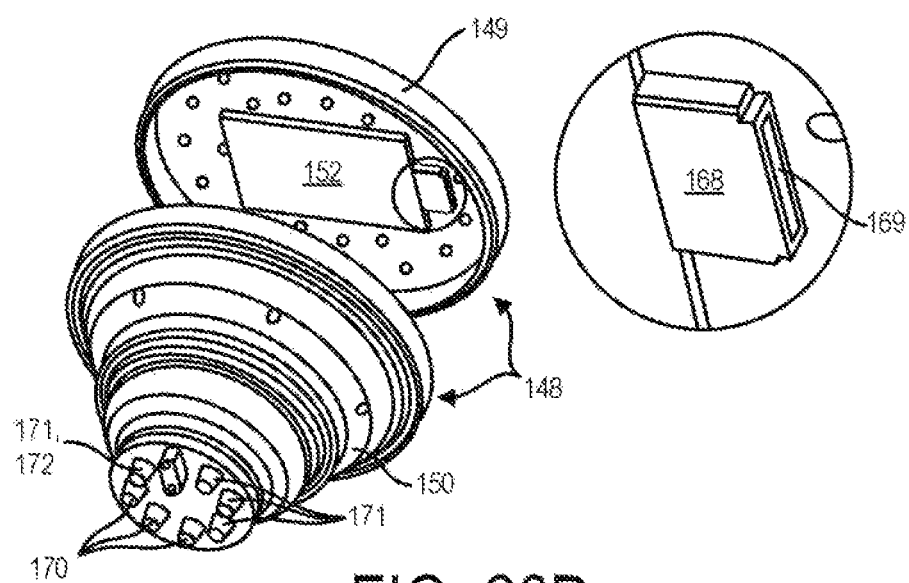
FIG. 26D shows an exploded, isometric, bottom view of the speaker accessory of FIG. 26A.

FIG. 26D shows an exploded, isometric, bottom view of the speaker accessory 148 of FIG. 26A. Speaker 148 is shown with speaker accessory piezoelectric speaker 152, connector port 169, female connector 168, speaker contacts 170, contact insulator 171, and a male alignment element 172.

Figure 26E:
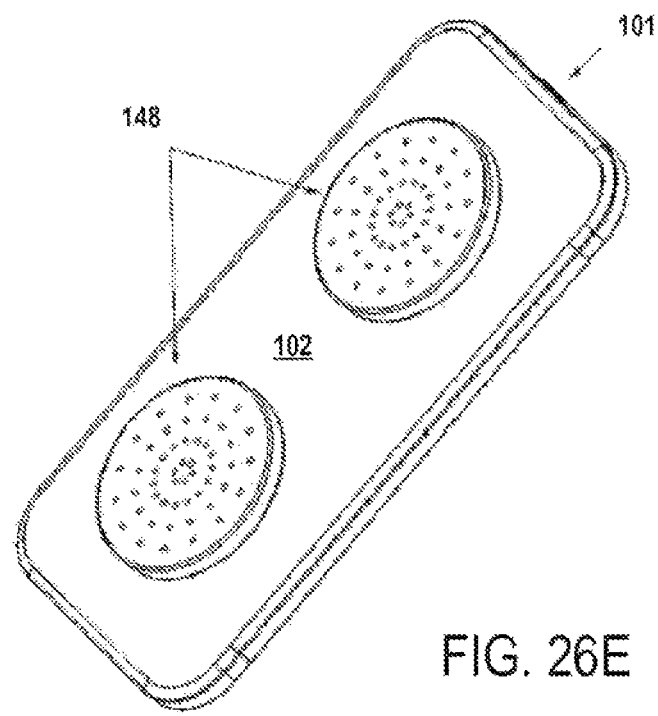
FIG. 26E shows an isometric view of the mobile electronic device with the two docked speaker accessories of FIG. 26A in their collapsed modes.

FIG. 26E shows an isometric view of the mobile electronic device 101 with the two docked speaker accessories 148 of FIG. 26A in a collapsed mode.

Figure 27A:
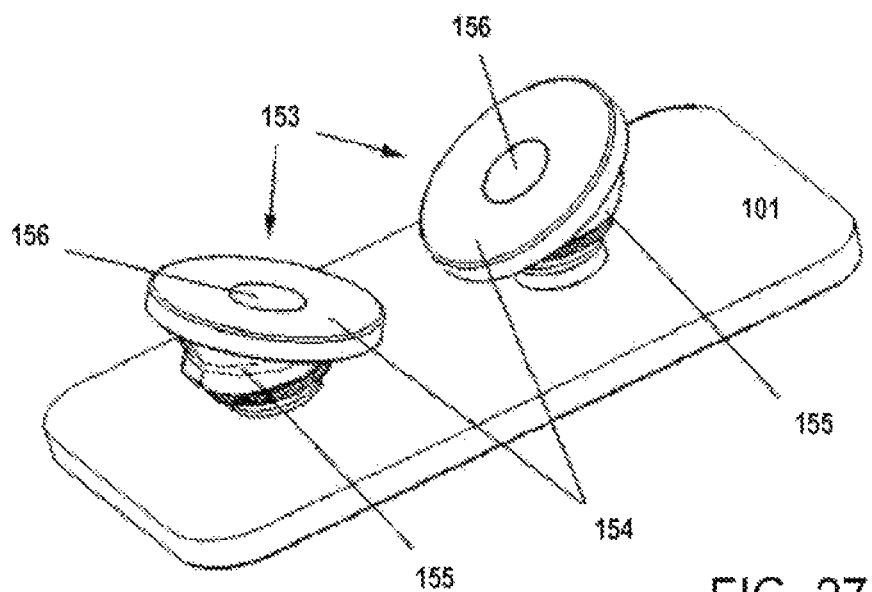
FIG. 27A shows an isometric view of the mobile electronic device with two docked electrophysiology-sensor accessories, according to one embodiment of the invention.

FIG. 27A shows an isometric view of the mobile electronic device 101 with two docked electrophysiology-sensor accessories 153, according to one embodiment of the invention, in partially expanded modes. Electrophysiology-sensor accessories 153 are formed with an electrophysiology sensor accessory body 154, an electrophysiology sensor accessory accordion 155, and an electrophysiology sensor accessory electrode.

Figure 27B:
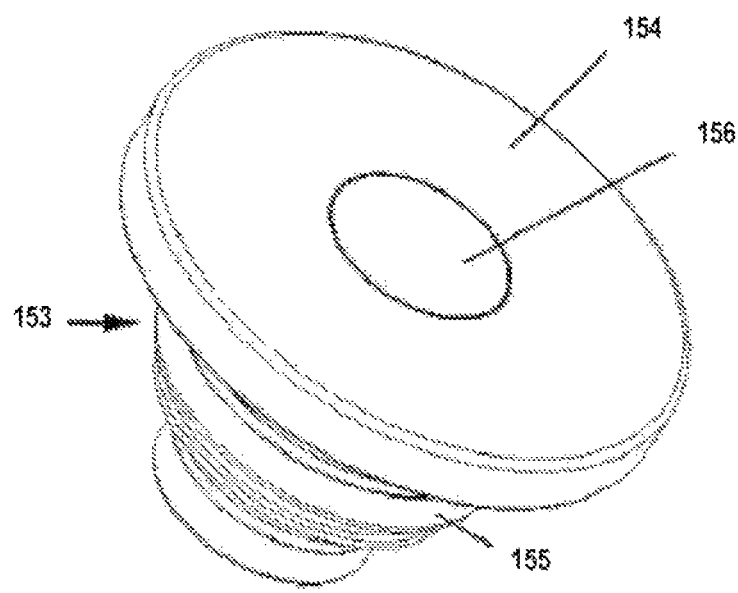
FIG. 27B shows an isometric top view of the electrophysiology-sensor accessory of FIG. 27A.

FIG. 27B shows an isometric top view of the electrophysiology-sensor accessory 153 of FIG. 27A.

Figure 27C:
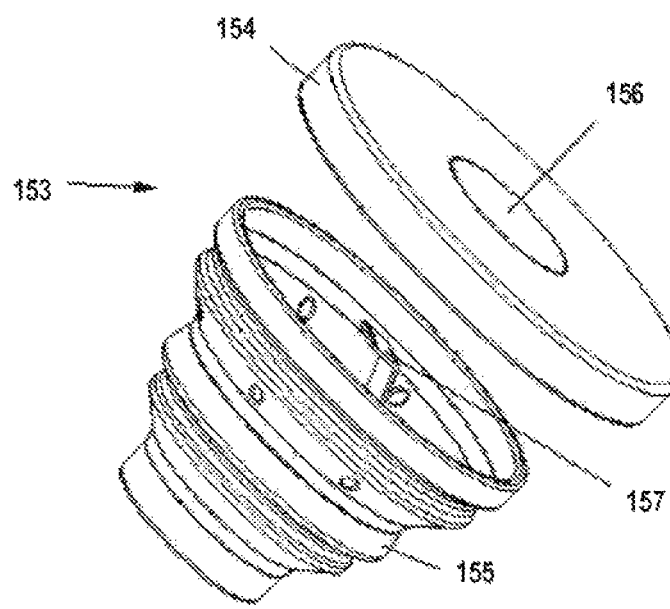
FIG. 27C shows an exploded, isometric, side view of the electrophysiology-sensor accessory of FIG. 27A.

FIG. 27C shows an exploded, isometric, side view of the electrophysiology-sensor accessory 153 of FIG. 27A, which exposes the sensor accessory flex circuit 157.

Figure 28A:
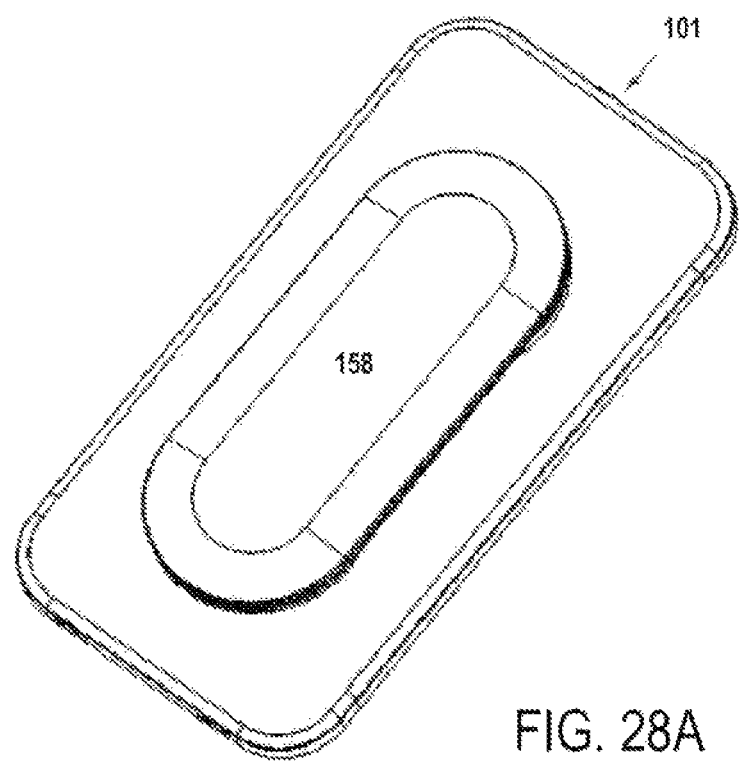
FIG. 28A shows an isometric top view of a game controller accessory in its closed state, according to one embodiment of the invention.

FIG. 28A shows an isometric top view of a game controller accessory 158 in its closed state, according to one embodiment of the invention.

Figure 28B:
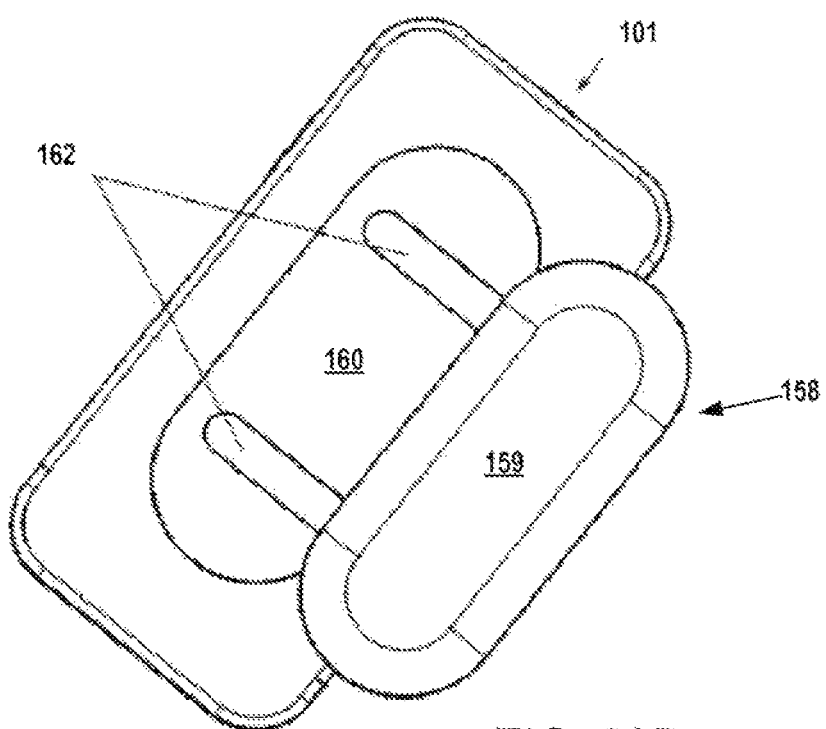
FIG. 28B shows a top view of the game controller accessory of FIG. 28A in a partially open state.

FIG. 28B shows a top view of the game controller accessory 158 of FIG. 28A in a partially open state, showing the separation of the sliding control panel 159 and the base 160, facilitated by the movement of sliding control panel 159 along base tracks 162.

Figure 28C:
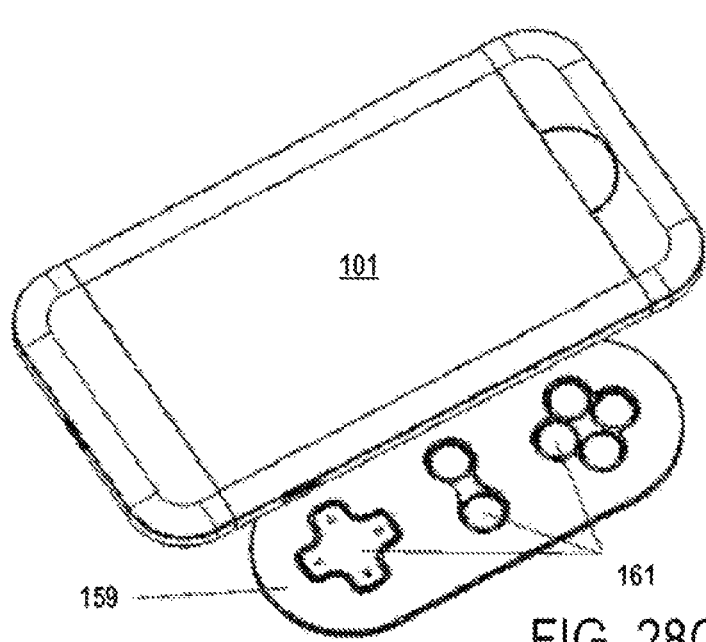
FIG. 28C shows a front view of the mobile electronic device with the game controller accessory of FIG. 28A docked in its open state.

FIG. 28C shows a front view of the mobile electronic device 101 with the game controller accessory 158 of FIG. 28A docked in its open state.

Figure 28D:
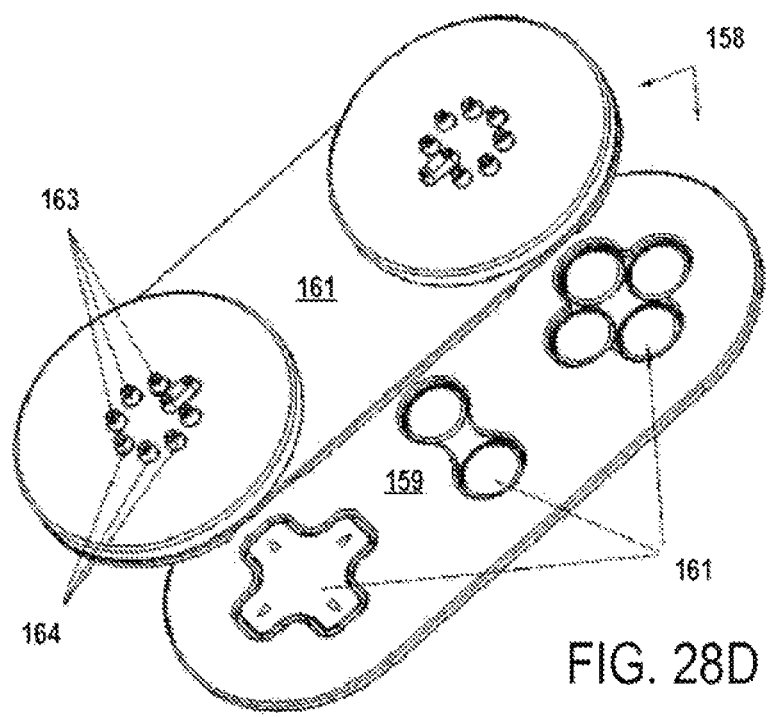
FIG. 28D shows an isometric bottom view of the game controller accessory of FIG. 28A in its open state.
Figure 28E:
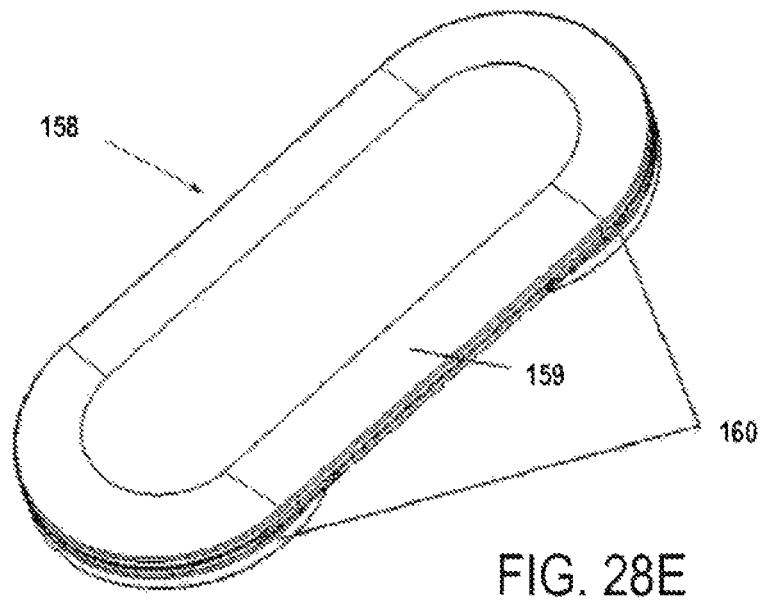
FIG. 28E shows an isometric top view of the game controller accessory of FIG. 28A in its closed state.

FIG. 28D shows an isometric bottom view of the game controller accessory 158 of FIG. 28A in its open state. FIG. 28E shows an isometric top view of the game controller accessory 158 in its closed state.

Figure 29:
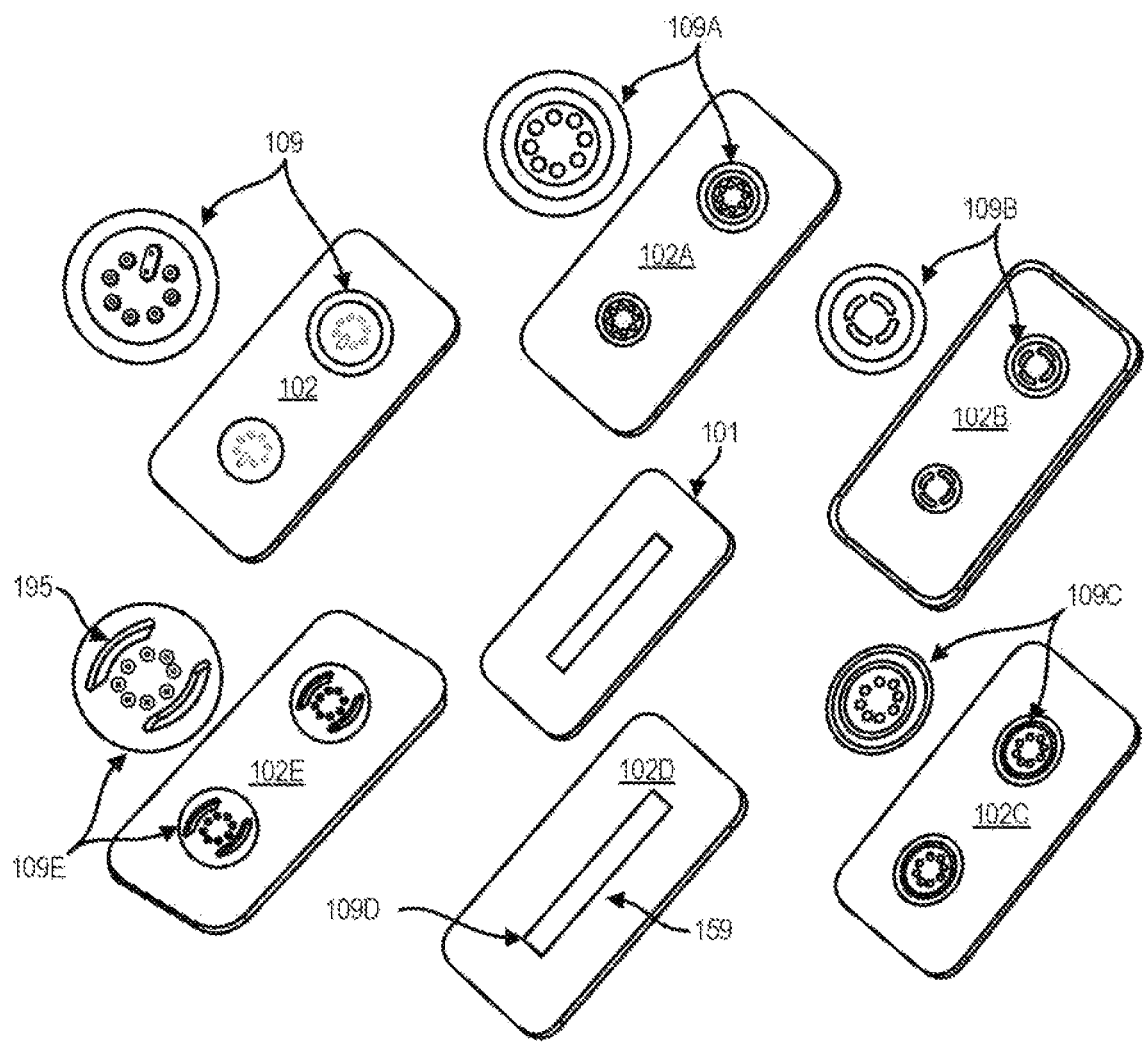
FIG. 29 shows an isometric back view of the mobile electronic device with a generic docking platform on its back face with isometric views of five embodiments of the docking platform radiating outward from the mobile device.

FIG. 29 shows an isometric back view of the mobile electronic device 101 with a generic docking platform 102 on its back face with isometric views of five embodiments of the docking platform 102 radiating outward from the mobile device 101. FIG. 29 is similar to FIG. 15B, with the exception the docking platforms 102 are configured for flush mounting an accessory to the back surface of mobile electronic device 101 as opposed to the mount strategy of FIG. 15B where an accessory is mounted within a cavity. Moving clockwise from the top left, the first docking platform is the docking platform 102 of FIG. 17.

The second docking platform 102A includes two docking connectors 109A, each comprising a single annular magnetic element beneath the outermost surface of the back face of the mobile electronic device, for temporarily bonding/coupling with docking accessories, similar to docking connector 109. A circular array of eight electrical contacts, each housed within an insulating contact cavity, for transmission of data and power with docked accessories.

The third docking platform 102B includes two docking connectors 109B formed with a single elongated magnetic element for temporarily bonding/coupling with multiple independent docking accessories simultaneously. In one embodiment, docking platform 102B is designed to be used in conjunction with wireless modes of power and data transmission, such as inductive charging and Bluetooth communication, between the mobile electronic device 101 and compatible docking accessories (not shown).

The fourth docking platform 102C includes two docking connectors 109C, each comprising one disc-shaped magnetic element and a circular arrangement of four elongated docking-accessory stabilization cavities for enhancing the lateral stability of docked accessories.

The fifth embodiment of docking platform 102D, center bottom of FIG. 15B, includes magnetic only docking connector 109D docking connector 109E comprising a magnetic attachment formed, in the present embodiment, as a single elongated magnetic element just below the surface of docking platform 102D. The magnetic element enables docking connector 102D to form a detachable attachment to one or more docking accessories (not shown). The docking accessories communicate wirelessly with mobile electronic device 101, for example, to transmit and/or receive one or both of data and power with mobile device 101. Note that docking connector 109D includes no electrical contacts. Also, it will be understood that although magnetic attachment system 159 is shown as a single elongated attached system, more than one magnetic attachment system may be used and different shaped attachment systems may be used without departing from the scope herein.

The sixth docking platform 102E includes two docking connectors 109E, each comprising a single disc-shaped magnetic element, eight electrical contacts arranged in a circular fashion. Each electrical contact is housed within an insulating contact cavity, and an annular stabilization shoulder 195 for enhancing the lateral stability of docked accessories.

Figures 30A, 30B:
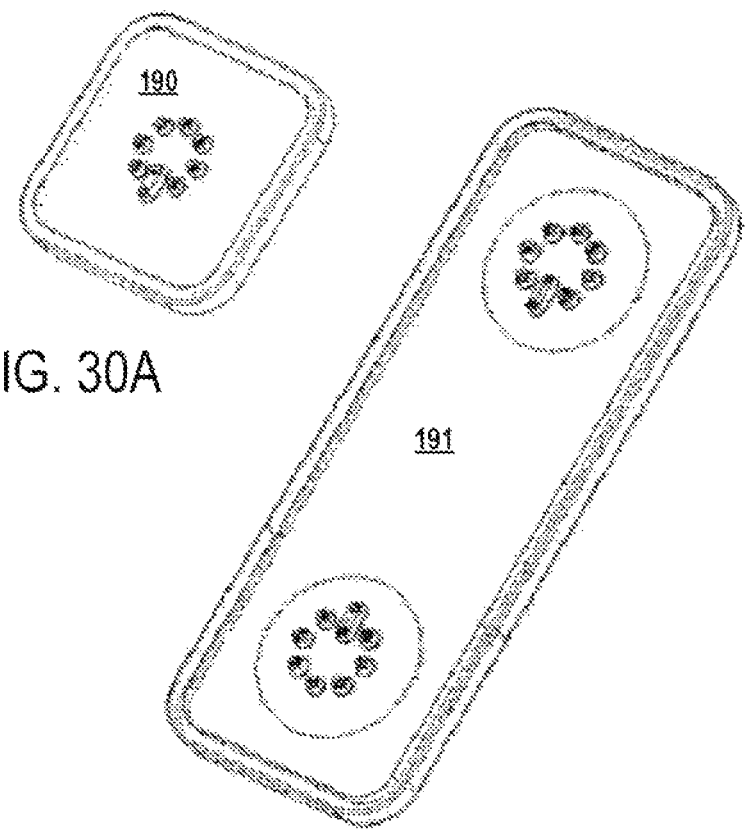
FIG. 30A shows an isometric bottom view of a square-shaped generic docking accessory configured to dock with one of the docking connectors of FIG. 29, in an embodiment.
FIG. 30B shows an isometric bottom view of a rectangular-shaped generic docking accessory configured to dock with one of the docking connectors of FIG. 29 in an embodiment.

FIG. 30A shows an isometric bottom view of a square-shaped generic docking accessory 190 configured to dock with the docking connectors of the fourth platform of FIG. 29, having a disc-shaped magnetic element and a circular array of eight male stabilization bosses.

FIG. 30B shows an isometric bottom view of a rectangular-shaped generic docking accessory 191 configured to dock with the docking connectors of the fourth platform of FIG. 29, with two disc-shaped magnetic elements and two circular arrays of male stabilization bosses.

It will be understood that a tablet computer may also be configured with a flush-mount accessory platform. For example, docking platform 2 of tablet computer 32, FIG. 16, may be replaced with docking platform 102 for flush mounting accessories to tablet computer 32.

Figure 31A:
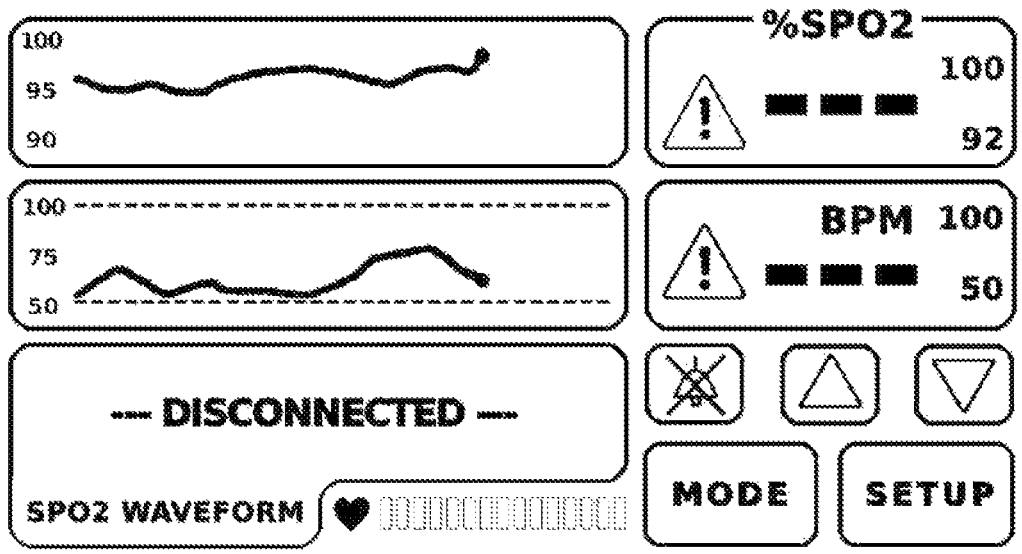
FIGS. 31A-31B show a physiological display functionality, in an embodiment.
Figure 31B:
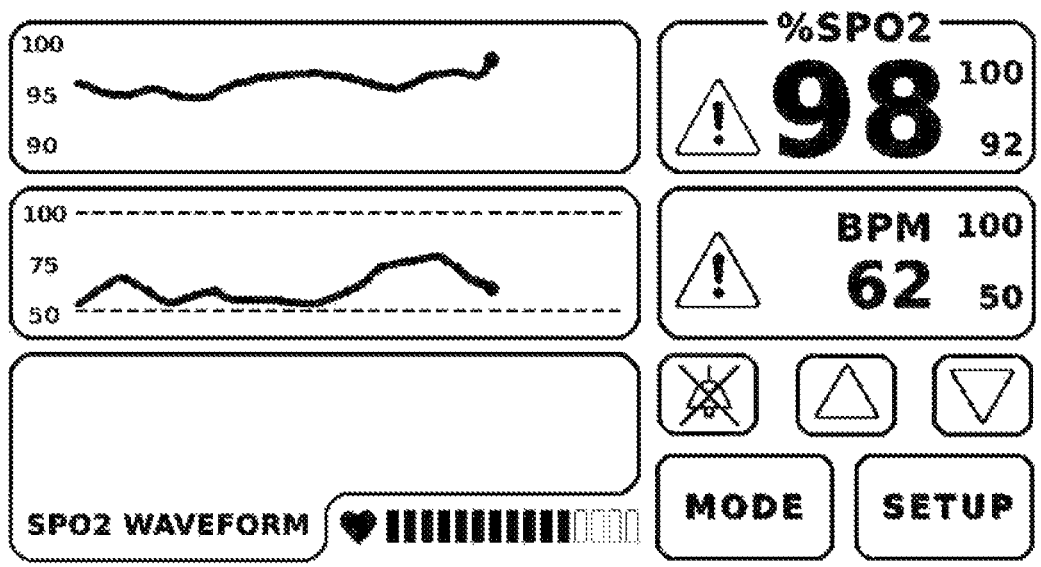

FIG. 31A shows one embodiment of a physiological/biometric function performed and displayed by mobile electronic device 1, 101 in cooperation with a physiological accessory. After docking platform 2, 102 or mobile electronic device 1, 101 establishes authenticated communications with a pulse oximeter docking accessory, biological data may be displayed on a screen of mobile electronic device 1, 101, as shown in FIG. 31B.

Figure 32:
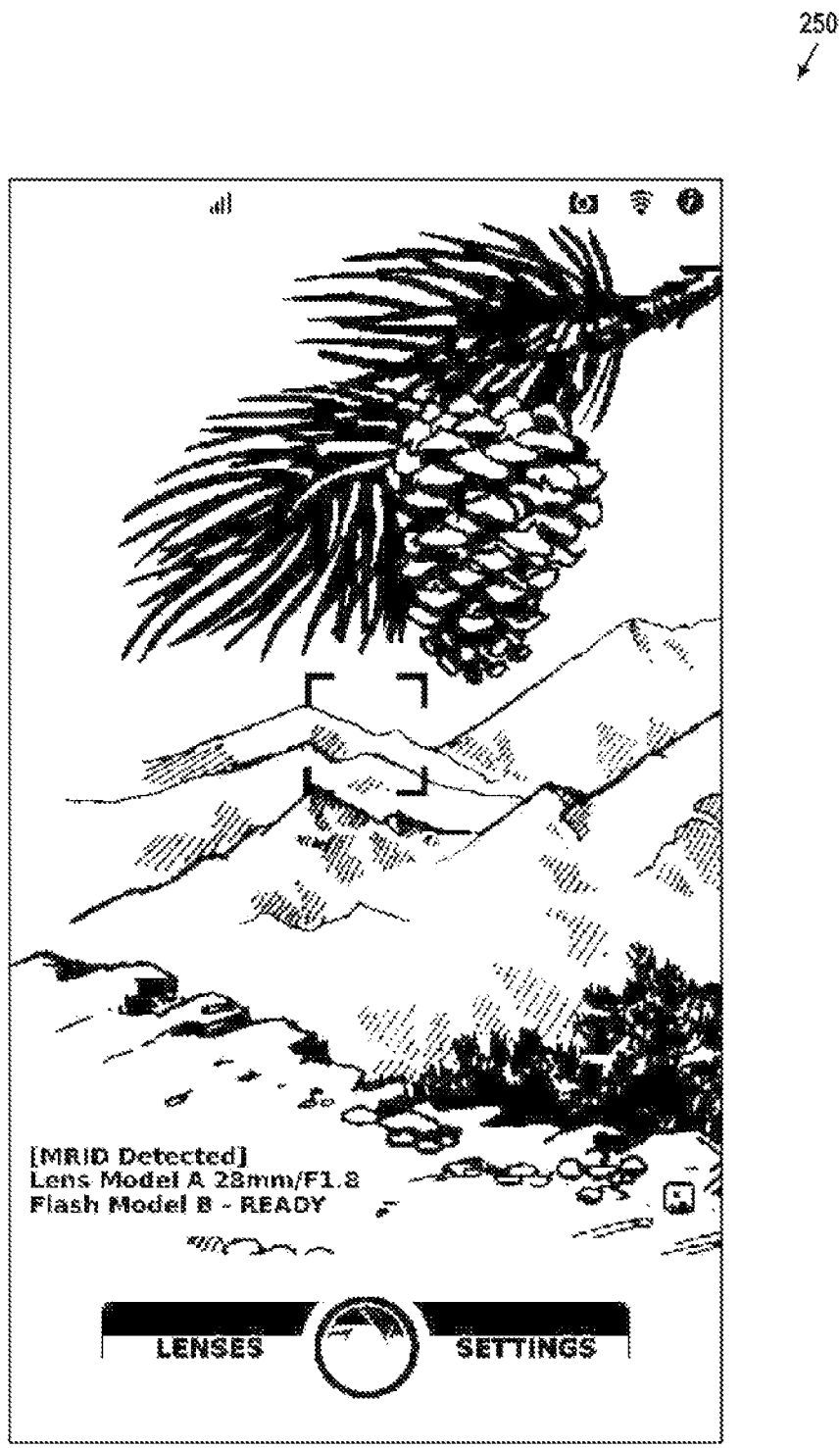
FIG. 32 shows a camera display functionality, in an embodiment.

FIG. 32 shows an exemplary camera display function 250 performed by mobile electronic device 1, 101. After docking platform 2, 102 or mobile electronic device 1, 101 establishes authenticated communications with cooperating accessories like lens accessory 142 and supplemental flash accessory 143, mobile electronic device 1, 101 may display camera display function 250.

Figure 33:
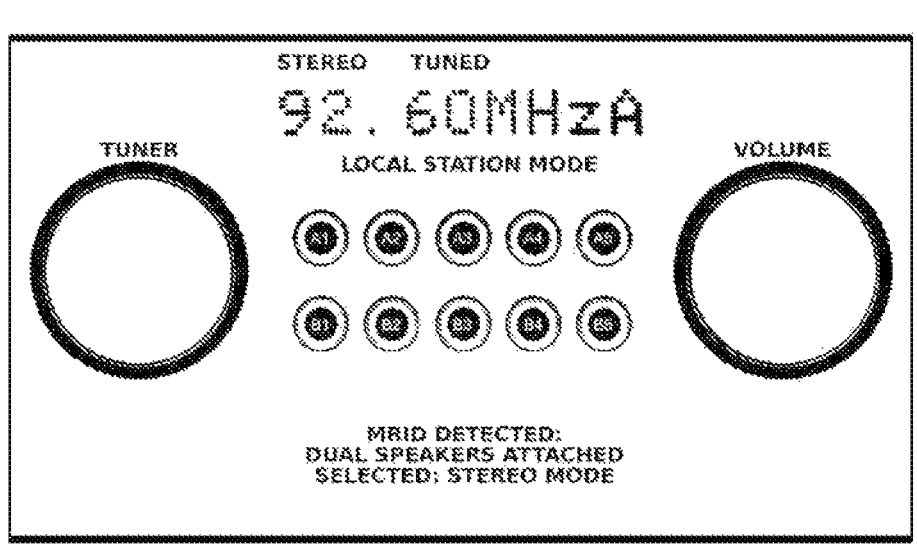
FIG. 33 shows an audio display functionality, in an embodiment.

FIG. 33 shows an example audio display function 252 performed by docking platform 2, 102 or mobile electronic device 1, 101 in association with a sound or music application function. After docking platform 2, 102 or mobile electronic device 1, 101 establishes authenticated communications with cooperating accessories, like left and right stereo speaker accessories 148, mobile electronic device 1, 101 may display audio display function 252.

Figure 34:
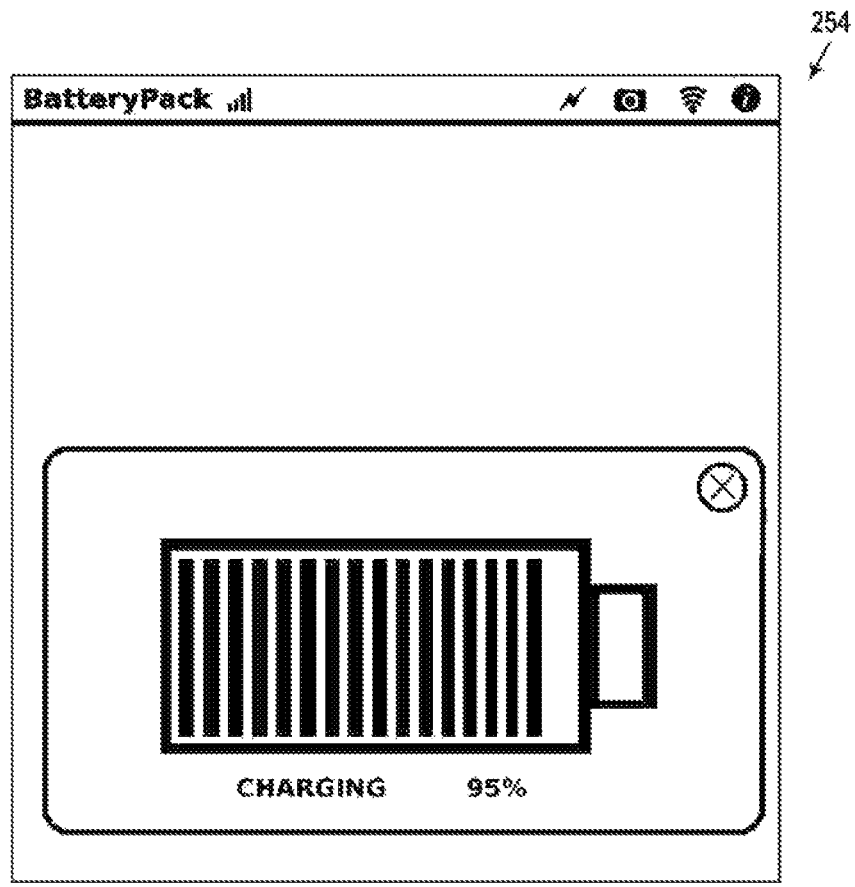
FIG. 34 shows a battery display functionality, in an embodiment.

FIG. 34 shows an exemplary battery function 254 performed by docking platform 2, 102 or mobile electronic device 101. After docking platform 2, 102 or mobile electronic device 1, 101 establishes communications with supplemental battery accessory 146, docking platform 2, 102 or mobile electronic device 1, 101 may display battery function 254.

Figure 35:
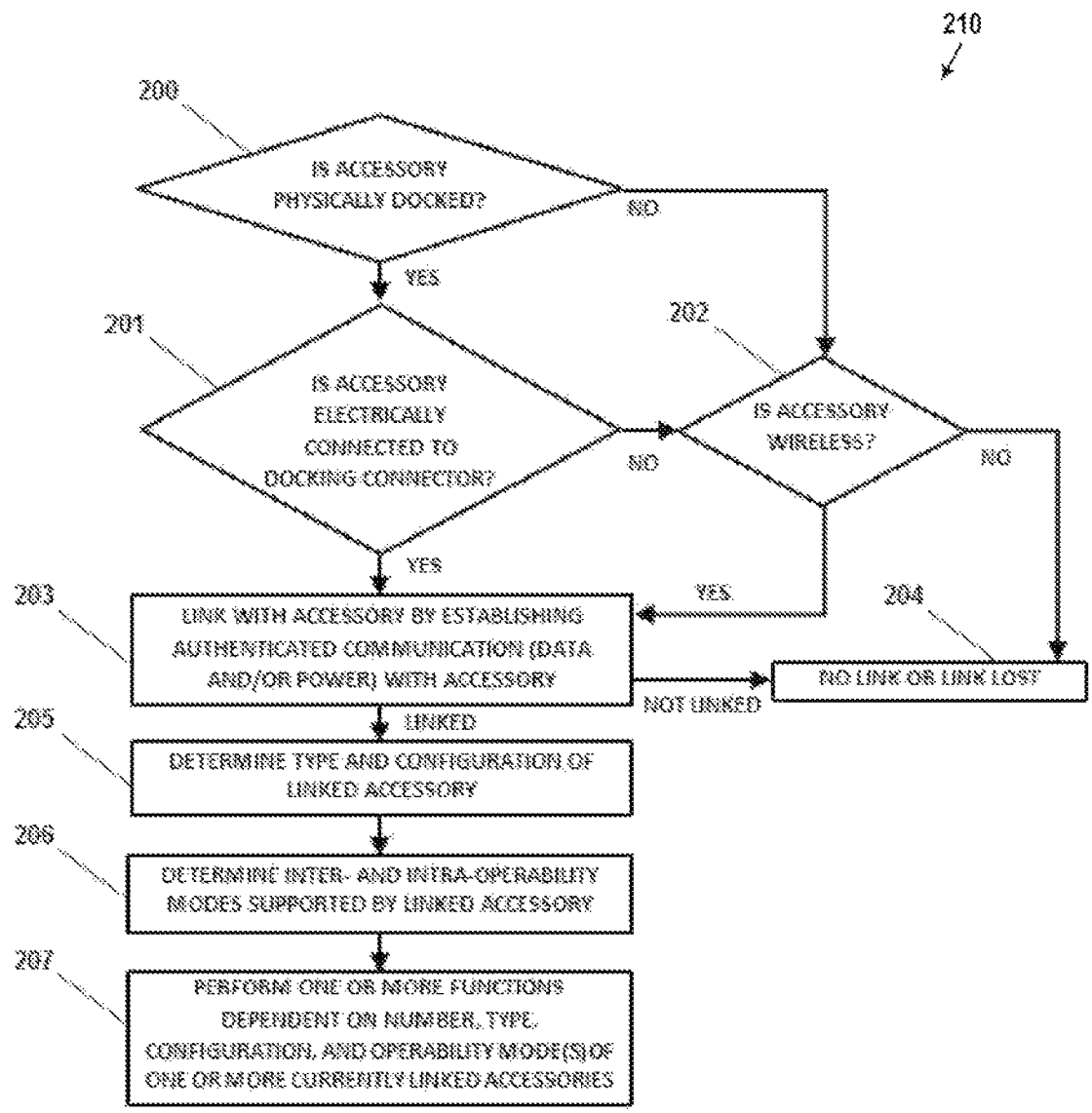
FIG. 35 shows a flow chart detailing functionality associated with docking accessories to the docking system/docking platform.

FIG. 35 shows a flowchart 210 illustrating an embodiment of a software and logical interface method between docking platform 2, 102 or mobile electronic device 1, 101, and compatible docking accessories. At step 200, method 210 determines if a wired and/or wireless docking accessory is physically docked to a compatible docking platform, such as docking platform 2, 102, 102A-E. If a docking accessory is physically docked, method 210 moves to step 201, otherwise method 210 moves to step 202.

At step 201, method 210 determines if the docking accessory is electrically connected to an electrical contact-compatible docking platform. In one example, docking platform 2, 102 or mobile electronic device 1, 101 determines that camera accessory 142 is electrically connected. If method 210 determines that there is no electrical contact made, method 210 moves to step 202.

At step 202, method 210 determines if the docking accessory is a docking accessory that supports one or more of wireless communication and wireless power transfer. In one example, docking platform 2, 102 or mobile electronic device 1, 101 determines that camera accessory 142 is a wireless camera accessory. If in step 202, method 210 determines the docking accessory is not a wireless accessory, method 210 moves to step 204, where no data or power link is formed and no further action is taken. If in step 202, method 210 determines that the docking accessory is a wireless docking accessory, step 202 moves to step 203.

At step 203, method 210 attempts to establish an authenticated communication link with the docking accessory. If no link can be established, method 210 moves to step 204, and no further action, takes place, otherwise, once linked, method 210 moves to step 205.

At step 205, method 210, a determination is made regarding the type and configuration of the linked docking accessory. In one example, docking platform 2, 102 or mobile electronic device 1, 101 determines that a docking accessory is one type of camera accessory 142, wherein the lens of camera accessory 142 is a 28 mm F/1.8 lens that does not include an integrated flash. The type and configuration of the linked docking accessory, in one embodiment, is determined by message passing between the docking accessory and mobile electronic device 1. Method 205 then moves to step 206.

At step 206, method 210 determines, for example by using additional message passing, the types and level of cooperation/operability supported by docking platform 2, 102 or mobile electronic device 1, 101 and one or more docking accessories. In one example, docking platform 2, 102 or mobile electronic device 1, 101 determines that a docking accessory supports one or more interoperability modes, for example a camera accessory 142 that interoperates with a flash accessory 143. In another example, docking platform 2, 102 or mobile electronic device 1, 101 determines that a docked speaker accessory 148 can intemperate with another docked speaker accessory 148 to form a left and right stereo speaker pair or a bass and treble speaker pair. In still another example, docking platform 2, 102 or mobile electronic device 1, 101 determines the docking accessory is a single docking accessory that utilizes two or more docking connectors, like game controller accessory 158, battery accessory 146, or solar charger accessory 147. Method 210 then moves to step 207.

At step 207, method 210 performs one or more functions, dependent on the number, type, configuration, and operability mode(s) of one or more currently docked docking accessories. As an example, docking platform 2, 102 or mobile electronic device 1, 101 may include provision to enable speaker accessories 148 to cooperate to receive left and right channel amplified signals so as to function as a stereo speaker system, as depicted in FIG. 33. In another example, docking platform 2, 102 or mobile electronic device 1, 101 may include provision to enable camera accessory 142 and flash accessory 143 to coordinate such that a flash is delivered under low light conditions when an image capture event is signaled, as depicted in FIG. 32. In still another example, a wireless link is established at step 203, and a wireless scale may operate, in one embodiment, independently of any docked accessories.

While the embodiments shown herein are described with particularity, those skilled in the art will appreciate changes, additions, and applications other than those specifically mentioned, which are within the spirit of this invention. For example, mobile electronic device may be a mobile media tablet, as in FIG. 16. The docking platform would then be sized according to a specific application, and the appropriate number and configuration of cavities provided. The platform, cavities, and docking connectors may have different shapes and sizes, as required by a certain application or for aesthetic purposes. The docking connectors may have different modes of attachment to docking accessories. Docking accessories may be self-powered, and may communicate with the mobile electronic device wirelessly, for example via Bluetooth®. E.g., a digital scale accessory might be docked for transport, then removed and positioned in proximity of the mobile electronic device, while communicating via Bluetooth®, as an object is placed on the scale and its weight displayed on the screen of the mobile electronic device. Accessories may be operable for wireless power transmission between the accessory and the mobile electronic device.

What is claimed is:

1. A detachable docking power accessory system for a mobile electronic device, the system comprising:
    a platform adapted to couple to the mobile electronic device, the platform including a first docking connector portion and a back portion, the back portion configured to attach to a back surface of the mobile electronic device;
    a docking power accessory comprising an accessory body;
    a second docking connector portion of the accessory body, the first docking connector portion and the second docking connector portion are configured to form a detachable attachment to secure the accessory body to the platform; and
    an electronic assembly within the accessory body, the electronic assembly comprising a battery and electronics operable to wirelessly transfer power from the battery to the mobile electronic device.

2. The detachable docking power accessory system of claim 1, wherein at least one of the first docking connector portion or the second docking connector portion comprise a magnet to form a magnetic attachment.

3. The detachable docking power accessory system of claim 1, wherein the back portion comprises a surface area configured to contact the back surface of the mobile electronic device, and wherein the back portion further comprises a side portion configured to connect to a side of the mobile electronic device.

4. The detachable docking power accessory system of claim 3, wherein the platform further comprises a recessed accessory cavity formed in the surface area, and wherein the recessed accessory cavity is configured to receive an expandable docking accessory.

5. The detachable docking power accessory system of claim 4, wherein the expandable docking accessory is movable between an expanded state and a collapsed state.

6. The detachable docking power accessory system of claim 5, wherein when the expandable docking accessory is in the collapsed state, the second docking connector portion is configured to attach to the first docking connector portion such that the accessory body is flushly mounted to the surface area.

7. The detachable docking power accessory system of claim 4, wherein the expandable docking accessory is a holding docking accessory.

8. The detachable docking power accessory system of claim 1, wherein the electronic assembly within the accessory body is configured to wirelessly transmit accessory information to the mobile electronic device to identify the docking power accessory to the mobile electronic device based on the wirelessly transmitted accessory information.

9. The detachable docking power accessory system of claim 8, wherein the accessory information comprises at least one of an accessory type, an accessory configuration, or a level of interoperability.

10. The detachable docking power accessory system of claim 8, wherein the accessory information is transmitted by the electronic assembly within the accessory body to the mobile electronic device using a message passing protocol.

11. The detachable docking power accessory system of claim 8, wherein the mobile electronic device is configured to perform a function based on the accessory information.

12. The detachable docking power accessory system of claim 11, wherein the function is specific to an accessory type of the docking power accessory.

13. The detachable docking power accessory system of claim 11, wherein the mobile electronic device is configured to make a determination as to whether the docking power accessory is attached to the platform before performing the function based on the accessory information provided by the docking power accessory.

14. The detachable docking power accessory system of claim 1, wherein the electronics are operable to wirelessly transfer power by inductively transferring power between the battery and the mobile electronic device.

* * * * *